United States Patent
Rohatgi

(10) Patent No.: US 9,412,977 B2
(45) Date of Patent: ***Aug. 9, 2016

(54) LOCAL SEAL FOR ENCAPSULATION OF ELECTRO-OPTICAL ELEMENT ON A FLEXIBLE SUBSTRATE

(71) Applicant: Global OLED Technology LLC, Herndon, VA (US)

(72) Inventor: Rajeev Rohatgi, Reno, NV (US)

(73) Assignee: Global OLED Technology LLC, Herndon, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/702,730

(22) Filed: May 3, 2015

(65) Prior Publication Data

US 2015/0236309 A1   Aug. 20, 2015

Related U.S. Application Data

(63) Continuation of application No. 14/645,833, filed on Mar. 12, 2015, which is a continuation-in-part of application No. 14/446,470, filed on Jul. 30, 2014.

(60) Provisional application No. 61/859,989, filed on Jul. 30, 2013.

(51) Int. Cl.
| | |
|---|---|
| H01L 21/00 | (2006.01) |
| H01L 51/56 | (2006.01) |
| C03C 27/02 | (2006.01) |
| H01L 51/52 | (2006.01) |
| H01L 25/04 | (2014.01) |

(52) U.S. Cl.
CPC ............ *H01L 51/56* (2013.01); *C03C 27/02* (2013.01); *H01L 25/048* (2013.01); *H01L 51/5237* (2013.01)

(58) Field of Classification Search
USPC .......... 438/28, 30, 158, 26, 48, 531, 55, 627, 438/752
See application file for complete search history.

(56) References Cited

U.S. PATENT DOCUMENTS

| | | | | |
|---|---|---|---|---|
| 4,254,546 A | * | 3/1981 | Ullery, Jr. | ....... H01L 31/022425 252/513 |
| 5,693,956 A | | 12/1997 | Shi | |
| 5,937,272 A | * | 8/1999 | Tang | ................... H01L 27/3211 438/158 |
| 6,436,222 B1 | * | 8/2002 | Andre | ...................... G09F 9/33 156/272.8 |
| 6,470,594 B1 | | 10/2002 | Boroson et al. | |
| 6,608,439 B1 | | 8/2003 | Sokolik et al. | |

(Continued)

*Primary Examiner* — Telly Green
(74) *Attorney, Agent, or Firm* — Global OLED Technology LLC

(57) ABSTRACT

An electro-optical panel product comprises a collection of distinct light-emitting elements formed on a substrate. The product may be a display or lighting apparatus, and each electro-optical element may be an OLED. Distinct local seals are formed below respective individual electro-optical elements or groups of electro-optical elements. Some embodiments combine a metal foil substrate and glass local seals in a flexible bottom-emitting product. The local seal may be used in conjunction with a continuous thin film encapsulation structure. Optical functions can be provided by each local seal, including refraction, filtering, color shifting, and scattering. Each local seal is formed by depositing a low melting temperature glass powder suspension or paste using inkjet technology in openings formed in a starter substrate; the glass powder is fused using a scanning laser beam having a tailored beam profile. The lower encapsulation substrate incorporating local window seals may be wholly or partially preformed.

11 Claims, 41 Drawing Sheets

(56) References Cited

U.S. PATENT DOCUMENTS

| | | |
|---|---|---|
| 6,624,568 B2 | 9/2003 | Silvernail |
| 6,887,733 B2 | 5/2005 | Klausmann et al. |
| 6,911,667 B2 | 6/2005 | Pichler et al. |
| 6,949,389 B2 * | 9/2005 | Pichler .............. H01L 51/5237 257/E21.243 |
| 7,011,561 B2 * | 3/2006 | Duineveld .......... H01L 27/3246 445/23 |
| 7,964,439 B2 | 6/2011 | Kim et al. |
| 8,022,624 B2 * | 9/2011 | Ricks ................ H01L 51/5237 313/504 |
| 8,153,201 B2 | 4/2012 | Aoyama et al. |
| 8,236,126 B2 * | 8/2012 | Chen .................... B32B 37/185 156/145 |
| 8,274,219 B2 * | 9/2012 | Wu .................... H01L 27/3244 313/509 |
| 8,277,902 B2 * | 10/2012 | Yamazaki .............. H05B 33/10 427/146 |
| 8,283,853 B2 | 10/2012 | Yan et al. |
| 8,425,974 B2 | 4/2013 | Takahashi et al. |
| 8,610,212 B2 * | 12/2013 | Bedell .................... H01L 21/84 257/347 |
| 8,915,121 B2 * | 12/2014 | Kumar .................. B82Y 30/00 73/29.01 |
| 8,928,597 B2 | 1/2015 | Jang |
| 8,941,301 B2 * | 1/2015 | Ibe ...................... H01L 51/5237 313/504 |
| 8,946,986 B2 * | 2/2015 | Diekmann .............. F21S 6/002 313/504 |
| 9,184,419 B2 | 11/2015 | Mandlik et al. |
| 2004/0180476 A1 * | 9/2004 | Kazlas .............. G02F 1/133305 438/146 |
| 2005/0023974 A1 | 2/2005 | Chwang |
| 2007/0190682 A1 | 8/2007 | Auch et al. |
| 2008/0020550 A1 * | 1/2008 | Ye ...................... H01L 29/7869 438/478 |
| 2009/0184090 A1 * | 7/2009 | Wuchse .............. H01L 27/3288 216/13 |
| 2009/0189515 A1 * | 7/2009 | Halls .................... H01L 25/047 313/504 |
| 2012/0319141 A1 * | 12/2012 | Kim .................... H01L 51/525 257/88 |
| 2014/0179040 A1 * | 6/2014 | Ramadas ................ H05B 33/04 438/27 |
| 2014/0368761 A1 | 12/2014 | Lin et al. |

* cited by examiner

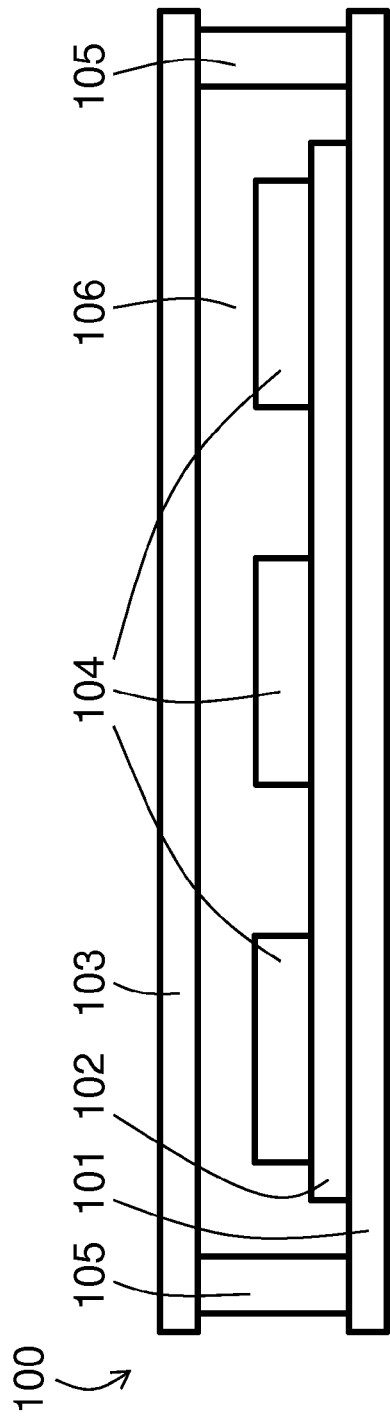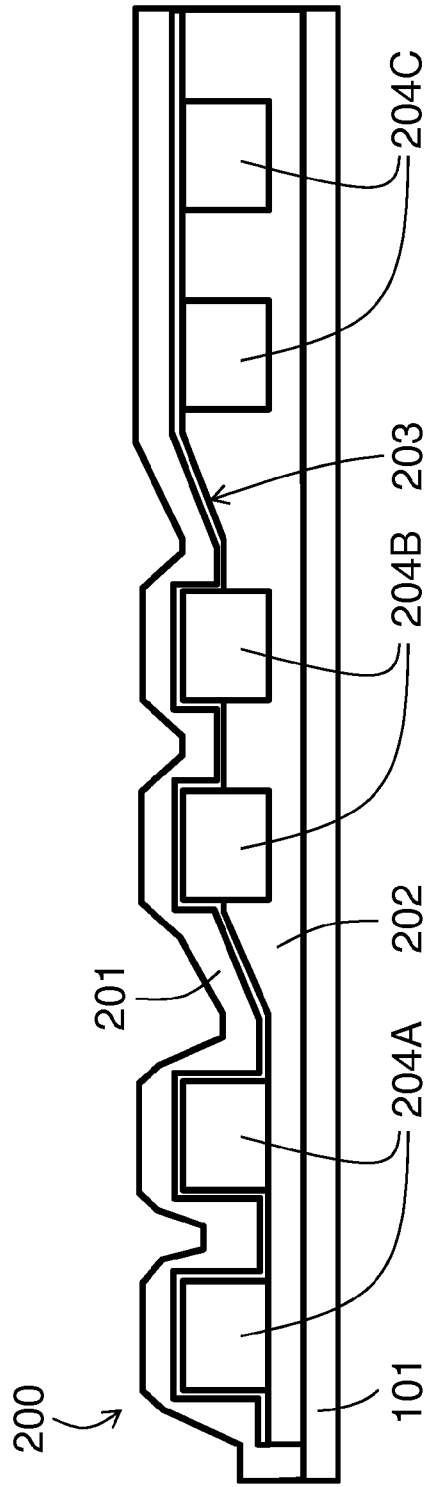
FIG. 1 (PRIOR ART)
FIG. 2 (PRIOR ART)

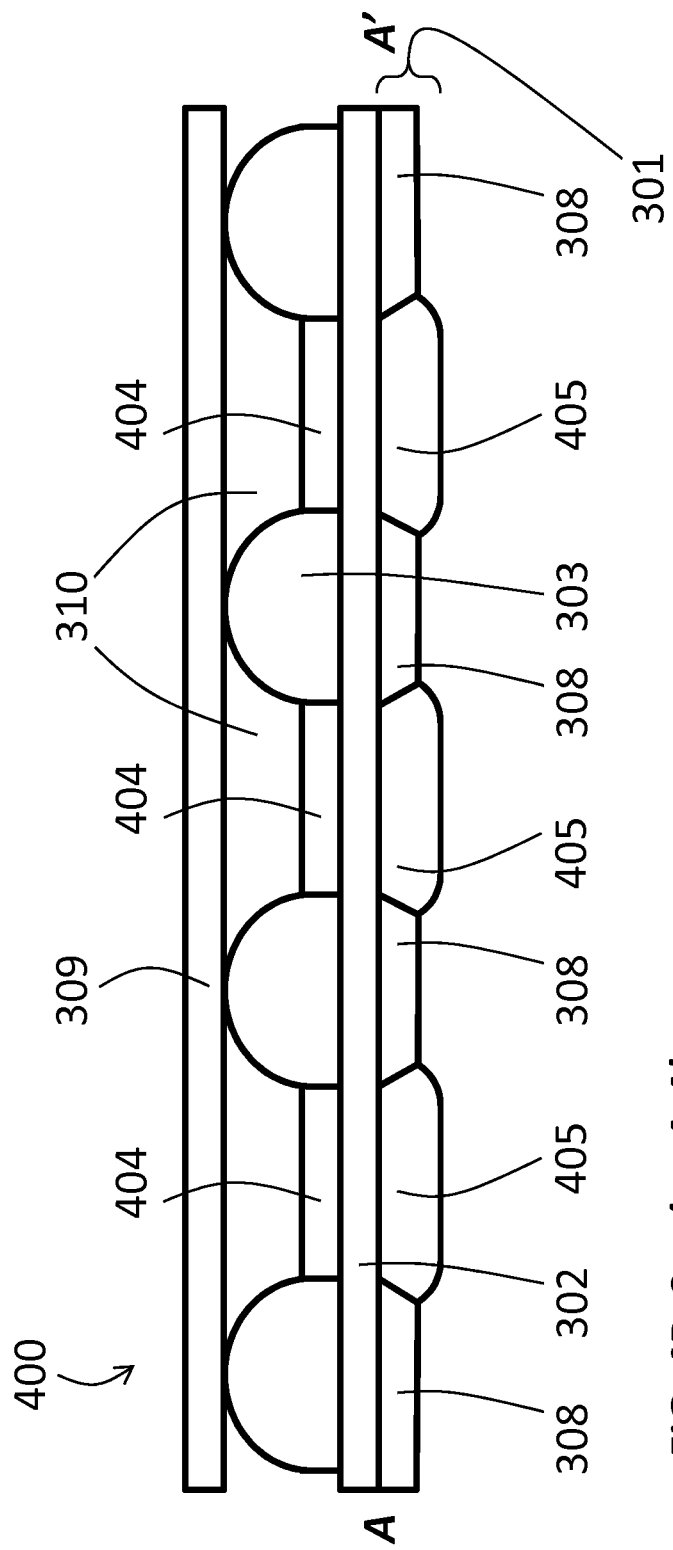
FIG. 4B Section A-A'

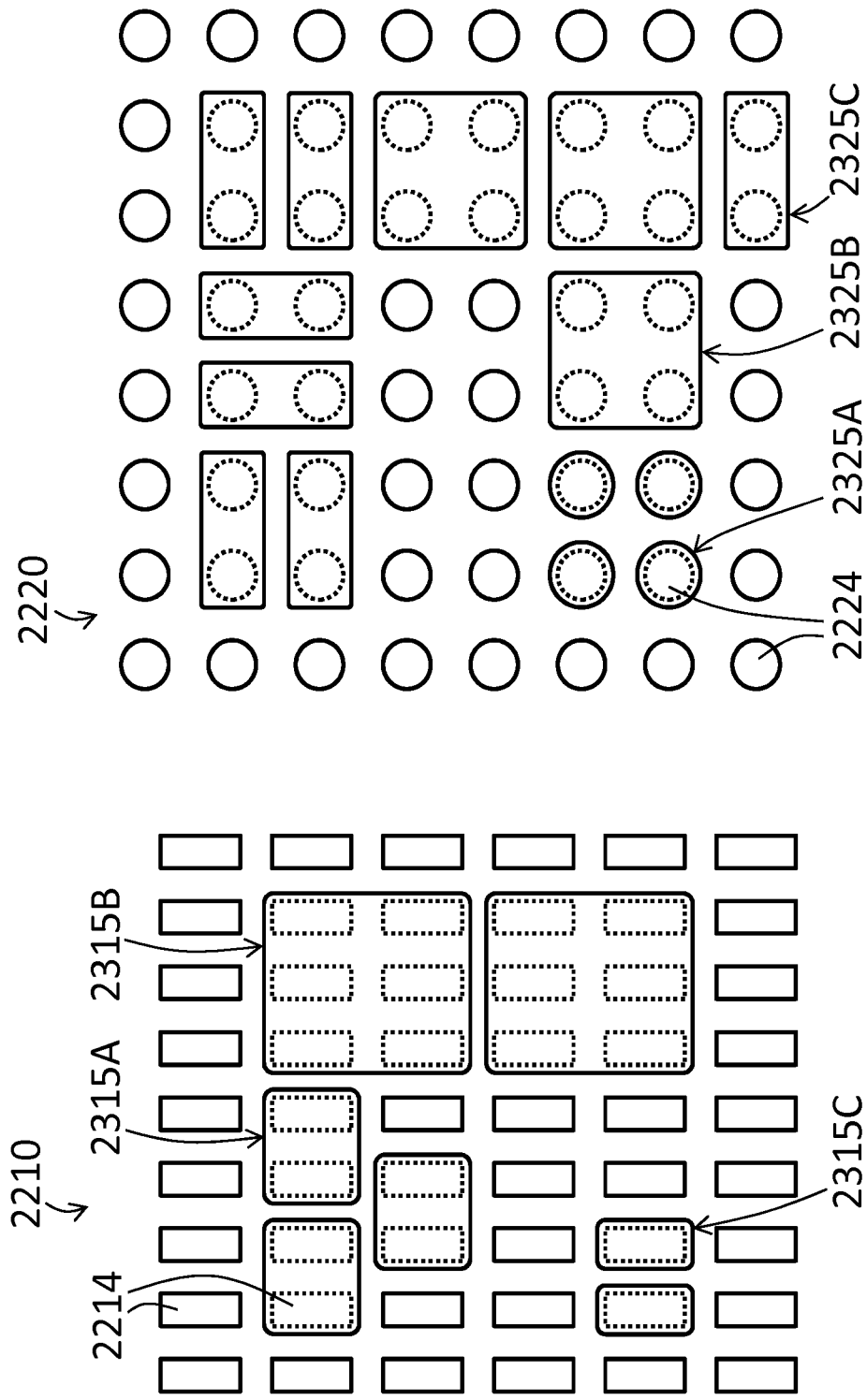

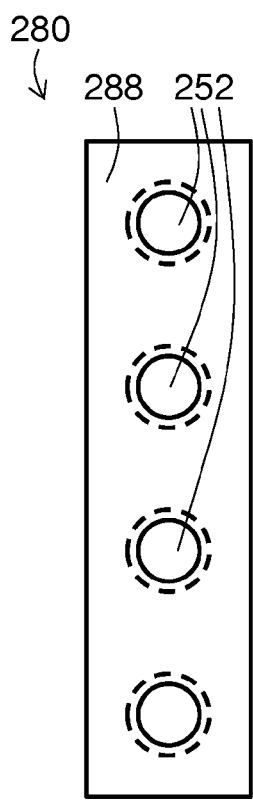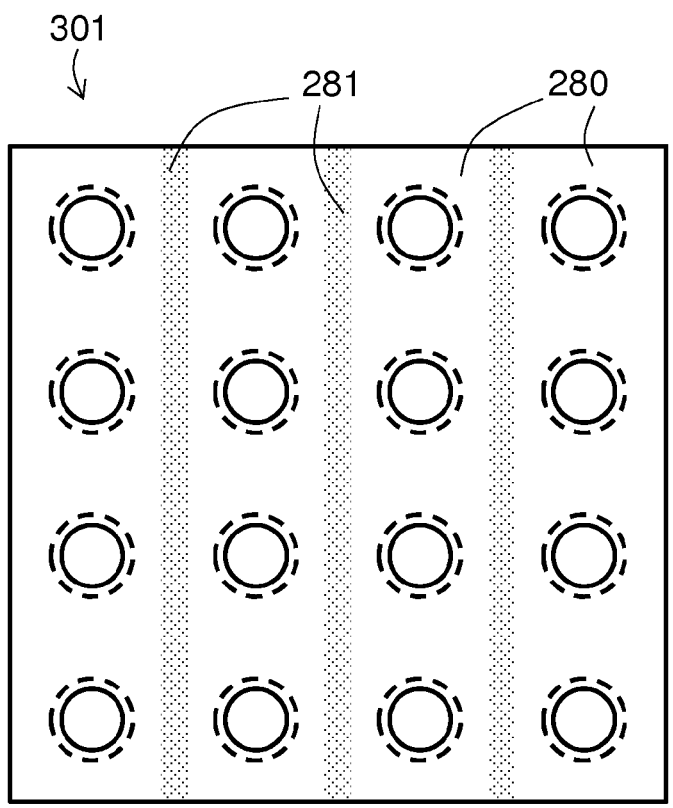
*FIG. 28A*  *FIG. 28B*

LOCAL SEAL FOR ENCAPSULATION OF ELECTRO-OPTICAL ELEMENT ON A FLEXIBLE SUBSTRATE

CROSS REFERENCE TO RELATED APPLICATIONS

This patent is a continuation of commonly assigned, co-pending U.S. Ser. No. 14/645,833, filed Mar. 12, 2015, titled "Local Seal For Encapsulation Of Electro-Optical Element On A Flexible Substrate" by Rohatgi, which in turn is a continuation-in-part of commonly assigned, co-pending U.S. Ser. No. 14/446,470, filed Jul. 30, 2014, titled "Local Seal For Encapsulation Of Electro-Optical Element On A Flexible Substrate" by Rohatgi, since published as U.S. 2015/0034934, which claims the benefit of U.S. Ser. No. 61/859,989, filed Jul. 30, 2013. All of these priority documents are incorporated by reference herein.

FEDERALLY SPONSORED RESEARCH

Not applicable.

FIELD OF THE INVENTION

The present invention relates to encapsulation of a flexible electroluminescent device or similar electro-optical panel.

BACKGROUND

Electro-optical arrays are widely used in commercial products. Examples of such products include a phone, a monitor, a television set, and a wristwatch, all of which have pixel arrays used for information display. Further examples include an OLED lighting panel and an OLED luminaire, which have arrays of OLED elements used for illumination.
Display Products In recent years, there has been a blurring of lines between some of the abovementioned product categories. For example, modern smartphones routinely include cameras and allow viewing of video and television received over wireless networks and the Internet. Additionally, smartphones offer access to many of the same classes of applications (or, "apps" for short) that consumers previously accessed using computers with monitors. These application classes include news, email, instant messaging, games, and office productivity tools. Therefore, within this disclosure, we mean "phone" as commonly understood at present: a relatively small devices with display less than or equal to 30 cm in extent, preferably less than or equal to 20 cm in extent, more preferably less than or equal to 15 cm in extent, and commonly less than or equal to 10.2 cm in extent. The term "extent" means the largest transverse dimension of an active region along a surface of a display, lighting device, or other electro-optical array. For rectangular displays as are found in common phones and televisions, the extent is the same as the diagonal measure commonly cited as the size of the display. For curved products, "extent" is measured as if the product was laid out flat.

The term "array", as applied to electro-optical or electroluminescent elements, is understood to refer to a two-dimensional array of such elements formed over a single substrate. A two-dimensional layout of OLED panels, each having a single electroluminescent element would not be considered an array of electroluminescent elements, since each OLED panel has a different substrate from the other OLED panels. The array is considered to be two-dimensional regardless of whether the surface is flat or curved. The surface on the substrate over which such an array is formed is nominally considered to be the top surface of the substrate, regardless of the orientation or curvature of the substrate within a particular product.

It is also useful to define the concept of neighboring elements in such an array. Consider first and second elements of such an array, which have respective first and second centroids. The first and second elements are neighbors if the number of distinct points on the top surface of the substrate that are (a) equidistant from first and second centroid, and (b) farther from the centroids of all other elements of the array, is greater than or equal to two. According to this definition of "neighbor" two adjacent squares on a chessboard are neighbors (all except corner points along their common boundary satisfy both conditions (a) and (b)), two diagonally touching squares on the chessboard are not neighbors (the corner where the squares touch is equidistant from four squares of the chessboard, hence this point does not satisfy condition (b), and no other point meets both conditions (a) and (b) either), and two squares remote from each other on the chessboard are not neighbors (all points satisfying condition (a) are closer to the centroid of some third square than to the first and second centroids).

We use "television" as commonly understood in the art: a relatively large device for playing video-plus-audio programming received from over-the-air broadcast, cable TV, the Internet, wireless network, or by wired transmission from separate nearby equipment such as an optical disk player, a digital video recorder, a computer, or a camera. The display of a television may range from 2 cm to 305 cm in extent, preferably 20 cm to 255 cm, commonly 30 cm to 155 cm, and often 80 cm to 140 cm in extent.

We use "monitor" to mean a display capable of showing changing information over time. Monitors include those found in airport terminals, lobbies of commercial buildings, and kiosks, as well as those associated with a specific computing device such as a tablet, a laptop, or a desktop computer, or otherwise known in the art. "Monitor" may also refers to an information display found in or on a host of embedded systems, ranging from thermostats, refrigerators, automobiles, GPS navigation devices, alarm systems, and many more. Small information display monitors may have an extent from 0.1 cm to 75 cm, preferably greater than equal to 2 cm, commonly greater than or equal to 20 cm, and often greater than or equal to 50 cm. Large information display monitors often have an extent from 75 cm to 200 cm, preferably less than or equal to 155 cm. Ultra-large information displays are also known. For example, sports stadiums commonly have displays exceeding 100 $m^2$ in area; the stadium exterior display built for the Kazan Universiade measures an astonishing 3700 $m^2$. Of course, these ultra-large displays often comprise a modular array of smaller information display monitors. In such a case, the term "monitor" includes within its scope both the entire stadium display, as well as a single module. In other cases, large information displays are comprised of discrete lamps. A lamp is understood herein to mean a single light-emitting element that cannot be spatially resolved as smaller elements. A lamp is not a monitor, as understood herein. A monitor may be a commercial product by itself, such as a stand-alone monitor for a desktop computer, or it may be part of an integrated system, such as the information display of a tablet computer.

There is a burgeoning class of commercial products known as wearable electronics, many of which incorporate a display. Wristwatches have been common for over one hundred years, and electronic wristwatches have been known for over forty years. Recently, watches with full-color displays have emerged in the marketplace. Other wearable electronic devices with displays include personal music players (such as the Apple iPod™), and head-mounted optical displays (such as the Google Glass™). There have been proposals to incorporate wearable electronics into clothing, shoes, jewelry, and other articles of apparel.

All of these commercial products may have displays that are full-color or monochromatic; black and white displays being a special case of monochromatic displays. Displays commonly incorporate individual elements, known as pixels, on a common substrate. Typically, pixels are electrically controlled and are individually controlled, however pixels may be commonly controlled in groups. In an electroluminescent display, such as an OLED display, pixels are individually light-emitting. Other displays have a common light source for multiple pixels, which could be a backlight or edge lighting or ambient light. One common light source may illuminate all the pixels of the display, or merely a group of pixels in a region of the display. In displays with one or more common light source, the individual pixels incorporate electro-optical elements that control the transmission or reflection of light from the one or more common light source. Displays of this type include liquid crystal displays, electrochromic displays, ferro liquid displays, electrophoretic displays, and electrowetting displays. The term "electro-optical element" includes electroluminescent elements such as LED and OLED. Many of these electro-optical elements contain organic materials and have limited tolerance for heat. Many of these electro-optical elements are sensitive to moisture and oxygen. OLED elements are particularly sensitive to moisture, are sensitive to oxygen, and have limited tolerance for heat. While heat tolerance of an OLED varies according to the device architecture and the particular compounds used, 300° C. has been cited as a maximum substrate temperature during an encapsulation process, by Federovskaya in U.S. 2009/0081356.

Lighting Products

Electro-optical arrays, in particular electroluminescent arrays, also find use in lighting products. The term "lighting product" refers to any product whose function is to provide illumination of space or objects external to the product. Illumination may be in the visible spectrum or in other portions of the electromagnetic spectrum. OLED panels may be lighting products; OLED lighting panels are commonly organized as an array of commonly controlled but separate light-emitting elements on a single substrate. At present, the extent of the array of light-emitting elements in an OLED panel may lie within the range from 2 cm to 30 cm, commonly 5 cm to 21 cm, and often 10 cm to 16 cm. In future, as manufacturing technology improves, this array extent may increase to 50 cm, 100 cm, or even larger. In some instances, OLED panels may have light-emitting elements having a plurality of differently colored emissions. For example, ⅓ of the elements may be red, ⅓ green, and ⅓ blue. By varying the relative excitation of red, blue, and green elements, the color and the color temperature of the light may be controlled. Light-emitting elements in an OLED panel are commonly organized in rectangular or hexagonal layouts. Although many or all of the light-emitting elements in an electroluminescent array of a lighting product are commonly controlled, from the point of view of structure and organizational layout, these light-emitting elements are substantially similar to the pixels of a display product. Furthermore, for any given electroluminescent technology, the encapsulation requirements of light-emitting elements in display and lighting products are substantially similar. Since encapsulation is of particular interest in this disclosure, it is understood that discussions using the term "pixel" are generally applicable to lighting elements of a lighting product as well, except in those cases where it is clear from the context that the discussion is specific to display products only.

Because OLED panels are at present relatively small, and because designers have exercised their imagination to create complex and artistic structures, many lighting fixtures and luminaires have been conceived as each comprising multiple OLED panels. Such a lighting fixture or luminaire would be a commercial product incorporating a plurality of electro-optical arrays, since each OLED panel itself incorporates an electroluminescent array. A lighting fixture or luminaire is understood to mean a single detachable assembly directly mounted onto a wall, ceiling, floor, furniture, building, frame, pole, tower, truss, or other civil structure, for the purpose of providing illumination. A lighting panel is understood to mean the smallest removable unit from a lighting fixture or luminaire that can be removed and replaced as an integral unit without impairing the capacity of this unit to generate light, in other words, without breaking anything. Although lighting panels and lighting fixtures are often distinct, they can also be the same, for example the common inexpensive plug-in electroluminescent night lights available today. Of course, depending on the electroluminescent technology in use, not all electroluminescent panels will incorporate a two-dimensional array of separate light-emitting elements; some technologies may readily allow a panel to be built as a single light-emitting element, or alternatively as a one-dimensional array of light-emitting elements.

Flexible Products

Another current trend is toward flexible products. From a manufacturer's standpoint, flexible products are desirable because they can be manufactured at large scale and high volume using a relatively inexpensive roll to roll process, as against the more common discrete manufacturing used today for both display and lighting products. From a designer's standpoint, flexible products are desirable because they can be configured into curved devices, some of which will be rigid curved devices, such as a curved television, while others will be flexible, such as could be integrated into clothing. From a consumer's standpoint, flexible products are desirable because they offer the prospect of lightweight, compact, foldable, and even unbreakable devices.

However, as discussed below, encapsulation suitable for flexible products has not been satisfactorily addressed to date, especially for the stringent encapsulation requirements of OLED elements.

Encapsulation Technology

Materials used in organic light-emitting diodes (OLEDs) are well known to be sensitive to oxygen and moisture. Degradation mechanisms are described, for example, by So et al., Advanced Materials, vol. 223, pp. 3762-3777, 2010. As a result, encapsulation is an important part of OLED design. Two main classes of encapsulation are known: (1) use of an encapsulation substrate, i.e. a preformed sheet, and (2) thin film encapsulation.

Encapsulation substrates may commonly be glass or metal, and are commonly spaced from underlying electroluminescent elements with e.g. nitrogen gas fill in between. For example, U.S. Pat. No. 6,111,357 to P. Fleming describes an encapsulation substrate in the form of a glass, metal, or ceramic cover that is attached to an underlying display substrate by a perimeter seal located outside the active area of the display. A metal substrate is opaque and is only suitable for a bottom-emitting display, while a glass substrate is relatively thick and rigid, and not well-suited for roll-to-roll manufacture or flexible displays.

A wide variety of glass-to-metal seals are known. Some metals (for example, platinum, nickel, zirconium, and indium) can be adhered to glass directly. Many metals (for example copper, silver, nickel, and molybdenum) form strong joints with glass via an intermediate layer of metal oxide. Many alloys (including stainless steel) can be bonded to glass via an intermediate oxide layer of one or more of the metal constituents of the alloy. Strong bonds can also be formed with other compounds joining the metal to the glass, such as chromium silicide. Other metals (for example, aluminum) are difficult to bond to common silica-based glasses, but can be bonded to special glass formulations (for example, phosphate glasses).

Thin film encapsulation offers manufacturing benefits, but suffers from the relatively high permeability of polymer materials, and the difficulty of depositing or forming thin film layers that are free of pinholes. The permeability requirements for OLED are stringent and limit the choice of suitable materials. One approach to overcoming these problems has been preparation of laminated layers. See, for example, U.S. Pat. No. 4,104,555 to G. Fleming, U.S. Pat. No. 5,811,177 to Shi, and Lewis et al., IEEE Journal of Selected Topics in Quantum Electronics, vol. 10, no. 1, pp. 45-57, 2004. But, the use of laminated layers requires additional process steps, with attendant costs.

Additionally, many variants are known. In U.S. 2012/0319141, Kim discloses a combination of a multi-layer thin film seal with a cover attached by a perimeter seal. U.S. Pat. No. 7,368,307 to Cok discloses a flexible substrate attached to a rigid curved encapsulating cover. Neither of these solve the abovementioned problems with encapsulation substrates on one hand, or thin film seals on the other.

It is also known to combine the encapsulant function with other functions. In U.S. 2011/0241051, Carter discloses a structured film encapsulant with an integrated microlens array and diffraction grating. This encapsulant is pre-formed, which entails additional manufacturing equipment and cost, and also requires careful alignment between the pre-formed optical structures on the encapsulant and a pixel pattern on an underlying display substrate. Further, Carter's encapsulant is described as comprising an elastomeric polymer (such as polydimethylsiloxane (PDMS)) with one or two coating layers (such as silicon nitride (SiN)). This multi-layer structure involves additional process steps and costs as described above.

A number of authors have been concerned with the separate encapsulation of distinct devices on a mother glass, prior to singulation. U.S. Pat. Nos. 7,091,605, and 7,329,560 both require a perimeter seal around each distinct device, which requires too much space to be workable between neighboring electro-optical elements in a two-dimensional array of elements of a single device. U.S. Pat. No. 6,949,382 to Pichler requires hardening of a planarization layer that substantially covers an entire device, and is fundamentally at odds with encapsulating a flexible device.

Thus, there remains a need for an encapsulation technology that is compatible with roll-to-roll manufacturing, and flexible, unbreakable, or deformable products that incorporate a two-dimensional array of electro-optical elements.

BRIEF SUMMARY OF THE INVENTION

The present invention is directed to apparatus and methods for encapsulation of an electroluminescent product comprising a collection of distinct light-emitting elements such as pixels.

In a first aspect, local encapsulation seals are provided under respective individual light-emitting elements. In accordance with preferred embodiments of the present invention, the local encapsulation seals are formed of a glass material. The advantages of glass include low permeation rates for both moisture and oxygen, as well as optical clarity. See, for example, U.S. Pat. No. 7,026,758 to Guenther. These advantages can be retained by forming a local glass seal below each light-emitting element. Because the glass need not be a continuous sheet, flexibility of a finished light-emitting product is not compromised.

In a second aspect, local encapsulation seals are provided under respective groups of light-emitting elements. In a third aspect of the present invention, the size of each local glass seal is compatible with the flexibility requirement of the application.

In a fourth aspect of the present invention, local glass seals are formed as windows in a matrix. In this disclosure, the term "matrix" is used in its sense of "a surrounding medium or structure", that is a matrix may be in sheet form having openings in which local seals may be provided. In preferred embodiments, the matrix comprises metal. In some embodiments, the metal is in the form of a flexible foil. In other embodiments, the metal matrix is rigid. The matrix may be a single homogeneous layer, a laminate, or a composite structure. The matrix openings may be formed before, after, or independently of formation of electro-optical elements.

In a fifth aspect, each individual light-emitting element is a pixel (sometimes called a subpixel) of a display product. In a sixth aspect, each individual light-emitting element is a distinct element of a collection of such elements forming a lighting product.

Henceforth in this document, the term pixel will be used to denote a distinct light-emitting element in any of a display product or a lighting product. In preferred embodiments, a distinct light-emitting element is an organic light-emitting diode, or OLED, however the invention is not limited to OLED products. The term distinct is used to indicate that a light-emitting element is physically separated from other light-emitting elements. For both display and lighting products, the product may have many such distinct light-emitting elements formed together integrally as a two-dimensional array of elements on a single substrate. Two distinct light-emitting elements in a product may be controlled by same or different circuitry, and may or may not be operable independently of one another.

In a seventh aspect of the present invention, local encapsulation seals are formed both above and below a two-dimensional array of electro-optical elements in a panel. In some embodiments, the electro-optical elements are emissive, and the panel emits light from both top and bottom. In other embodiments, the electro-optical elements control light transmission, and the panel receives incident light through at least one of its top and bottom surfaces, and light controlled by the array of electro-optical elements is emergent from an opposite surface.

In an eighth aspect of the present invention, the local seals may be combined with a thin film encapsulation structure. In some embodiments, the thin film encapsulation structure is formed before formation of local seals, while in others the thin film encapsulation structure is formed after local seals. In some embodiments, the thin film encapsulation structure comprises a single layer, while in other embodiments, the thin film encapsulation structure comprises multiple layers. In some embodiments, the thin film encapsulation structure also serves as a planarization layer.

The combination of a thin film encapsulation structure with local seals is mutually beneficial. The local seals provide protection against pixel damage due to pinhole defects in the thin film encapsulation structure, particularly since pixels are most sensitive to pinhole defects directly below or above the pixel. Conversely, the thin film encapsulation structure reduces uptake of moisture or oxygen by areas of internal layers between the pixels. While such uptake of moisture or oxygen may not directly impact performance of a display or lighting product, the moisture or oxygen so absorbed can migrate laterally into the active area of a light-emitting element, where the moisture or oxygen will likely impact product performance. Thus, the thin film encapsulation structure can greatly improve protection of a light-emitting element against secondary paths of moisture or oxygen ingress.

In a ninth aspect of the present invention, local glass seals are formed using a suspension or paste of glass powder. In a tenth aspect, the glass powder used has a low fusing temperature, which may be less than or equal to 300° C. Glass powders with low fusing temperatures in the range 220-300° C. have recently become available. These melting temperatures are compatible with many OLED materials. An example of such a powder with melting temperature in the range 220-300° C. has been added to Hitachi Chemical's Vaneetect product line. See, for example, Hitachi News Release, "220-300° C. low-melting glass for hermetic sealing", Nov. 26, 2012, http://www.hitachi.com/New/cnews/121126a.pdf.

In an eleventh aspect of the present invention, the local seals may additionally perform a lens function. In some embodiments, a local seal has substantially planar top and bottom surfaces, and performs no lens function. In other embodiments, a local seal has a curved top or bottom surface and acts as a converging lens. A converging lens function is desirable, for example, in a battery-powered personal device, where light emitted in directions away from a user represents wasted energy and reduced battery life. In still other embodiments, a local seal has a curved top or bottom surface and acts as a diverging lens. A diverging lens function is advantageous, for example, in television products, digital signage, and some lighting products, where wide field of view is desirable.

In a twelfth aspect of the present invention, the local seals may additionally perform a different optical function, such as a filter, a color converter, and/or a scatterer. In some embodiments, the local seal is formed of a glass powder suspension doped with one or more pigments, so as to tailor the emission profile with respect to the natural emission profile of the underlying electroluminescent element. This aspect of the invention is advantageous for display products having a common emissive layer for different color pixels. This aspect of the invention is also advantageous for lighting products to tailor the color temperature of the emitted light. In some embodiments, the glass powder suspension is doped with a fluorescent or other color shifting material. This aspect of the invention is advantageous, for example, in a lighting product, to convert cold bluish light to a warmer color. In some embodiments, the glass powder suspension may be mixed with a powder of a refractory material. When the glass is fused during manufacture of the local seals, the refractory materials remain intact. Thereby the local seals lose some of their optical clarity and take on a scattering function.

In a thirteenth aspect of the present invention, the glass powder suspension or paste is deposited using inkjet technology. Glass powders are widely used in industry, and are commonly applied in the form of a suspension or a paste Inkjet technologies have already been proposed for deposition of electroluminescent materials in a light-emitting pixel, for example by Duineveld in U.S. Pat. No. 7,011,561. The same technology can be applied for deposition of a glass powder suspension or paste above or below a pixel or other small light-emitting element. In U.S. Pat. No. 6,855,367, Nakao describes a glass powder jet ink.

In a fourteenth aspect of the present invention, the deposited glass powder is fused without damaging any overlaid TFT or electroluminescent layers. In some embodiments, fusing of the glass powder can be achieved by bulk heating of the entire product. In other embodiments, fusing of the glass powder can be achieved by uniformly heating a surface of the product on which local seals are being formed. In yet other embodiments, heat is deposited locally so that the areas to be sealed absorb more energy per unit area than areas between seals.

In a fifteenth aspect, a laser source producing a tailored beam profile is used to provide non-uniform irradiation of the product surface on which local seals are being formed. In a range of embodiments, the tailored beam profile may be a spot, a group of distinct spots, or a line.

In a sixteenth aspect, local glass seals are formed prior to formation of electro-optical elements. In some embodiments, local glass seals may be formed prior to formation of any TFTs.

Additionally, embodiments of the present invention are known with local glass seals, that do not depend on in situ seal formation from a glass powder.

In a seventeenth aspect, part or whole of an encapsulation substrate is pre-formed. In some embodiments, local glass sealing windows are formed of pre-formed glass, which are attached to respective openings in a matrix. In some embodiments, glass-in-metal window elements are pre-formed, and joined together by welding or soldering to produce the encapsulation substrate. In some embodiments in which the entire encapsulation substrate is pre-formed, active elements (including TFTs and electroluminescent elements) may be formed subsequently over the encapsulation substrate, while in other embodiments, an array of active electro-optical elements is formed separately from the encapsulation substrate, which are then attached. In some embodiments in which portions of the encapsulation substrate are pre-formed, these portions can be assembled onto the array of active electro-optical elements to build up the complete encapsulation substrate. In other embodiments, pre-formed portions of the encapsulation substrate can be combined to form a complete encapsulation substrate prior to attachment or formation of active electro-optical elements.

The skilled practitioner will recognize that above-mentioned aspects of the present invention can be variously combined to suit a particular application or manufacturing process. Furthermore, these aspects can also be combined with yet other features not enumerated herein.

BRIEF DESCRIPTION OF THE DRAWINGS

The following detailed description will be better understood when read in conjunction with the appended drawings, in which are shown some of the multiple embodiments of the present invention. It should be understood that the various embodiments of the present invention are not limited to the precise arrangements and instrumentalities shown in the drawings. Further, dimensions of the features shown are often widely disparate; the drawings are not to scale.

FIG. 1 is a diagram of a prior art device encapsulated using an encapsulation substrate.

FIG. 2 is a diagram of a prior art device encapsulated using a thin film encapsulation.

FIG. 4B is a diagram showing a cross-sectional view of the embodiment of FIG. 4A.

FIG. 12 is a flow chart showing process steps for manufacture of the fifth embodiment.

FIGS. 23A-23E are conceptual representations of local encapsulation seals underneath respective two-dimensional arrays of electro-optical elements.

FIGS. 28A-28B are diagrams showing views of a pre-formed element, and an embodiment of an encapsulation substrate formed therefrom.

DETAILED DESCRIPTION OF THE INVENTION

Figure 21A:
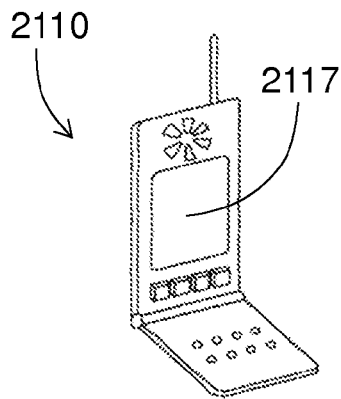
FIGS. 21A-21F depict exemplary commercial products: a phone, a monitor, a television, a wristwatch, an OLED panel, and a luminaire, respectively.
Figure 21B:
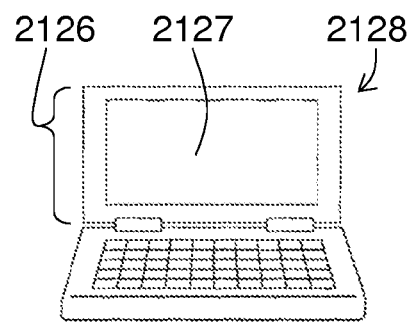
Figure 21C:
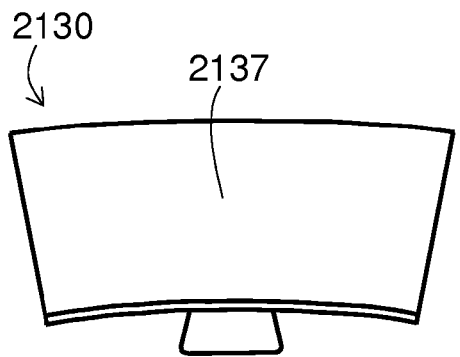
Figure 21D:
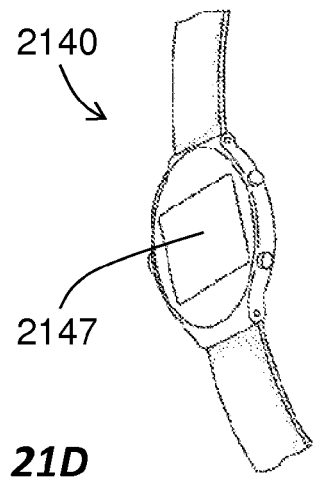
Figure 21E:
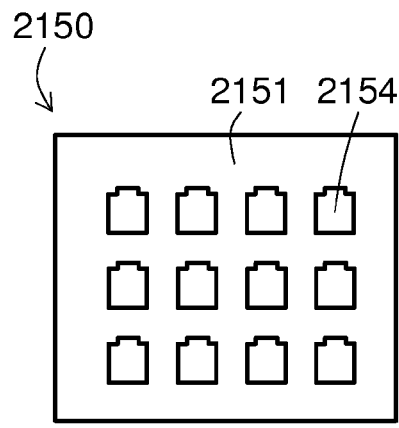
Figure 21F:
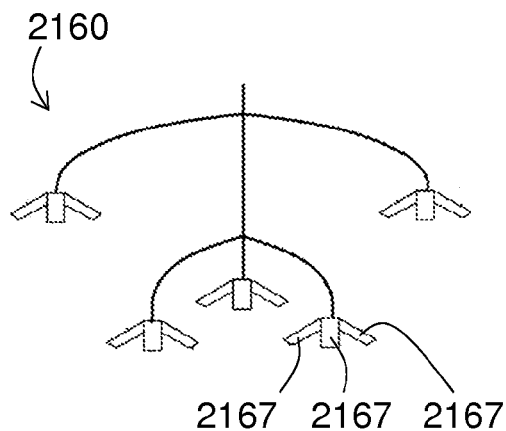
Figure 22B:
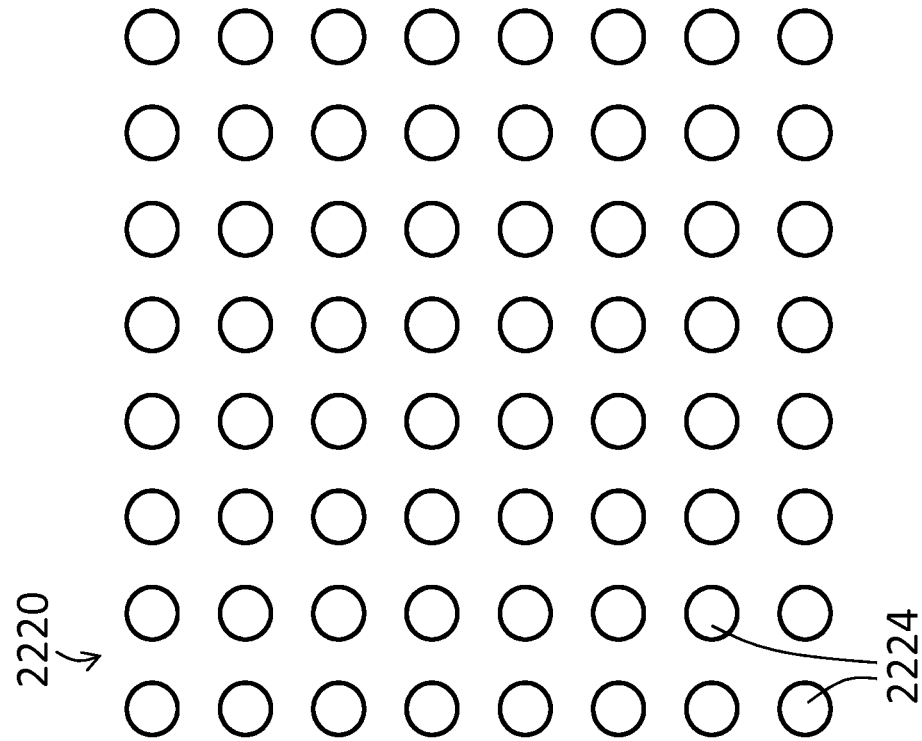
FIGS. 22A-22E are conceptual representations of two-dimensional arrays of electro-optical elements.
Figure 22A:
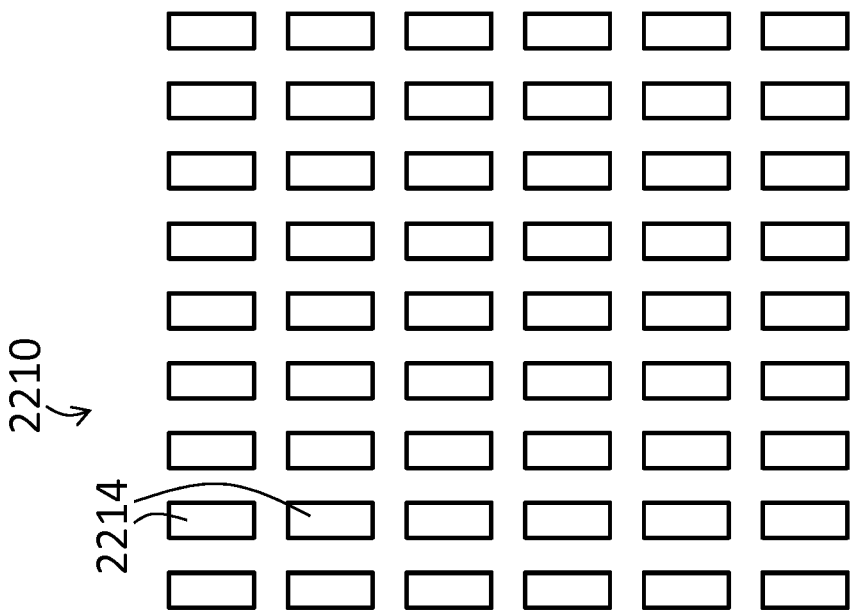
Figure 22D:
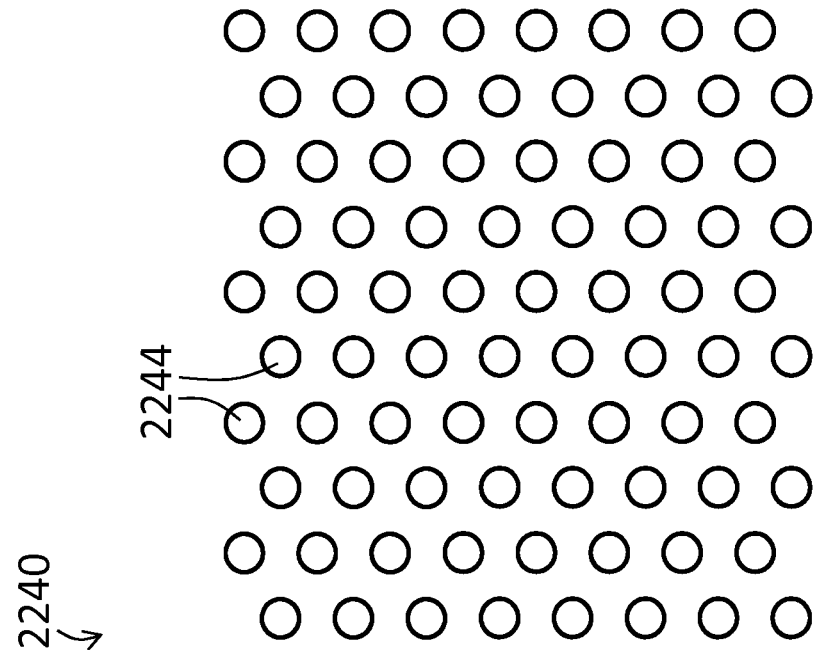
Figure 22C:
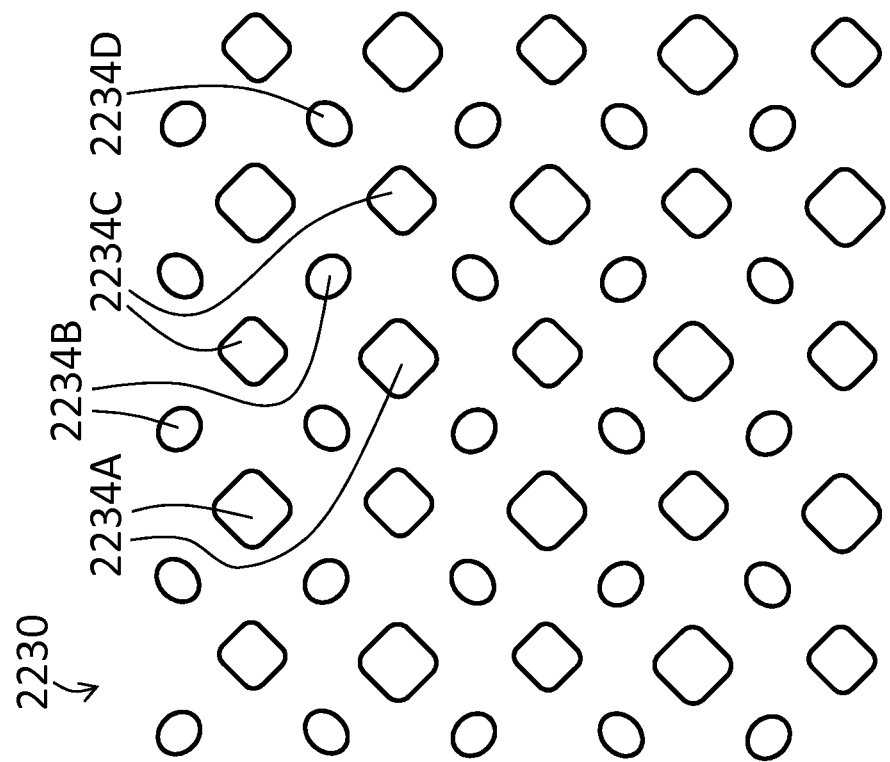
Figure 22E:
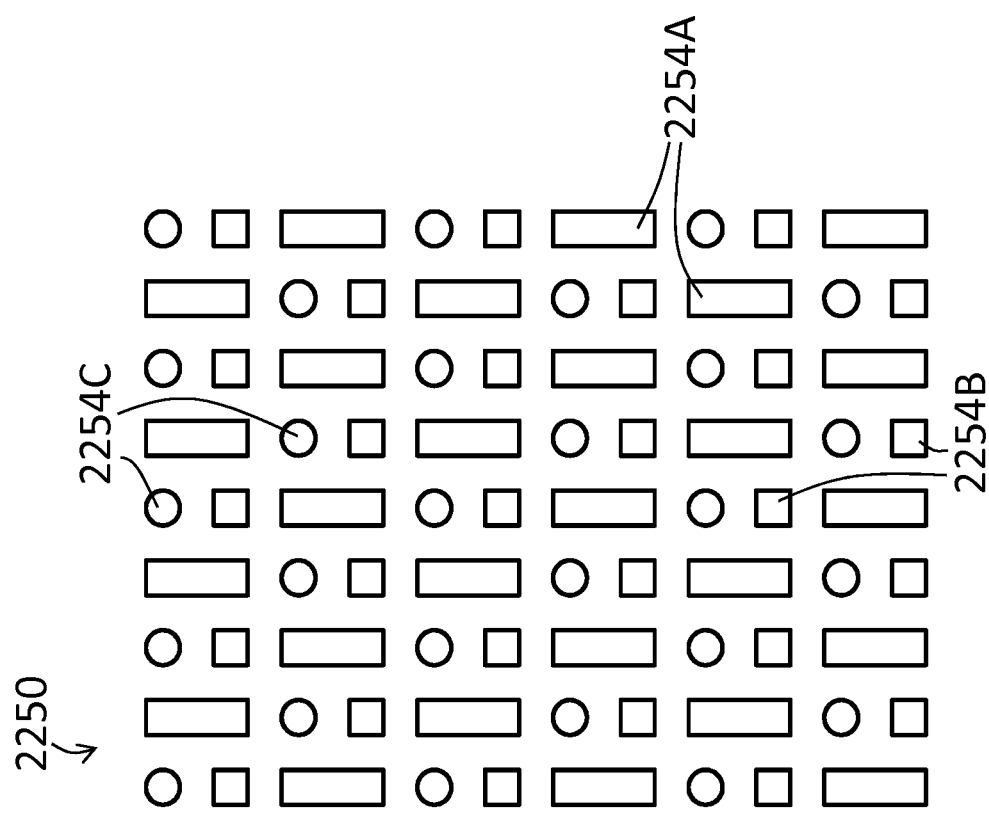

Electro-optical arrays are widely used in commercial products. FIGS. 21A-21D show respectively a phone, a monitor, a television set, and a wristwatch, all of which have pixel arrays used for information display. FIGS. 21E-21F show respectively an OLED lighting panel and an OLED luminaire, both of which have arrays of OLED elements used for illumination.

By way of example, Company A may manufacture phone displays on a mother glass; following fabrication of display elements and encapsulation, singulation, and possibly other finishing steps such as assembly with cover layers, connectorization, and packaging, a large number of display panels or display modules are obtained. These display panels are further assembled into phones, either by Company A or by another company. The manufacture of other display products of interest is similar, in that a finished display panel is incorporated into a finished product. The manufacture of lighting products of interest is also similar, in that a finished lighting panel is incorporated into a finished product. Generally, electro-optical arrays are manufactured as panels, although singulation from a mother substrate may not always be used. The skilled practitioner will recognize that many manufacturing variations are possible, and the steps described above are not necessary steps in the process of manufacturing a panel.

The term "panel product" is used to mean any product that is or that incorporates a finished electro-optical panel. Thus, the term encompasses a wide range of display panels, lighting panels, other electro-optical panels, display products (such as television, phone, camera, monitor, wristwatch), lighting products (such as an OLED luminaire). Not all phones are display products (for example, a rotary dial phone), and not all lighting products incorporate a finished electro-optical panel (for example, an incandescent light bulb). Also, a mother substrate is not a panel product, because prior to singulation and finishing steps, it does not comprise a finished electro-optical panel. However, increasing numbers of display and lighting products do incorporate electro-optical panels (such as display panels and lighting panels), and are panel products as understood in this disclosure.

Common features of electro-optical panels of interest in this disclosure include: a lower substrate, a two-dimensional array of electro-optical elements formed over the lower substrate, and an upper structure, wherein the electro-optical elements are encapsulated between lower substrate and the upper structure. Of course, depending on the technology, application requirements, and particular design, embodiments will have a varied range of additional features. Panels may be rigid or flexible.

In some embodiments, the upper structure may be a substrate, such as a glass substrate or a metal substrate. In some other embodiments, the upper structure may be a conformal coating, such as a thin-film encapsulation comprising one or more layers. In still other embodiments, the upper structure may be a composite structure comprising one or more strength members and one or more sheath layers. In some preferred embodiments, the upper structure is flexible.

The terms "lower" and "upper" refer to a conceptual order of manufacture from bottom to top—that is, active elements are formed over a bottom substrate, and a top substrate is applied later. Of course, the physical orientation of the panel during manufacture and during use could be completely different from the orientation implied by the terms "lower" and "upper". In this disclosure, terms related to vertical order (including but not limited to "above", "below", "over", "under", "top", "bottom", "beneath", "underneath") likewise refer to the same conceptual order of manufacture from bottom to top. Such terminology is common in the art, where, for example, "bottom-emitting device" and "top-emitting device" are well understood by one of ordinary skill in the art.

FIG. 1 depicts a prior art electroluminescent device 100 having encapsulation provided by an upper substrate 103. Light-emitting elements 104 are formed over a lower substrate 101. Customarily, the upper substrate 103 is attached to the lower substrate 101 using a perimeter seal 105. Thus, the encapsulation around light-emitting devices is formed by lower substrate 101, perimeter seal 105, and upper substrate 103. Most commonly, both lower substrate 101 and the upper substrate 103 are formed of glass. The perimeter seal 105 may commonly be a cured resin or a glass frit. The encapsulation defines a cavity 106 that may be filled with dry nitrogen gas.

Between lower substrate 101 and light-emitting elements 104 there are commonly intermediate layers variously including one or more of buffer layers, planarization layers, dielectric layers, banks, passive wiring layers, and active TFT layers: these are collectively represented in FIG. 1 by structure 102. Prior art device 100 may have additional elements between the light-emitting elements 104 and upper substrate 103. These additional elements are not shown in FIG. 1, but may include one or more of top electrode interconnection, a protection layer, color filters, a black matrix, desiccant, and a scattering layer.

The device 100 may commonly be a top-emitter, in which case light is emitted through a transparent upper substrate 103, or a bottom-emitter, in which case light is emitted through transparent portions of structure 102 and a transparent lower substrate 101.

FIG. 2 depicts a prior art electroluminescent device 200 having encapsulation provided by an upper structure that is a thin film encapsulation structure 201. Light-emitting elements 204A, 204B, 204C are formed over a lower substrate 101. Between lower substrate 101 and light-emitting elements 204A, 204B, 204C there are commonly intermediate layers variously including one or more of buffer layers, planarization layers, dielectric layers, banks, passive wiring layers, and active TFT layers: these are collectively represented in FIG. 2 by lower structure 202. Between light-emitting elements 204A, 204B, 204C and thin film encapsulation structure 201 there may be an intermediate structure 203. Commonly, structure 203 comprises top electrode interconnection, but may also include other elements such as a protection layer, color filters, a black matrix, desiccant, and a scattering layer.

The thin film encapsulation structure 201 may be attached to lower substrate 101 directly, as shown on the left-hand side of FIG. 2, or through structure 202 and/or structure 203, as shown on the right-hand side of FIG. 2. Thus, the encapsulation around light-emitting devices 204A, 204B, 204C is formed by lower substrate 101, thin film encapsulation structure 201, and optionally structure 202 and/or structure 203.

Different physical configurations are possible. Light-emitting elements 204A are shown being built substantially on top of structure 202, so that the thin film encapsulation structure 201 fills in the gaps between light-emitting elements 204A. Alternatively, light-emitting elements 204C may be formed in recesses in the structure 202, so that the underside of the thin film encapsulation structure 201 over light-emitting elements 204C is more smooth and/or more flat than the underside of the thin film encapsulation structure 201 over light-emitting elements 204A. As a further alternative, light-emitting elements 204B may be partially submerged in recesses in structure 202. While light-emitting elements 204A, 204B, 204C are depicted as having rectangular cross-section, any of the surfaces may in fact be curved or slanted.

The device 200 may commonly be a top-emitter, in which case light is emitted through a transparent thin film encapsulation structure 201, or a bottom-emitter, in which case light is emitted through transparent portions of layers 202 and a transparent lower substrate 101.

First Embodiment

Figure 3:
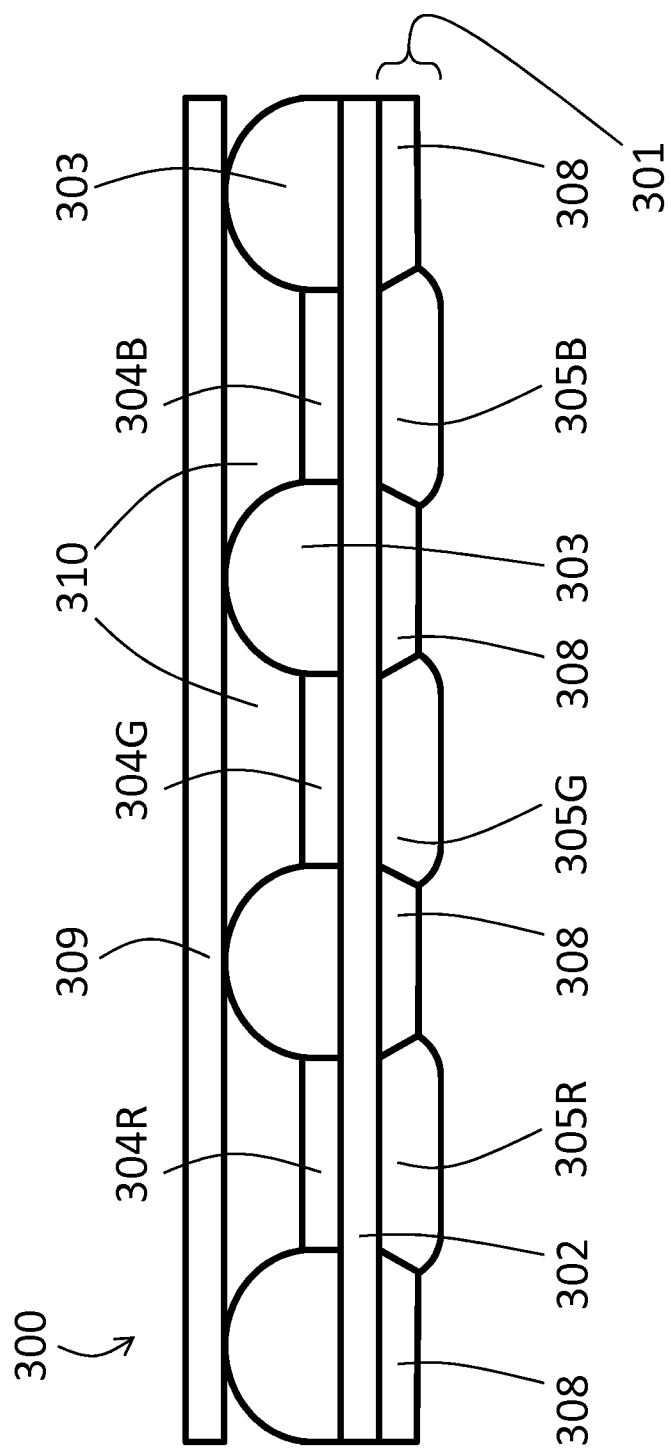
FIG. 3 is a diagram of a first embodiment of the present invention having local glass seals below electro-optical elements of a panel such as a display panel.

FIG. 3 depicts a first embodiment of the present invention. Panel 300 comprises electro-optical elements 304R, 304G, 304B formed over a lower substrate 301. Electro-optical elements 304R, 304G, 304B are part of a two-dimensional array of electro-optical elements 304 formed over the substrate 301. (Two-dimensional arrays of elements are discussed further, below, in context of FIG. 22.) Lower substrate 301 comprises a matrix 308 having light-transmissive local seals 305R, 305G, 305B formed as windows in the matrix 308. In preferred embodiments, and as shown in FIG. 3, each electro-optical element 304R, 304G, 304B has a respective local seal 305R, 305G, 305B positioned directly below it. Between lower substrate 301 and electro-optical elements 304R, 304G, 304B there may be intermediate layers variously including one or more of buffer layers, planarization layers, dielectric layers, banks, passive wiring layers, and active TFT layers: these are collectively represented in FIG. 3 by structure 302.

In preferred embodiments, lower substrate 301 may comprise a metal. Lower substrate 301 may comprise a single metal layer. Alternatively, lower substrate 301 may be a composite comprising a plurality of metal layers, or at least one metal layer and at least one non-metallic layer.

In preferred embodiments, local seals 305R, 305G, 305B, may comprise a glass material. Glass materials are particularly beneficial because they combine low permeability with optical transmissivity. Glass materials are known which are transparent, translucent, or opaque. In preferred embodiments, light emerges from the bottom of a panel through local seals such as 305R, 305G, 305B. As such, transparent and translucent glass materials are preferred. Additionally, as discussed further below, glass materials can be mixed, doped, or impregnated with additives and particles to impart desired properties, such as optical filtering or scattering.

Individual electro-optical elements 304R, 304G, 304B are separated by banks 303. The banks 303 may be formed integrally with structure 302 or separately. The banks are shown extending in height above the electro-optical elements 304R, 304G, 304B, which offers manufacturing advantages in delineating the lateral boundaries of the electro-optical elements 304R, 304G, 304B. Nevertheless, the bank height is not a necessary feature of the present invention. In some embodiments the topmost extent of the bank may be lower than the top surface of local seals 304R, 304G, 304B. In other embodiments, banks 303 may be altogether absent.

Similarly the presence of structure 302 is not a necessary feature of the present invention. In some embodiments, the functions of structure 302 may be provided by a structure located beneath the lower substrate 301. In other embodiments, structure 302 and lower substrate 301 may be fabricated as an integrated unit.

In some preferred embodiments that incorporate a lower structure 302, lower structure 302 is light-transmissive. In other embodiments, lower structure 302 has light-transmissive portions. In some embodiments, light-transmissive portions of lower structure 302 are transparent. In some embodiments, light-transmissive portions of lower structure 302 are translucent. In other preferred embodiments (not shown), lower structure 302 is formed as a mesh having cutouts beneath each electro-optical element 304R, 304G, 304B. In such embodiments, lower structure 302 may be opaque, translucent, or transparent. In some embodiments an opaque mesh lower structure 302 serves to reduce cross-coupling of light between different pixels below the plane of the electro-optical elements 304R, 304G, 304B. The opaque mesh lower structure 302 may be reflective or light-absorbing.

Above the banks 303 and electro-optical elements 304R, 304G, 304B lies upper substrate 309. In some embodiments upper substrate 309 is in contact with banks 303 at a set of discrete locations or a continuous set of locations. Accordingly, one or more upper regions 310 may be defined above electro-optical elements 304R, 304G, 304B and between banks 303. In some embodiments, upper regions 310 may comprise one or more materials in common with bank 303. In other embodiments, upper regions 310 may comprise a thermally conductive material. In other embodiments the one or more regions 310 may be filled with an inert gas such as nitrogen, or a vacuum. In still other embodiments (not shown), the upper substrate 309 may conform to the surface of one or more banks and one or more electro-optical element 304R, 304G, 304B, thereby providing direct contact between the one or more electro-optical element 304R, 304G, 304B, and the upper substrate 309. In some embodiments, upper substrate 309 may be selected from materials having good thermal conductivity. In some embodiments, upper substrate 309 may be selected from materials having good electrical conductivity.

In preferred embodiments, upper substrate 309 may comprise a metal. Upper substrate 309 may comprise a single metal layer. Alternatively, upper substrate 309 may be a composite comprising a plurality of metal layers, or at least one metal layer and at least one non-metallic layer. Some views of panel 300 in other figures omit the upper substrate 309.

In a preferred embodiment, each of electro-optical elements 304R, 304G, 304B may be an organic electroluminescent element such as OLED (organic light-emitting diode) comprising an organic layer stack between a bottom electrode and a top electrode. Some organic layer stacks, and methods of manufacture are described in U.S. Pat. Nos. 4,769,292, 5,904,961, and 5,937,272. The organic layer stack may include an electroluminescent layer as well as one or more of the following layers: a hole injection layer, a hole transport layer, an electron transport layer, and an electron injection layer. Energy is released in the form of light during electron-hole recombination in the electroluminescent layer. The electroluminescent material may be a fluorescent material or a phosphorescent material. Additionally the OLED may have tandem structure, in which case multiple OLED electroluminescent layers are separated by powered or unpowered connectors, and light from a first electroluminescent layer passes through a second electroluminescent layer before emerging from the light-emitting panel 300. Tandem OLED structures are described, for example, in U.S. Pat. No. 6,717,358 to Liao. As used herein, an organic layer stack has a plurality of layers, at least one layer of which comprises 50% or more by weight of one or more organic compounds. As such, the organic layer stack may include one or more layers comprising only inorganic material, such as LiF, or one or more layer comprising an inorganic material as a minority constituent, such as a layer doped with metal atoms.

The present invention is not limited to organic electroluminescent elements. Electro-optical elements 304R, 304G, 304B may also be one or more of the following: liquid crystal elements, inorganic light-emitting diodes (LEDs), quantum dot LEDs, electrochromic elements, inorganic electroluminescent elements, thick film dielectric electroluminescent elements, plasma elements, field emission elements, electronic paper, interferometric modulator elements, surface conduction electron emitter elements, micromirror elements, and MEMS elements.

In a preferred first embodiment, panel 300 is an emissive display panel, and elements 304R, 304G, 304B emit red, green, and blue light respectively. Alternatively, panel 300 may be a transmissive, reflective, or transflective display panel. Panel 300 may further be a lighting panel emitting fixed white light, temperature tunable white light, fixed colored light, or programmable colored light. Panel 300 may also be part of a transmissive product such as an electronic window, or signage. Panel 300 may be substantially flat, or it may have perceptible curvature. Panel 300 may also be a component of a projection display.

In preferred embodiments panel 300 may be observed from the bottom. Light from elements 304R, 304G, 304B emerges through transparent portions of structure 302 and local seals 305R, 305G, 305B. In some embodiments, panel 300 may be observed from both top and bottom.

In many embodiments, each of electro-optical elements 304R, 304G, 304B comprise a bottom electrode and a top electrode, neither of which is shown in FIG. 3. The bottom electrode is directly connected to passive matrix or active matrix circuitry in lower structure 302. The top electrode connection can be made in a variety of ways, not shown in FIG. 3. In some embodiments, top electrodes are connected to each other over the entire panel 300, i.e. the entire panel 300 has a common top electrode. In other embodiments, top electrodes are connected to each other in stripes which may be oriented along rows, columns, or diagonals of the panel 300. The stripes may be straight, zigzag, or other substantially linear forms. In still other embodiments, the top electrodes are connected to each other within each of a plurality of two-dimensional regions of the panel 300. Top electrode interconnections of any of these forms are routed above banks 303 in some embodiments or under banks 303 in other embodiments. In still other embodiments, the top electrode is connected locally at each element to circuitry within the structure 302.

As an example, element 304G is encapsulated by local seal 305G, matrix 308, lower structure 302, bank 303, upper substrate 309, and optionally a top electrode interconnection. The encapsulation around electro-optical elements 304R and 304B is similar.

Some embodiments may include additional upper elements between the top electrode of an electro-optical element 304R, 304G, 304B and the upper substrate 309. Such elements may variously include one or more of: a protection layer, a reflective layer, color filters, a black matrix, desiccant, and a scattering layer, according to the needs and design of a particular embodiment. In some embodiments, one or more of these additional upper elements may extend beyond a single electro-optical element 304R, 304G, 304B, and therefore form part of the encapsulation surrounding the corresponding electro-optical element 304R, 304G, 304B. These and other upper elements may take the form of an additional structure (not shown) above electro-optical elements 304R, 304G, 304B and below upper substrate 309, similar to structure 203 described in context of FIG. 2.

It will be recognized that as the various components forming encapsulation around element 304G serve different functions, are formed of different materials by a variety of manufacturing processes, so the permeation rates of moisture, oxygen, and/or other detrimental materials through the various encapsulating components will not be the same. As a general rule, a thick layer of material offers a longer migration path for a detrimental material and a lower permeation rate, compared to a thin layer of the same material. Additionally, electro-optical elements 304R, 304G, 304B may have a functional area less than the physical area.

Figure 20:
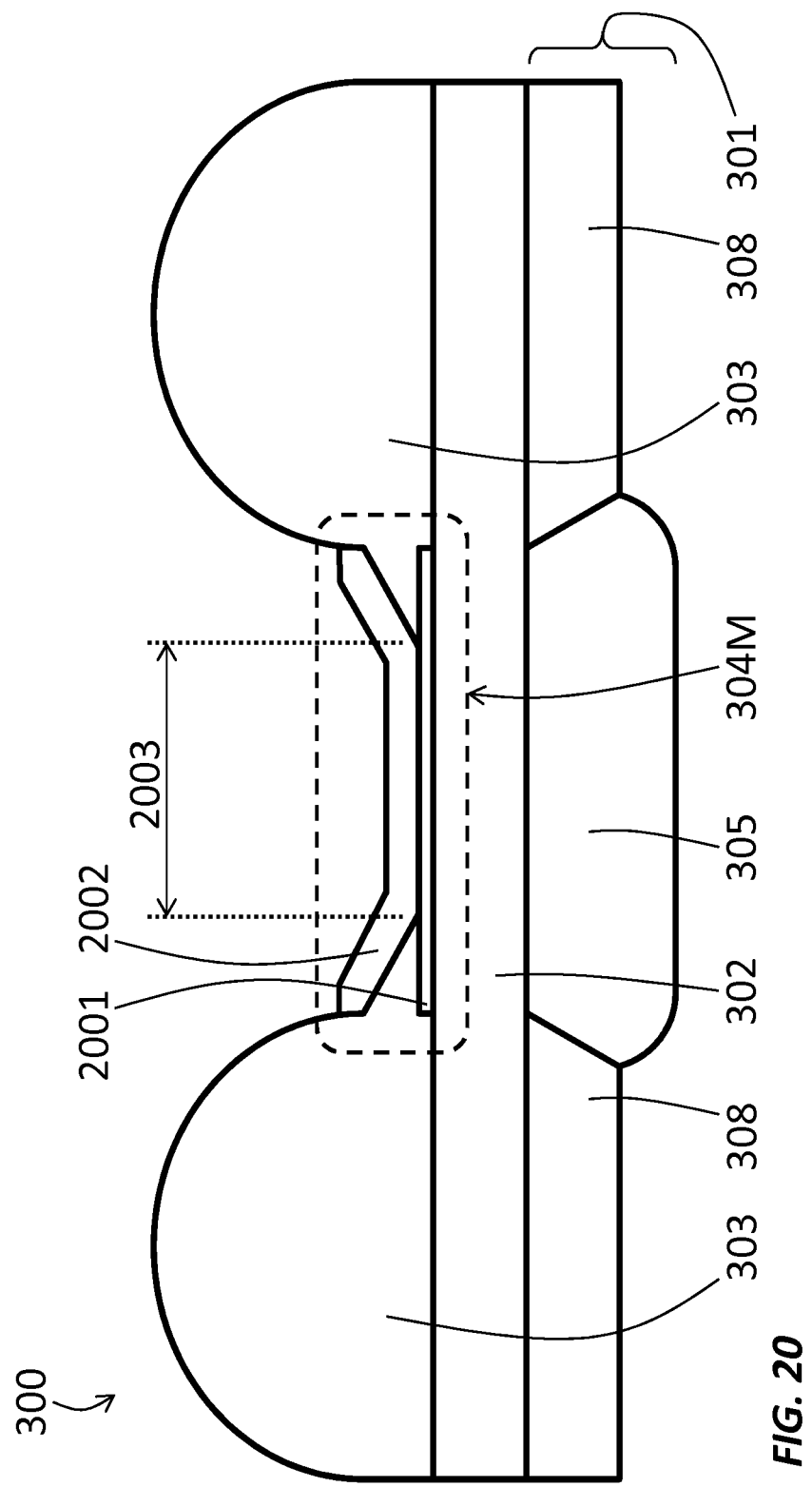
FIG. 20 is a diagram showing a detail of an OLED element over a local glass seal.

FIG. 20 shows a detail of an embodiment in which electro-optical element 304M is an OLED element 304M having bottom electrode 2001 and a stack of functional layers 2002. The area of contact between bottom electrode 2001 and functional layer stack 2002 defines an active region 2003 of the OLED element. Moisture-sensitive material may extend laterally beyond the active region 2003. In this case the lateral edges of the electro-optical element 304M lie outside the functional area 2003, and therefore penetration of oxygen, moisture, and/or other detrimental materials to a lateral edge of electro-optical element 304M may have less impact on product performance than penetration of the same amount of oxygen, moisture, and/or other detrimental material to the center of the electro-optical element 304M.

The functional layer stack 2002 may incorporate layers such as a hole injection layer, a hole transport layer, an emissive layer, an electron transport layer, an electron injection layer, and a cathode layer. Each of these layers has a respective lateral extent, which may all be the same in some embodiments, and some of which may be different in other embodiments.

For reasons such as these, satisfactory encapsulation of element 304G (FIG. 3) or 304M (FIG. 20) can be achieved with a combination of the various components forming encapsulation around the element 304G or 304M, despite considerable variation in the permeation rates through the materials constituting the various encapsulating components.

In some embodiments, neighboring local seals 305R, 305G, 305B, provide a benefit of an optically transmissive and/or optically transparent seal under respective electro-optical elements 304R, 304G, 304B. In some embodiments, the local seals 305R, 305G, 305B, provide a benefit of a glass seal without compromising deformability, flexibility, or unbreakability of the panel 300. While each individual local seal 305R, 305G, 305B, is rigid, the areas between neighboring seals can flex more readily.

In order to preserve flexibility of the finished product in different directions of flexing, it is desirable that rigid local seals be separated in these directions by gaps comprising flexible material. In some preferred embodiments restrict the size of each local encapsulation seal in all directions along the surface of the associated lower substrate. More specifically, if the lower substrate is laid out horizontally flat and the size of the two-dimensional array of electro-optical elements along a direction D along the top surface of the substrate is $A_D$, and the size of one local encapsulation seal in the same direction is $S_D$, then these preferred embodiments will, for all directions D, have the ratio $S_D/A_D$ less than or equal to 1/5, preferably less than or equal to 1/10, commonly less than or equal 1/30, and often less than or equal to 1/100. Alternatively, the size of one local encapsulation seal, measured as area in the plane of the overlying two-dimensional array of electro-optical elements, can be compared with the area of the array of electro-optical elements. In some above-mentioned preferred embodiments, the ratio of local encapsulation seal area to the area of the array of electro-optical elements will be less than or equal to 4%, preferably less than or equal to 1%, commonly less than or equal to 0.11%, and often less than 0.01%. In some embodiments, the ratio of the maximum number of electro-optical elements above any one local encapsulation seal to the total number of electro-optical elements in the array of electro-optical elements is less than or equal to 4%, preferably less than or equal to 1%, commonly less than or equal to 0.11%, and often less than 0.01%. Additionally, in some preferred embodiments, the local encapsulation seals will have an aspect ratio less than 3:1, preferably less than 2:1, more preferably less than 1.5:1, and commonly less than 1.2:1. The "aspect ratio" is understood to mean the ratio of (1) the longest dimension of a local encapsulation seal measured parallel to the plane of the substrate, to (2) the shortest dimension of the same local encapsulation seal measured in the same plane.

Panel 300 may be part of a commercial product such as a phone. FIG. 21A shows a phone 2110, which incorporates a display having an active light-emitting region 2117 comprising a two-dimensional array of electro-optical elements. Panel 300 may be part of a commercial product incorporating an information display monitor. FIG. 21B shows information display monitor 2126 that is an integral part of laptop computer 2128. The information display monitor 2126 has an active light-emitting region comprising a two-dimensional array 2127 of light-emitting elements. Panel 300 may be part of a television set. FIG. 21C shows a curved television 2130 incorporating an active display region 2137 having a two-dimensional array of pixels. Panel 300 may be part of a wearable electronics product such as a wristwatch. FIG. 21D shows a wristwatch 2140 in which an active display region comprises a two-dimensional array 2147 of pixels.

Second Embodiment

Figure 4A:
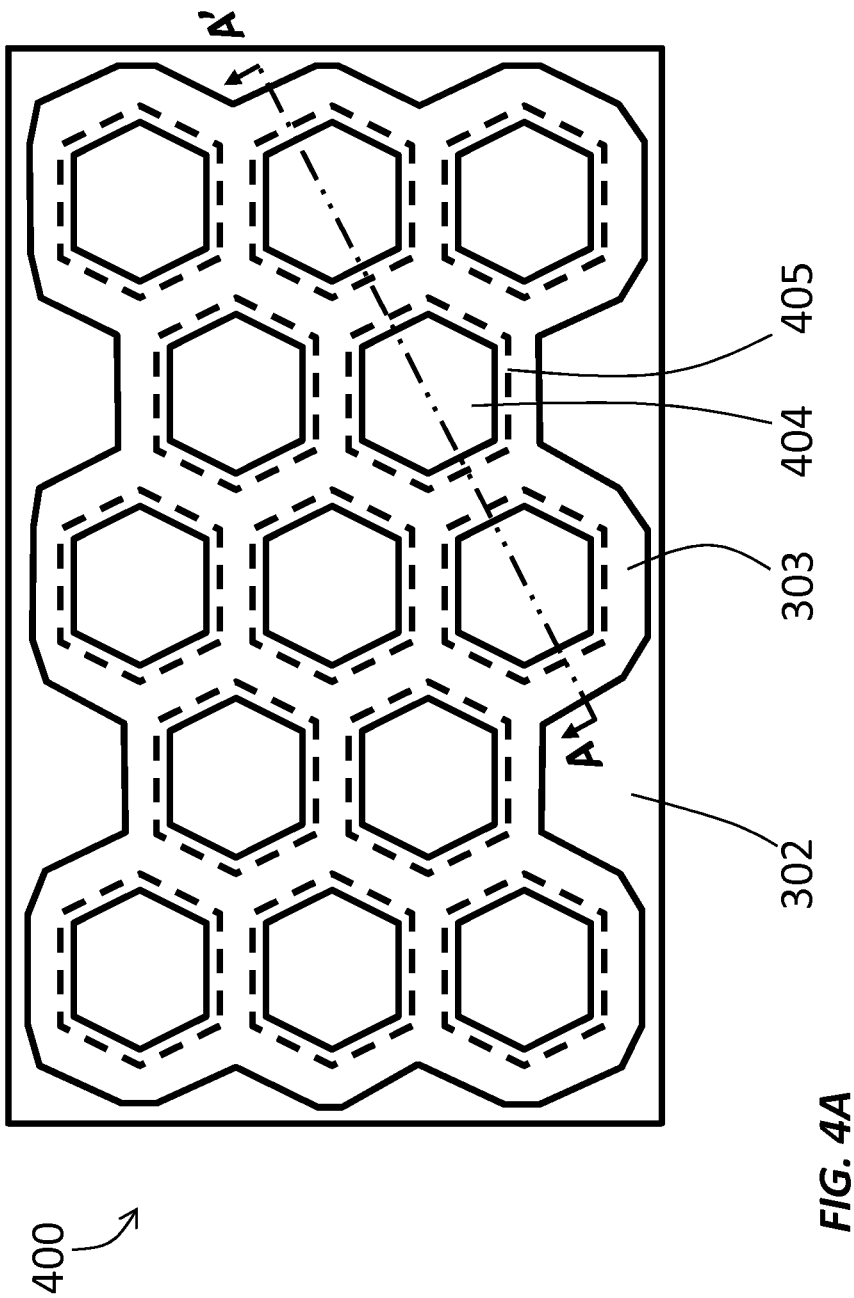
FIG. 4A is a diagram of a second embodiment of the present invention having local glass seals below light-emitting elements of a lighting panel.

Turning now to FIG. 4A, panel 400 (shown in top view) is a preferred second embodiment of a lighting panel comprising light-emitting elements 404 separated by banks 303. Local seals 405 lie beneath each light-emitting element 404. The lighting panel may be part of a lighting fixture or other lighting product, either as a removable part or as an integrally fabricated component. FIG. 21F, adapted from U.S. Pat. No. 7,638,941 shows a ceiling-mount OLED chandelier 2160; each OLED panel 2167 is a removable unit.

Each light-emitting element 404 has a respective local seal 405. As shown, the local seals 405 are hexagonal and are arranged in a hexagonal pattern forming a two-dimensional array. Light-emitting elements 404 and local seals 405 are arranged in similar hexagonal patterns. Of course, other patterns are possible. For example, FIG. 21E, adapted from U.S. Pat. No. 6,870,196, shows an OLED lighting panel 2150 comprising a rectangular array of polygonal lighting elements 2154 formed on a common substrate 2151.

Section AA' is shown in cross-sectional view in FIG. 4B. Each local seal 405 is positioned beneath a respective light-emitting element 404 formed over substrate 301. Between lower substrate 301 and light-emitting elements 404 there may be intermediate layers variously including one or more of buffer layers, planarization layers, dielectric layers, banks, passive wiring layers, and active TFT layers: these are collectively represented in FIG. 4B by structure 302. The banks 303 may be formed integrally with structure 302 or separately.

In a preferred embodiment, each of light-emitting elements 404 may be an organic electroluminescent element such as OLED (organic light-emitting diode), as described above. However, the present invention is not limited to organic electroluminescent elements.

Lighting panel 400 may emit fixed white light, temperature tunable white light, fixed colored light, programmable colored light, or a combination of any of these. Lighting panel 400 may also combine a lighting function with other functions including but not limited to a window, a mirror, a display, and signage.

In preferred embodiments, lighting panel 400 may emit light from the bottom, in which case light from elements 304 emerges through transparent portions of structure 302 and local seals 405. Some embodiments of lighting panel 400 may emit light from both top and bottom.

Element 404 in FIG. 4B is encapsulated by local seal 405, matrix 308 (matrix 308 and local seals 405 together comprising lower substrate 301), structure 302, and bank 303, and upper substrate 309. Similar to panel 300 described above, panel 400 may also have top electrode interconnections (not shown) between light-emitting elements 304, and may also have additional upper elements (not shown) between light-emitting elements 304 and upper substrate 309. A top electrode interconnection and/or these additional upper elements may also form part of the encapsulation surrounding light-emitting element 304.

As previously described, satisfactory encapsulation of light-emitting element 404 can be achieved with a combination of the various components forming encapsulation around the element 404, despite considerable variation in the permeation rates through the materials constituting the various encapsulating components.

Figure 5:
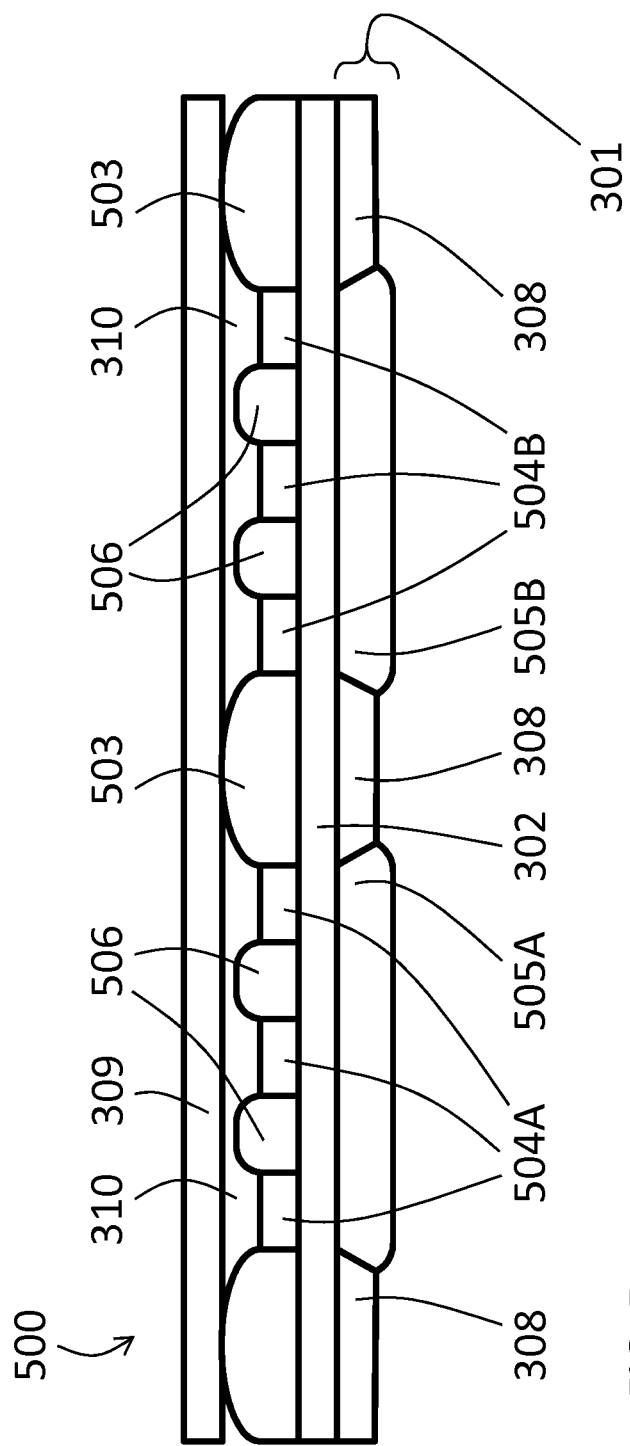
FIG. 5 is a diagram of a third embodiment of the present invention having local glass seals below groups of light-emitting elements.

It is not necessary for each individual electro-optical element or light-emitting element to have its own independent local seal in order to realize the benefits of the present invention. FIG. 5 shows a third embodiment of a panel 500 wherein the area of each local seal 505A, 505B encompasses the area of a respective group of electro-optical elements 504A, 504B. The individual elements 504A are mutually separated by banks 506, while a group of elements 504A is separated from a neighboring group of elements 504B by a bank 503. In preferred embodiments, the height of bank 506 is less than the height of bank 503, but this is not necessary. Between lower substrate 301 and elements 504A, 504B lies optional structure 302, providing the same or similar functions as described above. Upper substrate 309 is located above banks 503, 506 and above pixel elements 504A, 504B. Between upper substrate 309 and elements 504A, 504B are one or more defined regions 310. Regions 310 and upper substrate 309 have already been described in context of FIG. 3.

Flexibility

Figure 18:
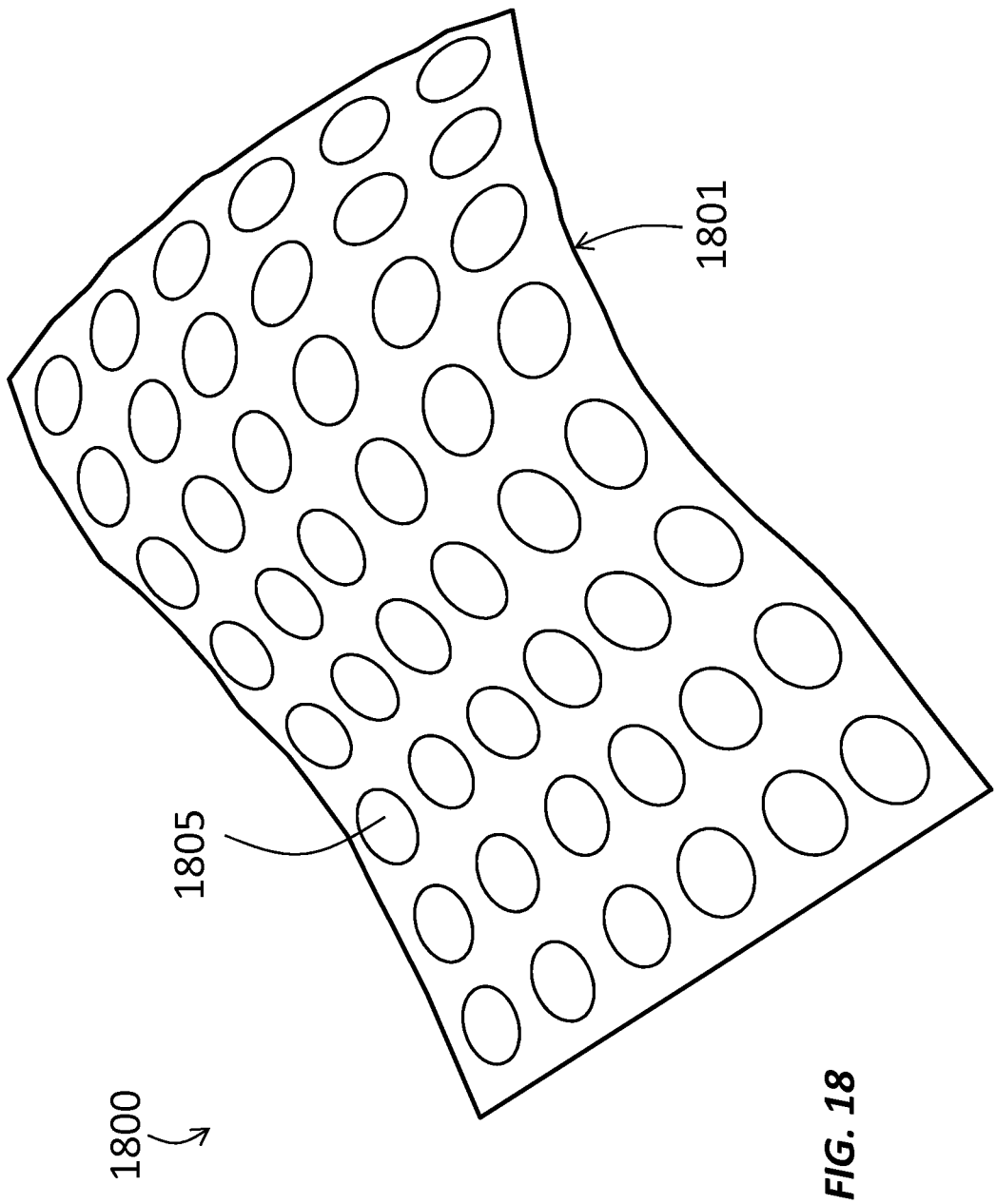
FIG. 18 is a diagram of a flexible electroluminescent panel having local glass seals.

FIG. 18 shows a bottom view of a curved or flexed panel 1800 utilizing local seals 1805 under electro-optical elements (not shown) formed on substrate 1801. Panel 1800 may be part of a display product, a lighting product, or any other product including but not limited to those described above in context of panels 300 and 400. It should be emphasized that FIG. 18 is not drawn to scale, because of the widely disparate dimensions of the features shown. At the time of writing, OLED displays are known with pixel sizes on the order of tens of microns. By comparison, requirements for bending radius may be on the order of hundreds of microns for an unbreakable display, centimeters for a bendable display, and meters for a curved television set. In some embodiments, the ratio of the largest transverse dimension of a local seal 1805 to the required bend radius will preferably not exceed 10%, or more preferably 5%. Thus, depending on the bending requirements of a product, and the size and spacing of electro-optical elements, it may be possible to accommodate varying numbers of electro-optical elements above each local seal 1805.

Figure 23D:
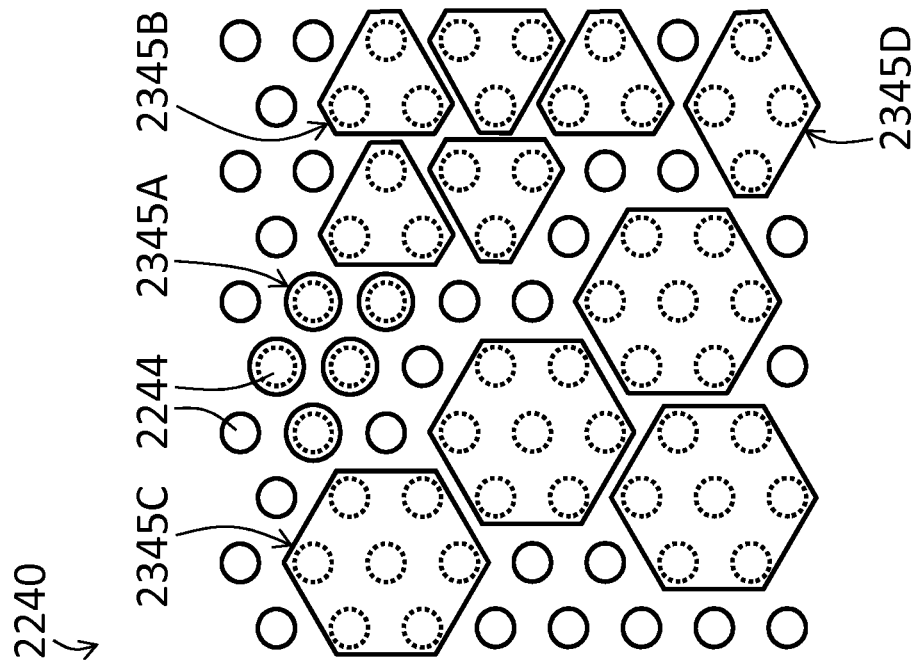
Figure 23C:
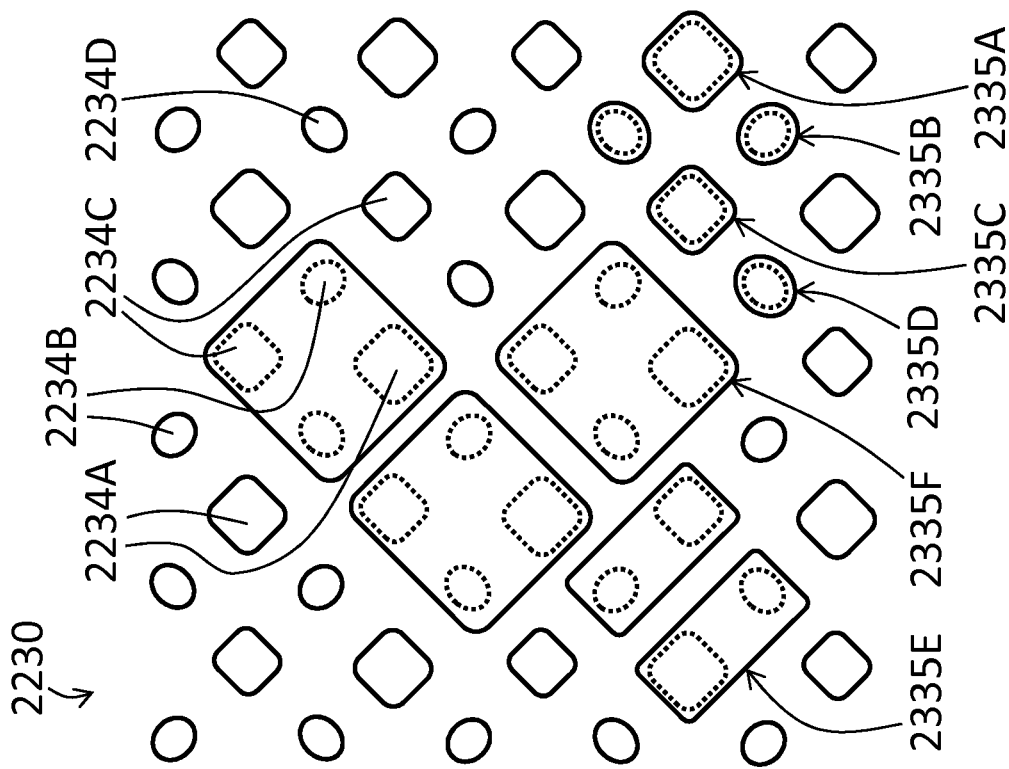
Figure 23E:
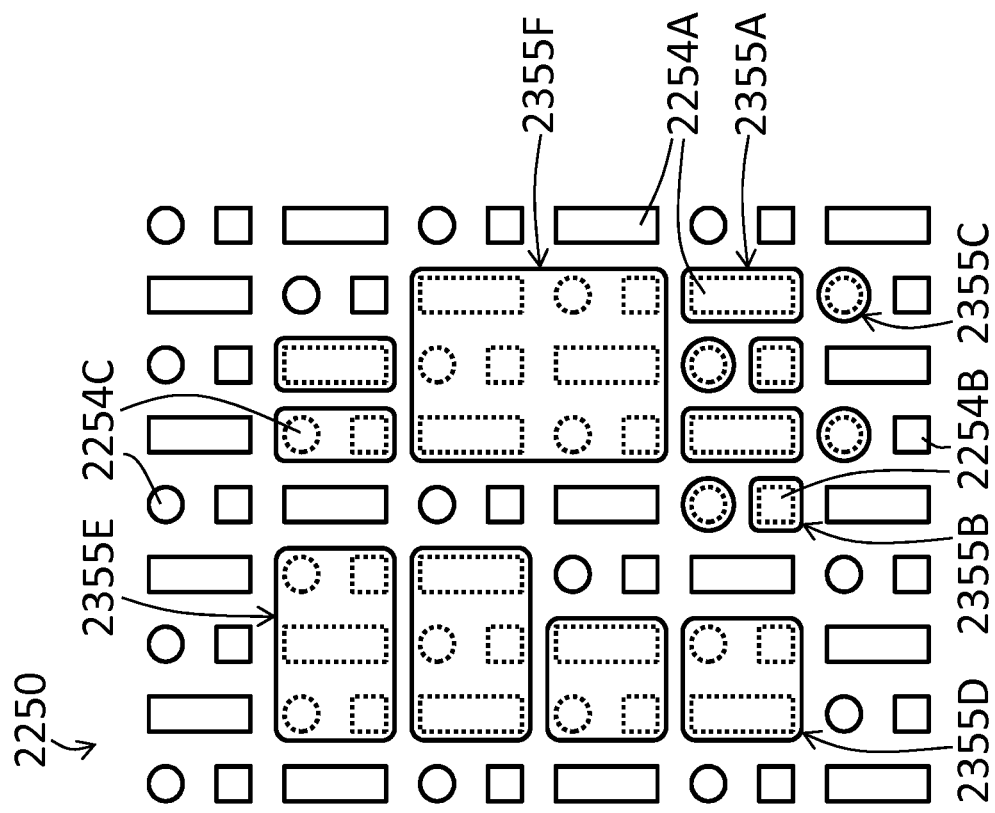

In some embodiments, local seals 1805 are made of glass, or another rigid material, while flexible substrate 1801 is less rigid and is able to flex. When a sheet of material is bent, there may be elastic deformation: one surface of the sheet experiences tension and is stretched, while an opposite surface of the sheet experiences compression and is compressed. (Between the surfaces lies a neutral plane, which by definition experiences neither tension nor compression as the sheet is bent.) The bending can be represented in geometrical terms as the local strain in the sheet. In the context of FIG. 18, the areas of panel 1800 where rigid local seals 1805 are located are stiff and undergo minimal deformation, and consequently have a low value of strain when the panel 1800 is flexed. In comparison, areas between neighboring local seals 1805 are flexible and undergo more deformation, leading to higher values of strain when the panel 1800 is flexed. In embodiments of this invention having local seals 1805 made of glass, it is expected under flexion that the ratio of strain midway between a first and a second neighboring local seals 1805 to the strain at a position of the substrate lying beneath the center of either the first or the second neighboring local seals is at least 2:1, usually at least 5:1, commonly at least 10:1, and sometimes greater than or equal to 20:1. In order to maximize the flexibility of such an embodiment, it will be clear to the skilled practitioner that gaps between pixels should be left free to flex. That is to say, it is usually preferable to have separate local encapsulation seals for each electro-optical element in order to maximize flexibility. Exceptions may occur in cases where pixels are of different sizes: grouping of smaller pixels over one encapsulation seal may sometimes be performed without compromising the overall flexibility of the two-dimensional array. The array 2250 shown in FIG. 23E provides one such example.

Patterns of Electro-Optical Elements and Local Seals

Returning to FIG. 5, panel 500 may be part of a display product, a lighting product, or any other product including but not limited to those described above in context of panels 300 and 400. As an example, in a display product, the three elements 504A may comprise a red pixel, a green pixel, and a blue pixel. In a display product having four-element pixel groups, such as RGBG or RGBW—where the letters R, G, B, and W respectively denote red, green, blue, and white elements—elements of 504A may comprise two, four, or some other number of elements, from the same or different pixel groups. In a lighting product having a hexagonal layout of lighting elements similar to the layout shown in FIG. 4A, groups of elements 504A to be covered by a common local seal may be diamond-shaped groups of four elements, or hexagonal-shaped groups of seven elements. Many other groupings of elements are also possible within the scope of this third embodiment.

FIG. 22 shows some possible arrangements of electro-optical elements in a two-dimensional array. FIG. 22 is only a conceptual representation of electro-optical elements; the other features of product embodiments such as a substrate, local seals, and banks are not shown. The full extent of a typical two-dimensional array is not shown either. FIG. 22A shows a rectangular array 2210 of stripe elements 2214. FIG. 22B shows a rectangular array 2220 of circular elements 2224. FIG. 22C shows a rotated rectangular pattern 2230 of rectangular- and oval-shaped elements 2234A, 2234B, 2234C, 2234D similar to the pattern found in some Samsung Galaxy™ phones. FIG. 22D shows a hexagonal pattern 2240 of circular elements 2244. FIG. 22E shows a rectangular pattern 2250 of different shaped elements 2254A, 2254B, 2254C arranged in blocks. It will be understood by a skilled practitioner that the various features of these patterns may be combined in numerous combinations, and that many other patterns are also possible. The elements in FIGS. 22A-22E may be OLED elements, display pixels, electrophoretic elements, or other such electro-optical elements as are described elsewhere in this disclosure. In some preferred embodiments, all local encapsulation seals have the same size and shape.

FIGS. 23A-23E show bottom views of some possible arrangements of local encapsulation seals for the patterns of FIG. 22. Dotted lines represent electro-optical elements that lie above these seals. Once again, FIG. 23 contains conceptual representations only; local encapsulation seals of different shapes and sizes are shown together as a matter of convenience. As the skilled practitioner will recognize, it is to be expected that within one embodiment, substantially all of the local encapsulation seals will be the same size and shape, with possible exceptions near edges of the overlying two-dimensional array of electro-optical elements. Likewise, it is to be expected that each electro-optical elements of the two-dimensional array will be covered from below by a local encapsulation seal. Of course, it is usually possible to arrange local encapsulation seals so that each local seal covers exactly one electro-optical element, as shown by local encapsulation seals 2315C, 2325A, 2335A-2335D, 2345A, and 2355A-2355C in corresponding FIGS. 23A-23E. As discussed above, for embodiments having rigid local seals, embodiments having distinct local seals for each electro-optical element of the two-dimensional array will generally maximize the flexibility of the sealed array.

The other encapsulation seals 2315A-2315B, 2325B-2325C, 2335E-2335F, 2345B-2345D, and 2355D-2355F indicate some possible configurations whereby electro-optical elements can be grouped in the corresponding two-dimensional arrays of FIGS. 23A-23E, with one local encapsulation seal under each group. These configurations are suitable for embodiments in which the substrate and local seals have comparable stiffness, or embodiments in which flexibility does not need to be maximized. Because there are lateral permeation pathways from the edge of a local seal to an overlying electro-optical element, configurations with grouped local seals provide less total seal perimeter and, on average, longer permeation pathways compared to configurations having distinct local seals for each pixel. That is to say, grouping electro-optical elements over a common local encapsulation seal is effective to achieve lower permeation rates.

Manufacture

Figure 6A:
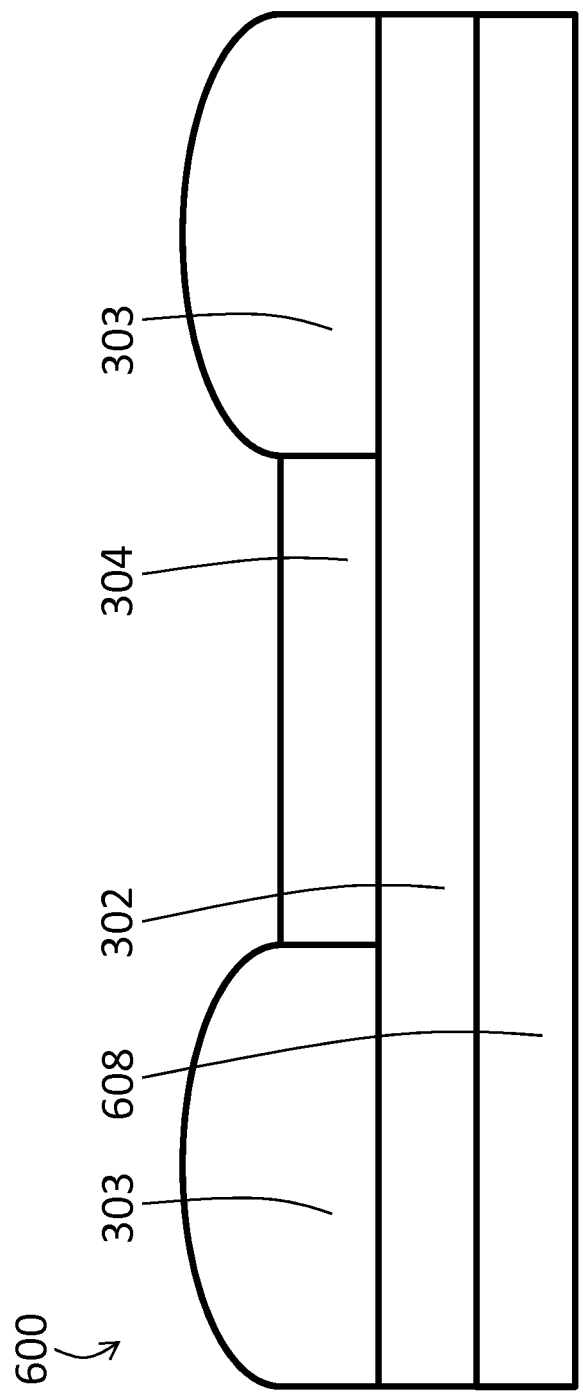
FIGS. 6A-6F are diagrams of an electroluminescent panel at different stages of formation of local glass seals.

FIGS. 6A-6F depict sequential manufacture of the local seals of a representative embodiment of this invention. FIG. 6A shows an unfinished panel 600 prior to formation of any local seal. Electro-optical element 304, which is an OLED element in certain preferred embodiments, has been formed over a starter substrate 608 and lower structure 302, described above. Banks 303 surround electro-optical element 304 and separate this element from neighboring electro-optical elements (not shown in FIG. 6A-6F).

In preferred embodiments, the starter substrate 608 may be opaque. As discussed previously, lower structure 302 may be wholly or partially light-transmissive. The objective of the manufacturing process is to provide a plurality of light-transmissive sealed windows in the starter substrate 608, so that light can pass through the layers beneath electro-optical element 304 and exit the panel. For the sake of clarity, FIGS. 6A-6F depict formation of a single local seal; it will be evident to the skilled practitioner that each step can be replicated for each of a plurality of local seals. Some steps, such as an etching step, are amenable to simultaneous performance for a plurality of window openings. Other steps, such as an inkjet deposition step, are amenable to sequential performance for each of a plurality of local seals. Still other steps, such as fusing glass powder by a laser, are amenable to sequential performance for one group of local seals at a time.

FIG. 6A is drawn showing the lower substrate on the bottom of the drawing, for consistency with other figures and conventional nomenclature for e.g. "upper", "lower" as discussed previously. It will be apparent to one or ordinary skill in the art that during the manufacturing process, the panel being manufactured can be held in any orientation, and can be shifted from one orientation to another between process steps and even during process steps. Accordingly, FIGS. 6A-6F are drawn with unfinished panel 600 shown in the same orientation so that the manufacturing steps are easier to follow, and it will be understood that one or another orientation may be preferred for any individual process step.

Figure 6B:
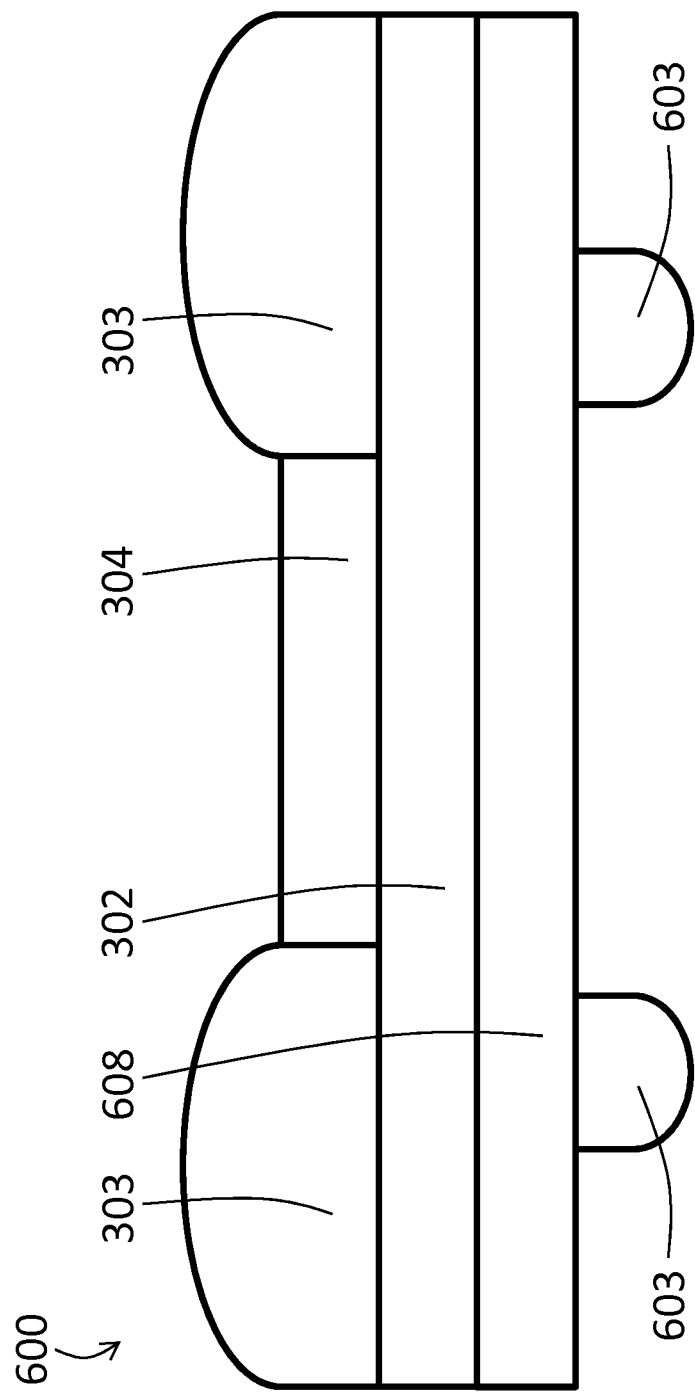

FIG. 6B shows formation of a dam 603 around a target area for a window below electro-optical element 304. Dam 603 below may be formed by a photolithographic process or a screen printing process, both of which are well-known in the art. As shown in FIG. 6B, dam 603 is a narrow annulus, local to one electro-optical element, which has an advantage of lower material usage. Alternatively dam 603 may be preformed as a mask extending over the area of a group of electro-optical elements, or even over the entire active area of the panel 600, with cutouts for a plurality of electro-optical elements. In such embodiments, the dam 603 may have a shape and extent comparable to bank 303.

Exemplary materials suitable for formation of dam 603 include metal etch resists. A number of suitable products are available. For example, Nazdar Alkali Removable Etch Resist Ink 226 Black is available from Nazdar Ink Technologies, Shawnee, Kans.

Figure 6C:
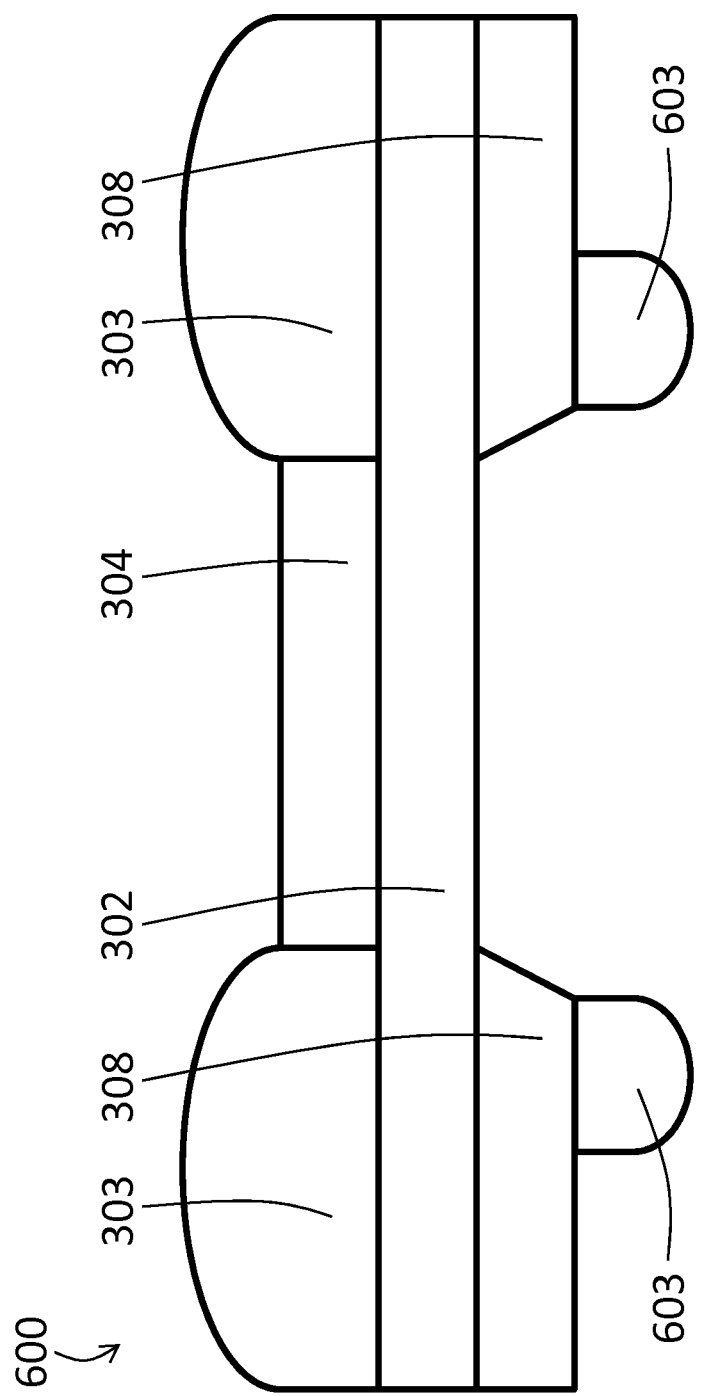

FIG. 6C shows a cutout having been etched in the target area for seal formation below electro-optical element 304. Thereby starter substrate 608 shown in FIGS. 6A-6B is now a matrix 308, having openings beneath each electro-optical element 304. In preferred embodiments, starter substrate 608 comprises metal. A wide variety of chemical etchants are known for removing metals, including ferric chloride solution, copper chloride solution in aqueous hydrochloric acid, aqueous acid solutions such as nitric acid or hydrochloric acid, aqueous acid mixtures such as phosphoric acid+nitric acid+acetic acid, and some proprietary etchants. Some metals such as aluminum can also be dissolved in alkaline solutions such as sodium or potassium hydroxide. Chemical etching is preferred, as etchants can readily be chosen that do not attack the material of lower structure 302, which may be a polymer. Alternatively, etching can be performed by other known technologies, including plasma etching and laser ablation.

Figure 6D:
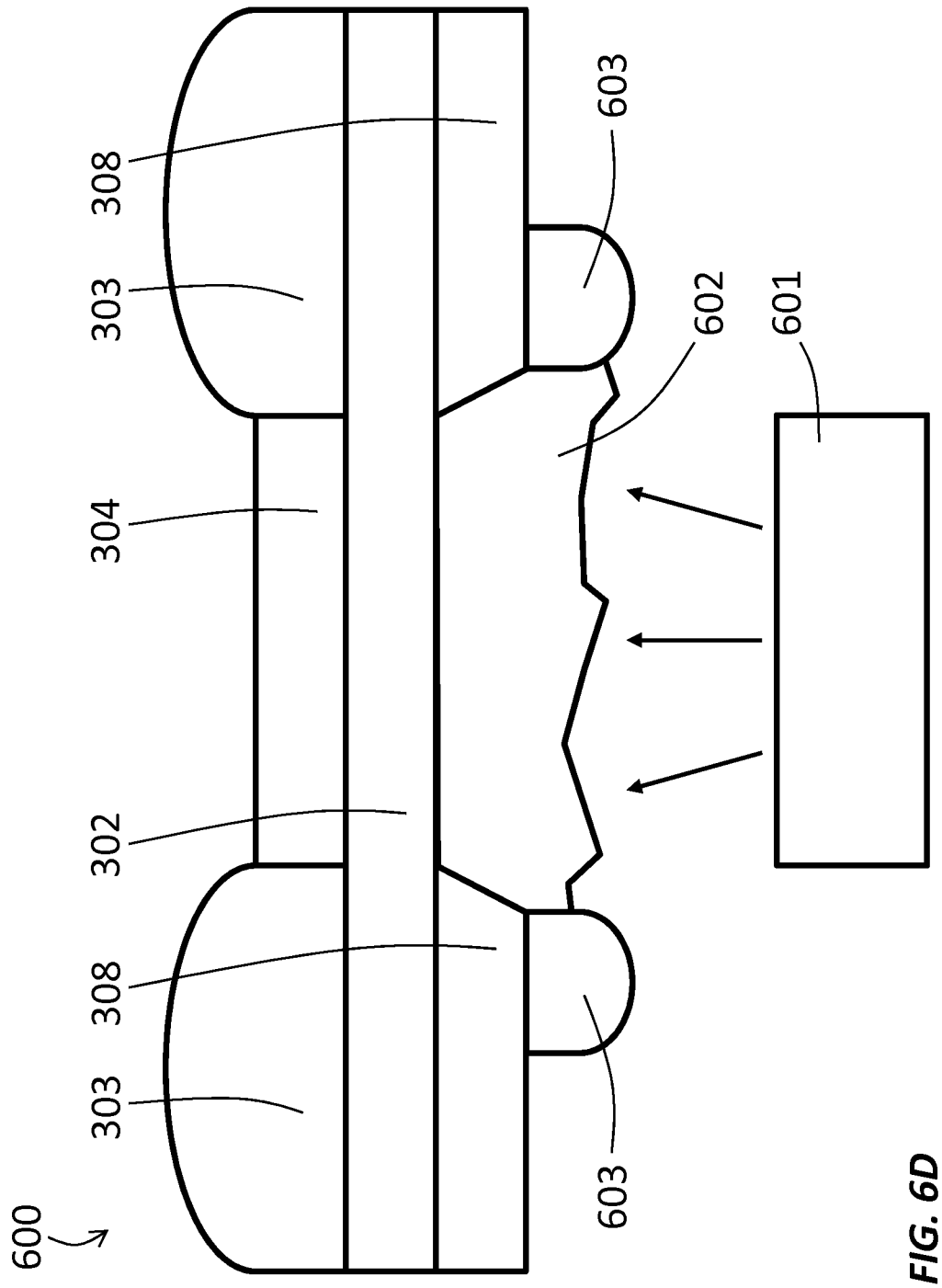

FIG. 6D shows deposition of a glass powder paste 602 onto element 304 by a nozzle 601. For this process step, it may be preferred to have unfinished panel upside-down, so that glass powder paste 602 can be held in place by gravity. However an upside-down orientation is not essential, as the glass powder paste 602 may have sufficient adhesion to the exposed lower surface of lower structure 302 and the slant walls of matrix 308 to provide support for a thin film of the glass powder paste 602. This deposition technique is often referred to informally as inkjet material deposition, or inkjet printing. While paste 602 is shown having an uneven bottom surface, in practice this bottom surface will be more or less smooth according to the viscosity and surface tension of the deposited formulation, and the force of ejection from nozzle 601. Nozzle 601 is part of an inkjet dispenser. In some embodiments, nozzle 601 may place one or more droplets of glass powder paste in a first opening, followed by one or more droplets of glass powder paste in a second opening. In some embodiments the second opening may be a neighbor of the first opening; in other embodiments, a plurality of inkjet dispensers and/or more complicated traversal algorithms may be used.

Figure 6E:
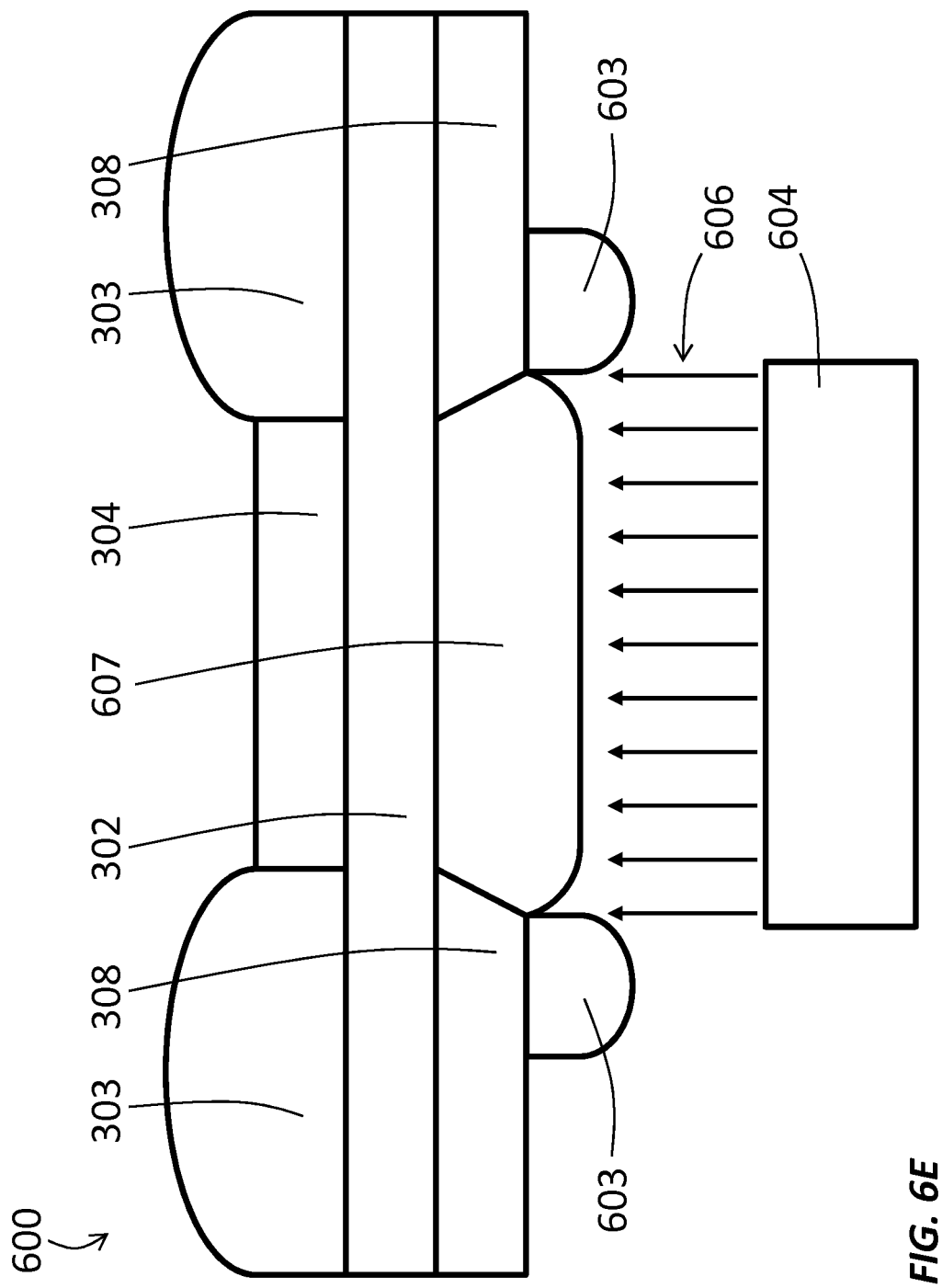

FIG. 6E shows curing of the glass powder paste by irradiation 606 from a laser beam source 604. At this stage, the glass powder paste 602 has melted, the carrier material of the glass powder paste has volatilized, and the glass powder particles have fused into a liquid mass 607 that is adhered to the slant walls of matrix 308 and the bottom surface of the lower structure 302. In embodiments having either no lower structure or cutouts in lower structure 302, the liquid mass 607 may be adhered directly to a bottom surface of electro-optical element 304, which may be a bottom electrode surface. The liquid mass 607 has a smooth surface as shown.

Figure 6F:
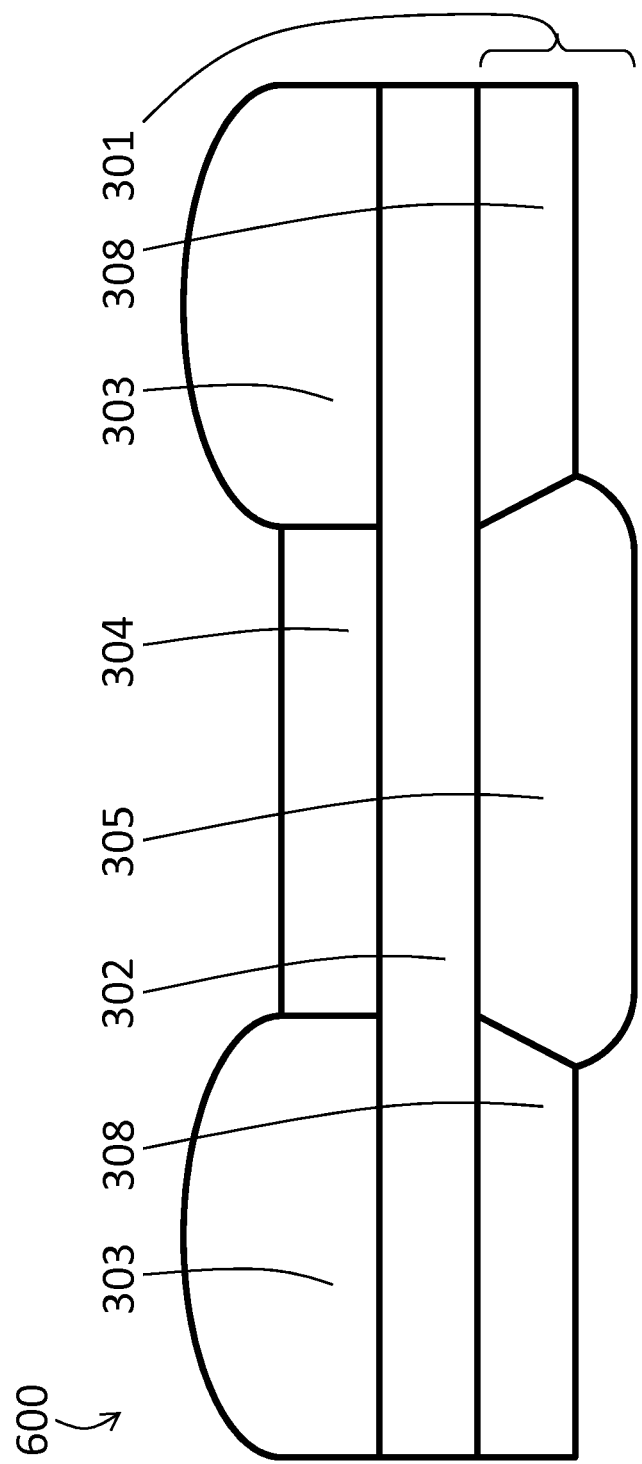

Finally, FIG. 6F shows the cured local glass seal 305 after it has cooled and hardened, and after dam 603 has been removed. Matrix 308 and local seal 305 comprise lower substrate 301. In order that matrix 308 and local seal 305 form a continuous seal, it is desirable that local seal 305 is adhered to matrix 308. Local seal 305 may also be adhered to lower structure 302. In some embodiments, local seal 305 may additionally or alternatively be adhered to a bottom surface of electro-optical element 304. It will be recognized that the structure of FIG. 6F resembles the structures previously shown in FIGS. 3-5, and that this manufacturing method is generally applicable to a wide variety of embodiments of this invention including but not limited to those described above.

The step of dam removal is not essential to the practice of this invention. In some embodiments, dam 603 is left in place after formation of local seal 305. In such applications, a suitable material for dam 603 is Nazdar ADE Series Epoxy Screen Ink.

In particular, one of ordinary skill in the art will recognize that the layers above lower structure 302 each play a minimal role in the manufacturing process shown in FIGS. 6A-6F. Thus, while it is possible to fabricate local seals 305 after the electro-optical elements and banks have been formed, as described above, it is also possible, and may be preferable to form the local seals 305 before forming electro-optical elements 304, and even before forming banks 303. In preferred embodiments, banks 303 and dams 603 are formed on opposite sides of starter substrate 608, then local seals 305 are formed, then electro-optical elements 304 are formed, and finally upper structure and upper substrate are assembled (not shown in FIGS. 6A-6F), producing an encapsulated panel.

It will further be recognized that the manufacturing method described is exemplary, and numerous variations are possible without departing from the spirit and scope of this invention. Depending on the size of local seal being formed and the construction of lower substrate 301 and lower structure 302, techniques such as screen printing and electrophoretic deposition may particularly be suitable. Further, after completion of manufacture, unfinished panel 600 may result in a finished product that could be a display product, a lighting product, or any other product including but not limited to those described above in context of panels 300 and 400.

While, in preferred embodiments, the local seals are formed of glass using a glass powder paste or suspension, the invention is not so limited. In other embodiments, local seals may be formed from organic resins, inorganic compounds, eutectic metal alloys, or other metals.

The seal material may be deposited as a powder, paste, suspension, solution, or in integral form (that is, as a preformed solid seal to be fused to one or more underlying structures) under the electro-optical elements 304. The deposition process may use inkjet technology, physical vapor deposition, chemical vapor deposition, printing, sputtering, powder coating, electroplating, electroless plating, and plasma coating. Patterning of the deposited material according to the desired local seals may be done at the time of deposition or subsequently.

Curing of the seal material may be performed by thermal means, such as hot gas, convection, or electrical heating. Electrical heating may take forms including but not limited to induction, resistive, dielectric, RF, and microwave heating. Curing may be performed by external radiation, including infrared lamps, ultraviolet lamps, or laser. Curing may be performed chemically, as in the case of two-part epoxies. For embodiments using heat in the curing process and having organic constituents within electro-optical elements 304, and particularly for preferred embodiments having elements 304 that are OLED elements, the temperature of the local encapsulation seals, the elements 304, and the substrate may be controlled to be less than or equal to 300° C., preferably less than or equal to 275° C., commonly less than or equal to 250° C., and sometimes less than or equal to 225° C. Of course, curing temperature is much less of a concern in embodiments where OLED elements are formed after formation of local encapsulation seals.

Figure 7A:
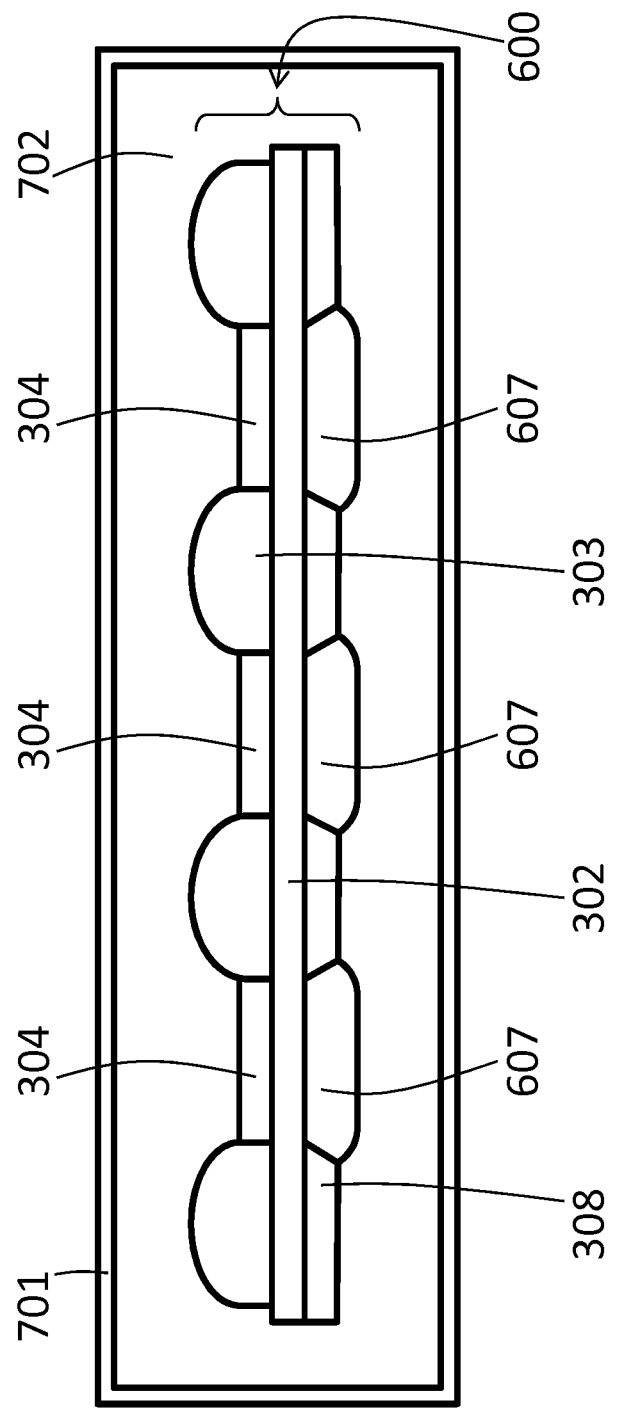
FIGS. 7A-7C are diagrams showing different forms of heating that may be used to fuse local glass seals.
Figure 7B:
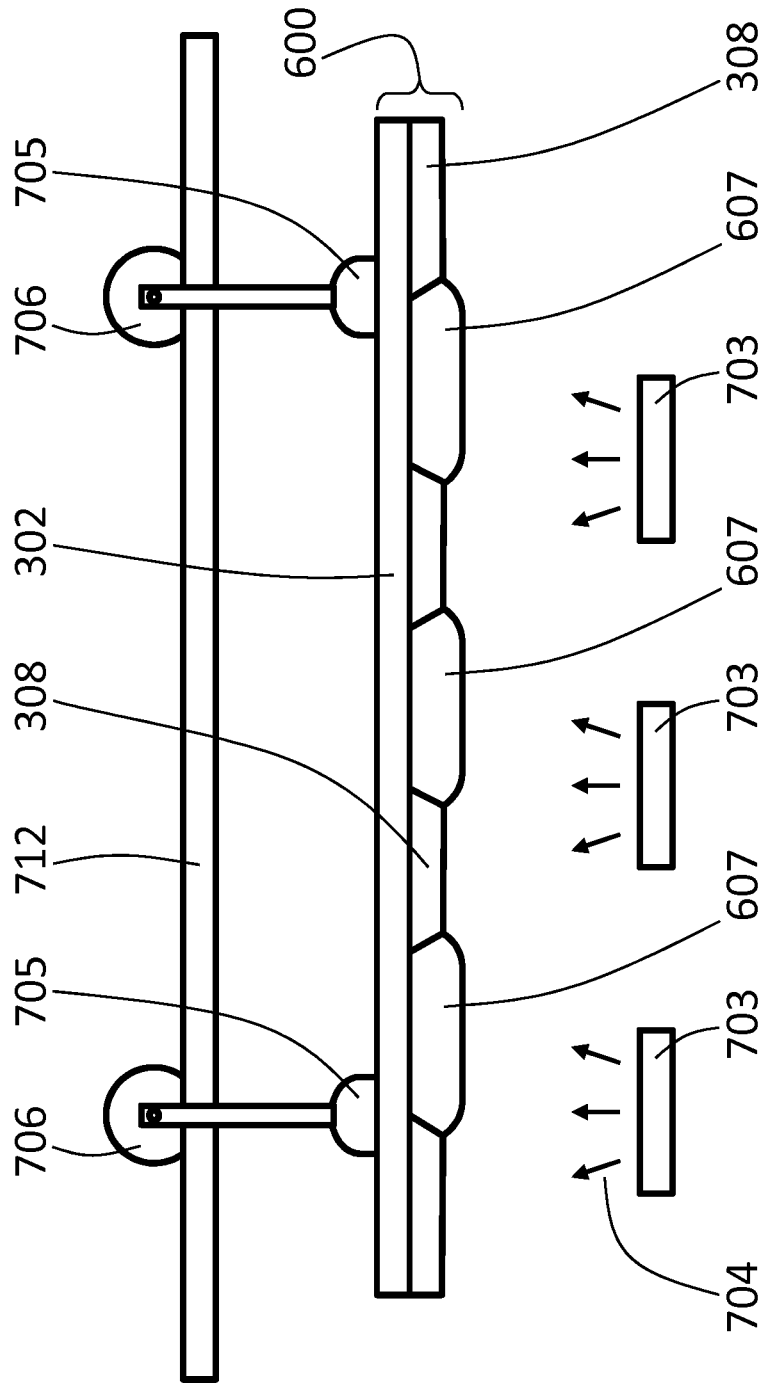
Figure 7C:
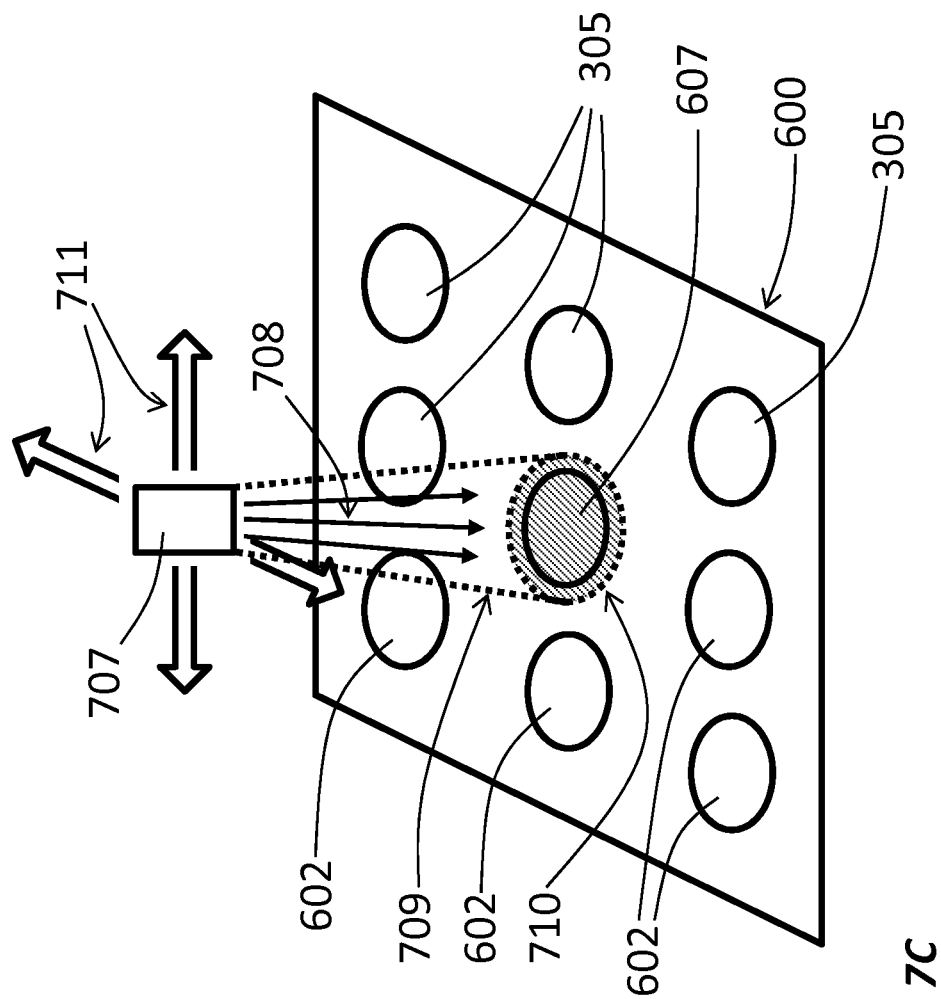

FIGS. 7A-7C show some configurations for curing the local seals 607 using heat and radiation. As discussed above, the orientation of unfinished panel in FIGS. 7A-7C is shown consistently with other figures and as a matter of convention, and may differ from the actual orientation of unfinished panel 600 for a particular process step. FIG. 7A shows a furnace 701 in which the entire unfinished panel 600 is being heated. In some embodiments the space 702 inside the furnace 701 is filled with a gas such as dry nitrogen. In other embodiments, the space 702 is evacuated to a pressure lower than atmospheric pressure, or a vacuum, and unfinished panel 600 is heated by infrared radiation from hot walls of the furnace 701 or from heat lamps (not shown) installed in the furnace 701. Transport of the unfinished panel 600 in and out of the furnace 701 may be accomplished in some embodiments by continuous transport, in a form of a conveyor belt or in an equivalent form. Transport may also be accomplished on a cyclical basis as sequence of discrete steps: open furnace door, introduce unfinished panel 600 with uncured local sealing material, close furnace door, apply heat to cure the local sealing material, open furnace door, extract panel 600 with cured local seals.

FIG. 7B shows an embodiment for heating just the bottom of unfinished panel 600. The unfinished panel 600 is held by suction cups 705 and transported through a heating zone by a suspended conveyor arrangement including rollers 706 and track 712. One or more radiation sources 703 provide irradiation 704 of only the bottom surface of unfinished panel 600, which results in curing of the seal material 607. It will be recognized that heating of just the bottom surface need not be performed using continuous transport, but can also be performed in a heating chamber similar to furnace 701 having, for example, heat lamps installed in a bottom wall only.

FIG. 7B shows unfinished panel 600 without either banks 303 or electro-optical elements 304. Thus the entire substantially planar top surface of lower structure 302 is available for holding the unfinished panel 600, either by suction cups 705 as shown or another fastening mechanism. One of ordinary skill in the art will also recognize that if unfinished panel 600 is held upside-down, then an ordinary conveyor system (with rollers contacting the exposed surface of lower structure 302) is quite satisfactory, and there is no need for the suspended conveyor as shown.

FIG. 7C shows an embodiment for sequential heat curing of local seals 305, 607, 602 using irradiation from laser source 707. Unfinished panel 600 is located upside-down beneath the laser source 707. Irradiation 708 from the laser is in the form of a conical beam 709 and irradiates a spot 710 that encompasses a single local seal 607, causing this seal to be heated and cured. Arrows 711 indicate that the laser is scanned in two dimensions (preferably in steps, from one local seal to another) to successively heat and cure all the local seals being formed on unfinished panel 600. As indicated, some local seals labeled 602 have yet to be cured. Other local seals labeled 305 have already been cured. It will be recognized that although arrows 711 are shown next to the laser source 707, the translation can alternatively be applied to the unfinished panel 600. In some embodiments, one axis of translation is performed by moving the laser beam, while another axis of translation is performed by moving the unfinished panel 600.

The embodiments described above in context of FIGS. 7B and 7C have an advantage of using less total heat energy compared to the embodiment described above in context of FIG. 7A. This has numerous benefits, including but not limited to less energy cost, less cooling time, lower TACT time, higher manufacturing throughput, and reduced heat damage to the unfinished product 600.

Figure 8A:
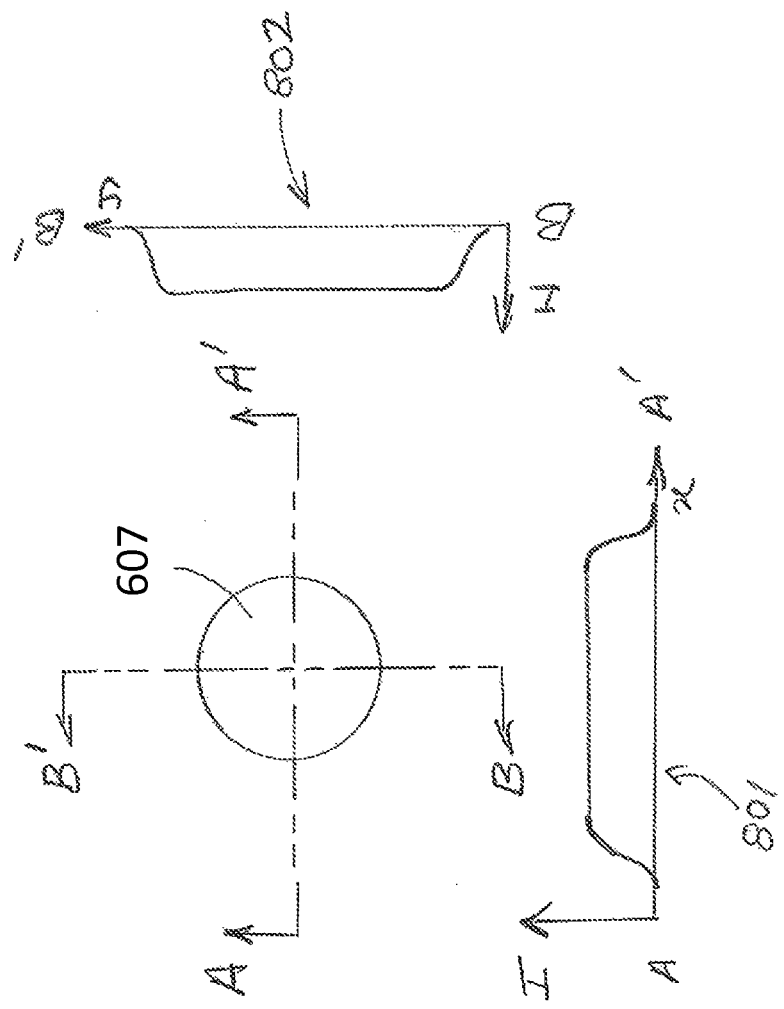
FIGS. 8A-8C are diagrams of different laser beam profiles that may be used for selective heating of glass seals.
Figure 8B:
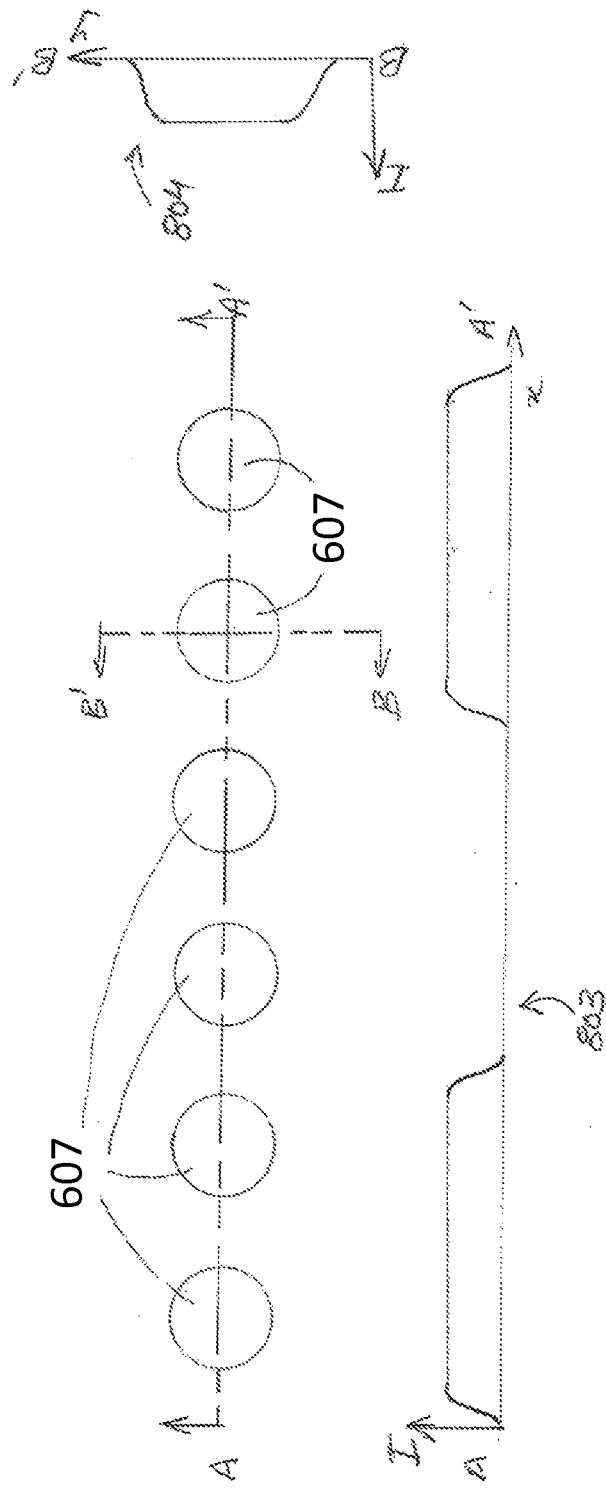
Figure 8C:
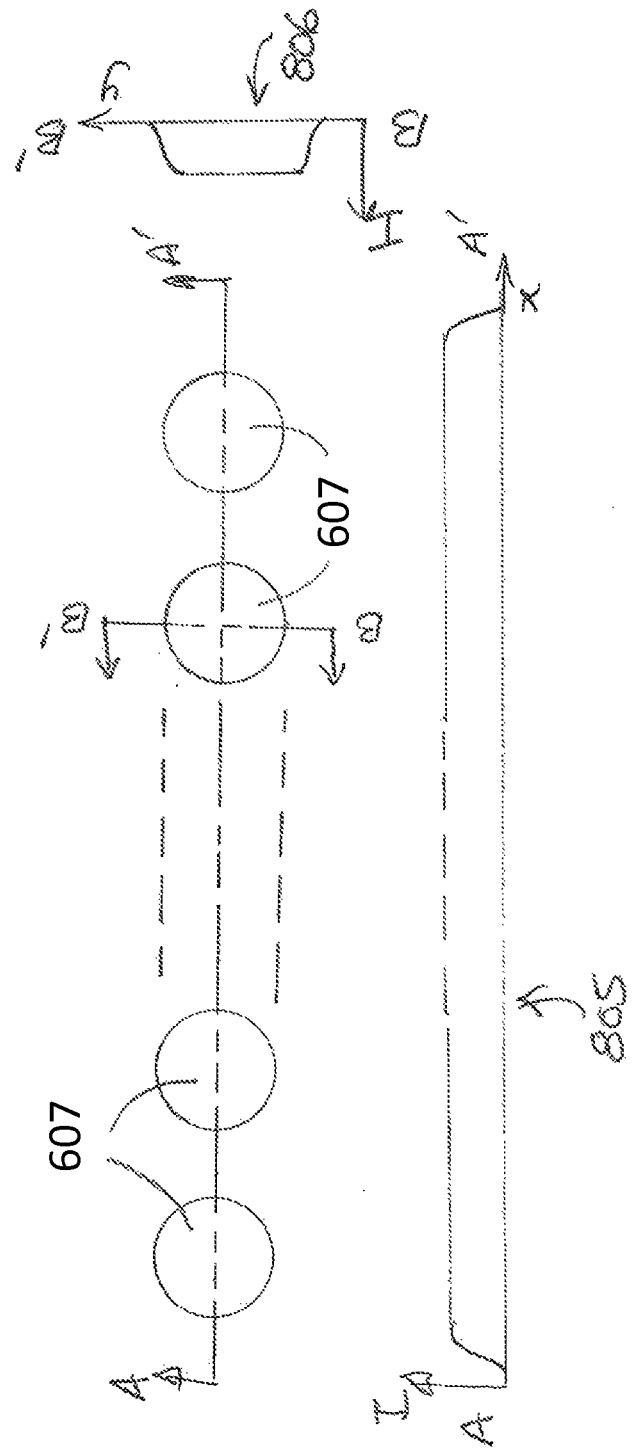

It will be recognized that laser beams can have a variety of tailored beam profiles, some of which are shown in FIGS. 8A-8C. FIG. 8A shows a spot beam profile illuminating a local seal 607. Graph 801 represents the beam profile along cross-section AA'. The axes of the graph are I, the intensity of irradiation, a quantity which may be measured in W/cm$^2$, and x, which is the distance coordinate along the AA' section. Graph 802 represents the beam profile along cross-section BB'. I is the intensity of irradiation, and y is the distance coordinate along the BB' section.

FIG. 8B shows a multi-spot beam illuminating several of the local seals 607. Graphs 803 and 804 show the beam profiles along cross-sections AA' and BB'. In the example shown, the laser beam has two spots, each of which illuminates two neighboring local seals 607. Of course, other combinations are possible, such as five spots illuminating one local seal each, or one spot illuminating four neighboring local seals: two in each of two neighboring rows.

FIG. 8C shows a linear beam illuminating a row of local seals 607. Graphs 805 and 806 show the beam profiles along cross-sections AA' and BB'. Of course, other arrangements are possible, such as a beam illuminating two rows of local seals, or a beam having width along the BB' cross-section that is narrower than the width of the local seals 607. In the latter arrangement, the laser beam is scanned back and forth in the y direction to provide irradiation and heating of the entire area of the local seals 607.

As described above, the encapsulation of an electro-optical element such as 304, 304R, 304G, 304B, 504A, 504B is comprised of a number of components having varying material composition and varying permeation rates for moisture, oxygen, and/or other detrimental materials. Although a local seal such as a local glass seal may provide adequate sealing over the bottom surface of an overlying electro-optical element, side paths through other encapsulating components may adversely affect product performance and lifetime. For this reason, it may be desirable in some applications to combine a local seal with a thin film encapsulation structure. In some panel embodiments, such a supplementary thin film encapsulation structure extends across and even beyond the extent of the active region of the panel.

Combination of Local Seals with Thin Film Encapsulation

Figure 9:
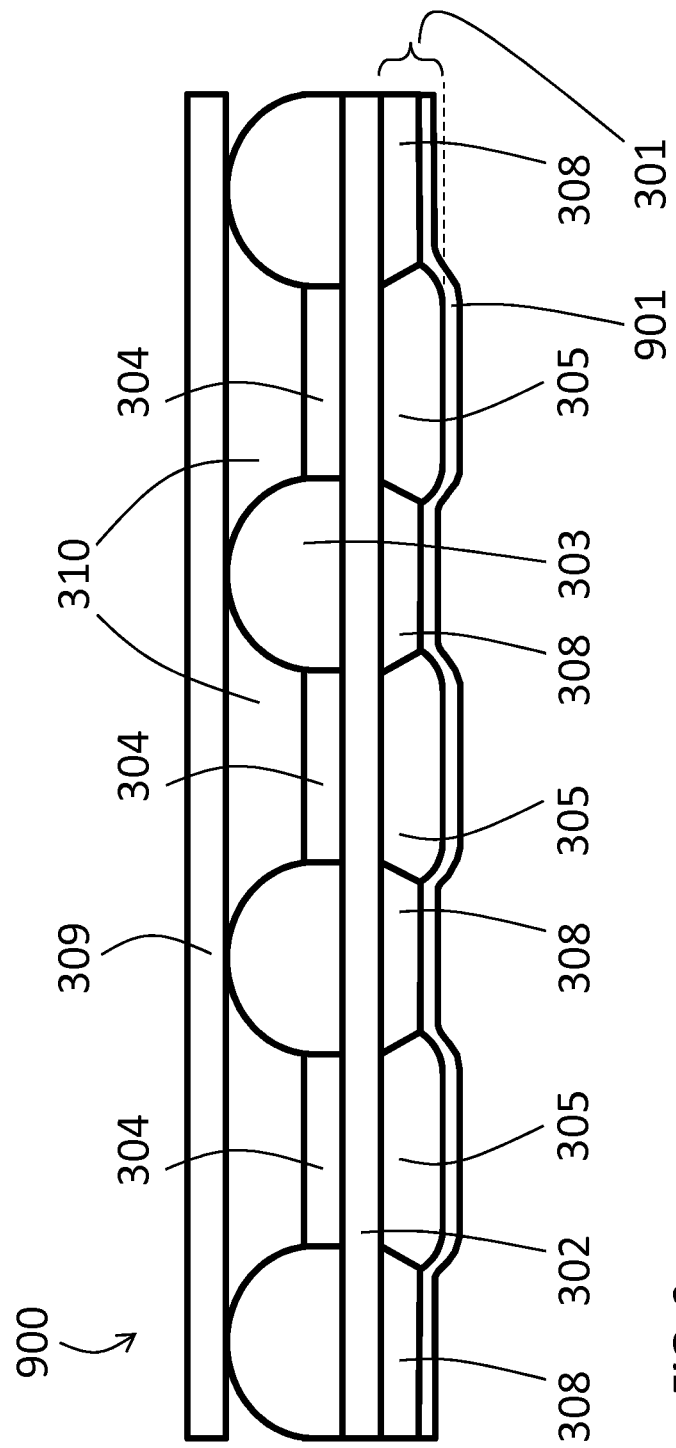
FIG. 9 is a diagram of a fourth embodiment of the present invention having thin film encapsulation below local glass seals.

FIG. 9 shows a fourth embodiment of the present invention. Lower substrate 301, intermediate layer structure 302, banks 303, electro-optical elements 304, and local seals 305 are substantially similar to the corresponding elements described in context of FIG. 3 above, and may be manufactured by similar processes. The fourth embodiment adds a thin film encapsulation structure 901 below the local seals 305 and matrix 308. The thin film encapsulation structure 901 may be a single layer, or may be a composite of multiple layers. Panel 900 may be part of a display product, a lighting product, or any other product including but not limited to those described above in context of panels 300 and 400.

Some embodiments may include additional upper elements between the local seal 305 and the thin film encapsulation structure 901. Such elements may variously include one or more of: a protection layer, color filters, a black matrix, desiccant, and a scattering layer, according to the needs and design of a particular embodiment. In some embodiments, one or more of these additional upper elements may extend beyond a single local seal 305 and therefore form part of the encapsulation surrounding a corresponding electro-optical element 304.

Panel 900 can be manufactured by a process very similar to that described above using FIGS. 6A-6F. An additional step is performed after the step of FIG. 6E, to laminate a conforming thin film encapsulation structure onto the bottom surface of matrix 308 and local encapsulation seals 305. This step can be performed after removal of dam 603, or it can be performed without removal of dam 603.

Figure 10:
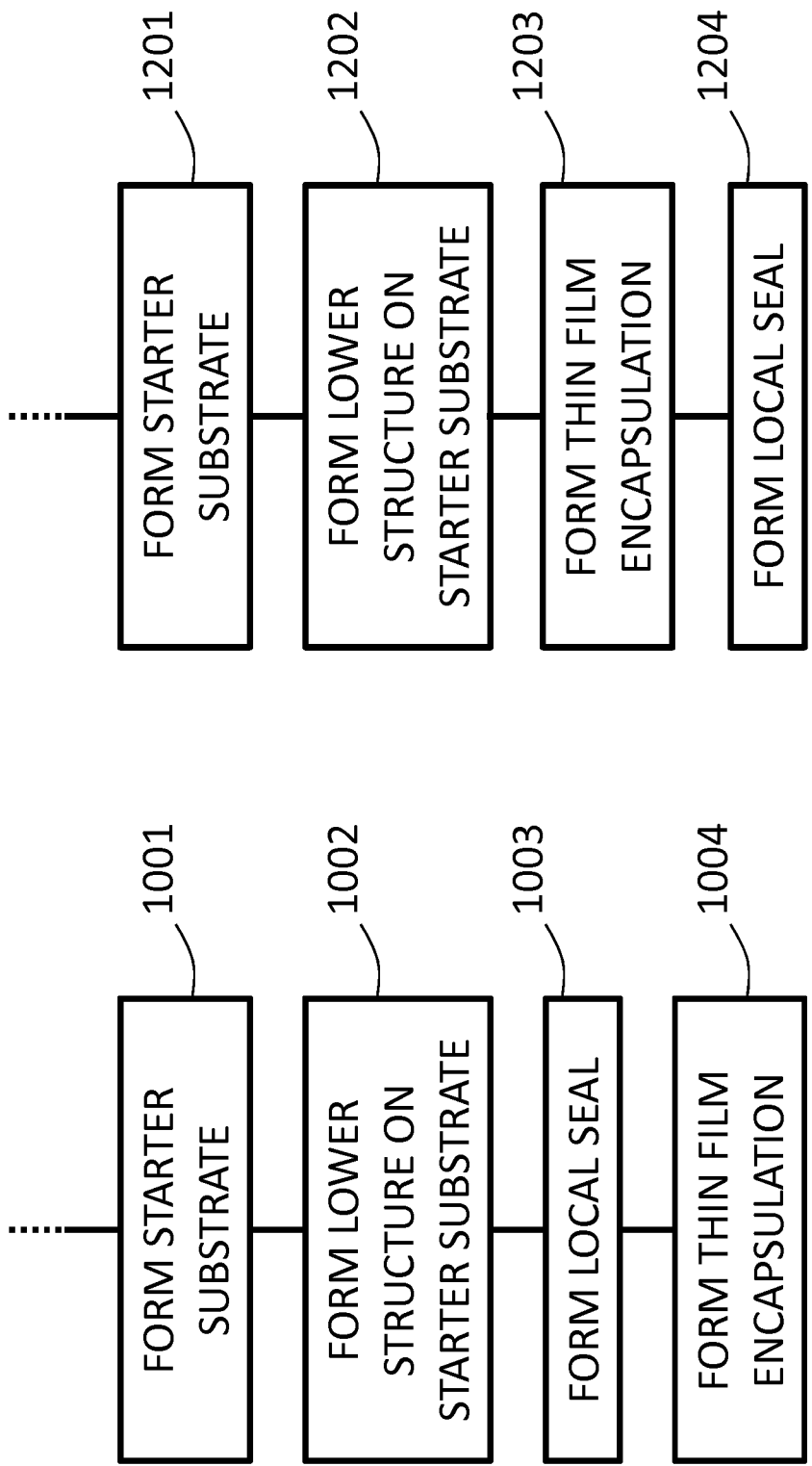
FIG. 10 is a flow chart showing process steps for manufacture of the fourth embodiment.

FIG. 10 is a flow chart showing some manufacturing steps for a panel according to an embodiment of FIG. 9. At step 1001, a starter substrate is formed. At step 1002, a lower structure is formed over the starter substrate. At step 1003 local seals 305 are formed. Step 1003 may be performed by a variety of methods including but not limited to those described in context of FIGS. 6-7 above. At step 1004, thin film encapsulation structure 901 is formed.

Not shown in FIG. 10 are the steps of forming electro-optical elements 304, an upper structure, and providing top encapsulation with upper substrate 309. The step of forming electro-optical elements can be performed between steps 1002 and 1003, in accordance with the embodiment of FIGS. 6A-6F, which show manufacture of local seals 305 with electro-optical elements 304 already in place. Alternatively, the step of forming the electro-optical elements 304 can be performed after step 1003, in accordance with FIG. 7C, where the process of forming local seals 305 is being completed prior to fabrication of electro-optical elements 304. Likewise, the step of providing top encapsulation can be performed before or after step 1004. A step of forming an upper structure can be performed at any point after fabrication of electro-optical elements and before provision of top encapsulation.

Figure 13A:
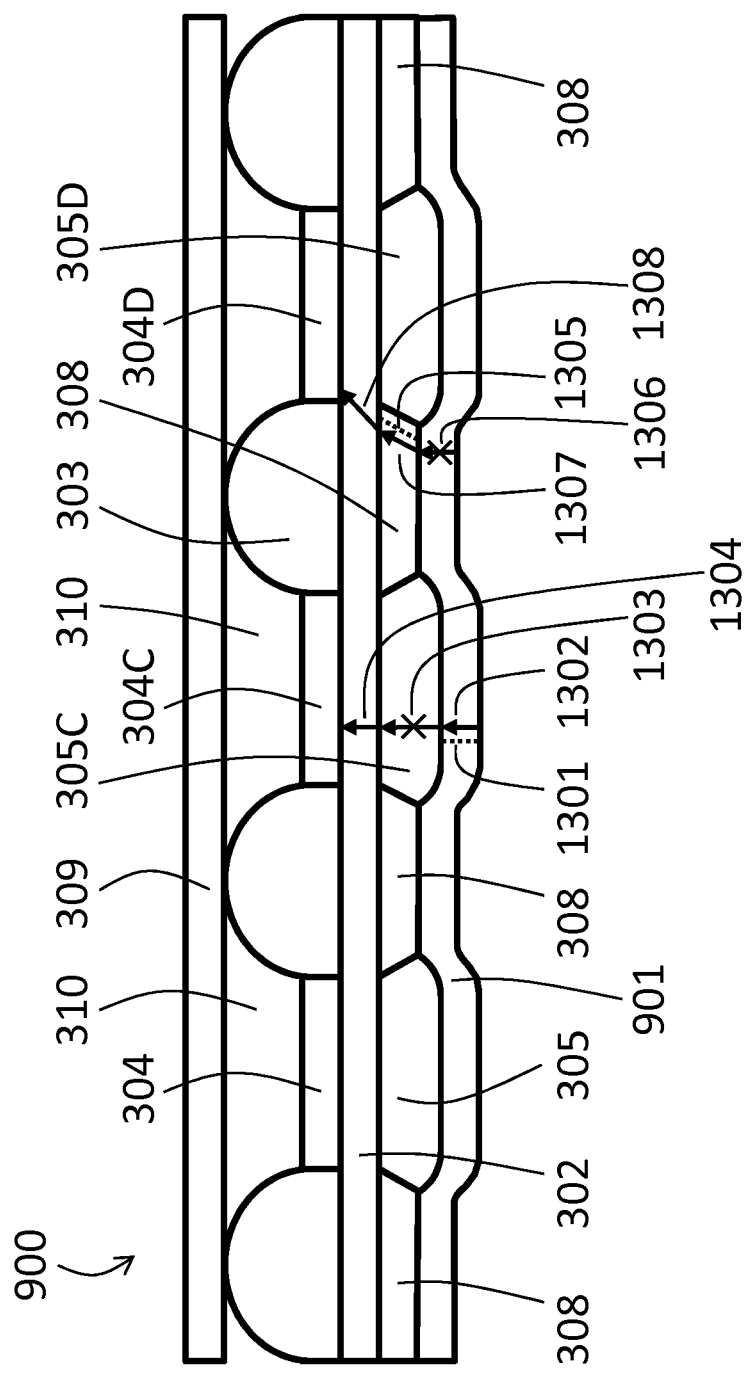
FIGS. 13A-13B are diagrams of ingress paths that are blocked by a combination of a thin film encapsulation structure and a local glass seal.

FIG. 13A shows how the combination of a local seal 305C, 305D with a thin film encapsulation structure 901 provides advantages. Panel 900 has structure substantially similar to that shown in FIG. 9. In this figure, dotted line 1301 denotes a pinhole defect in the thin film encapsulation structure 901. Were it not for the local seal 305C, oxygen, moisture, and/or other detrimental materials could penetrate through pinhole defect 1301 and damage the electro-optical element 304C above. In the present embodiment, penetration through the thin film encapsulation structure 901 can proceed as shown by arrow 1302. However seal 305C prevents further penetration as indicated by the X on arrow 1303. Arrow 1304 represents permeation through lower structure 302. In flexible panels lower structure 302 may comprise a flexible material, such as a polymer, that by itself provides inadequate resistance to penetration of oxygen, moisture, and/or other detrimental materials. Consequently there is no X on arrow 1304.

Turning now to electro-optical element 304D, dotted line 1305 represents a pinhole path for migration of moisture, oxygen, and/or other detrimental materials through matrix 308. Alternatively, such a pinhole path may exist at the interface between matrix 308 and local seal 305D. Were it not for thin film encapsulation structure 901, moisture, oxygen, and/or other detrimental materials could penetrate through the pinhole path 1305 and lower structure 302, as shown by arrows 1307 and 1308 respectively, to contaminate the sensitive electro-optical element 304D. In the present embodiment, however, the thin film encapsulation structure 901 blocks this path, as shown by the X over arrow 1306, and degradation of electro-optical element 304D is prevented.

Figure 11:
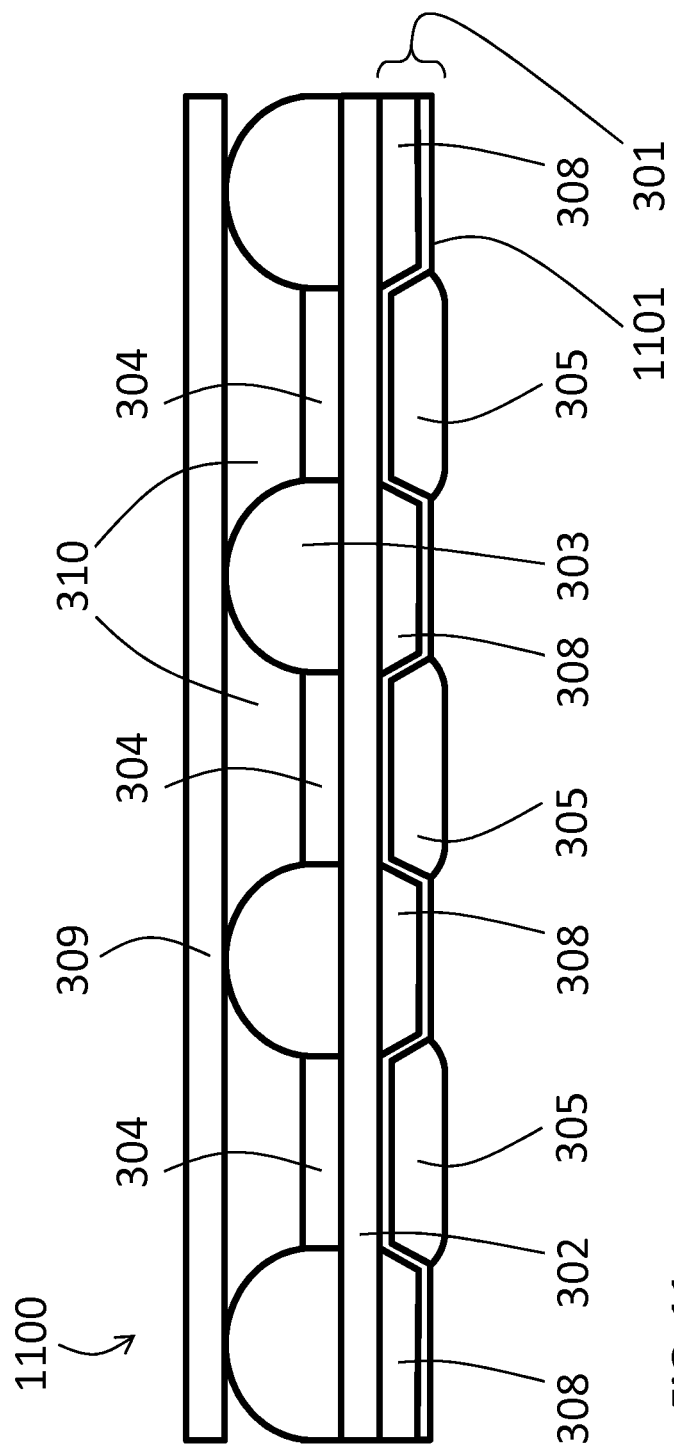
FIG. 11 is a diagram of a fifth embodiment of the present invention having local glass seals below a thin film encapsulation layer.

FIG. 11 shows a fifth embodiment of the present invention. Like the fourth embodiment described above in context of FIG. 9, the fifth embodiment adds a thin film encapsulation structure 1101 to the basic structure described in context of FIG. 3. However, in this case, the thin film encapsulation structure 1101 lies over the local seal 305. In other respects thin film encapsulation structure 1101 is similar to previously described thin film encapsulation structure 901. Otherwise, panel 1100 is substantially similar to panel 900.

FIG. 24A-24G depict sequential manufacture of the local seals of an embodiment of this invention similar to the embodiment of FIG. 11. For the sake of clarity, FIGS. 24A-24G depict formation of a single local seal; it will be evident to the skilled practitioner that each step can be replicated for each of a plurality of local seals. Unlike FIGS. 6A-6F, FIGS. 24A-24G show formation of a local seal prior to fabrication of any electro-optical elements above lower structure 302, and also before formation of banks 303. Several other details of FIGS. 24A-24G and their associated steps are similar to those of FIGS. 6A-6F, and are not repeated here.

Figure 24A:
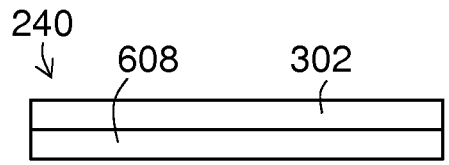
FIGS. 24A-24G are diagrams of an electroluminescent panel at different stages of formation of local glass seals.
Figure 24E:
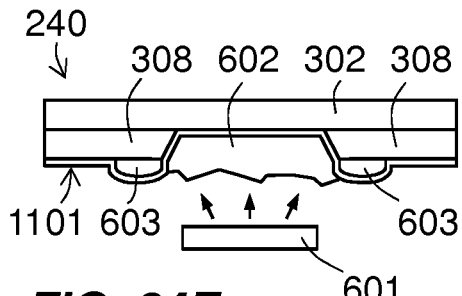
Figure 24B:
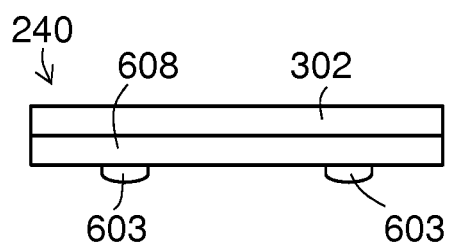
Figure 24F:
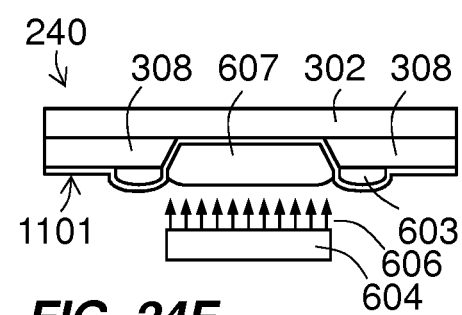
Figure 24C:
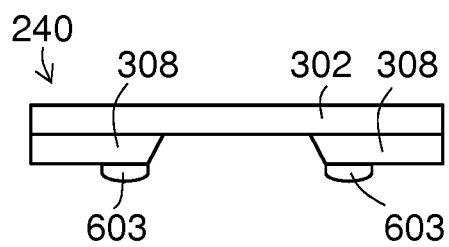
Figure 24G:
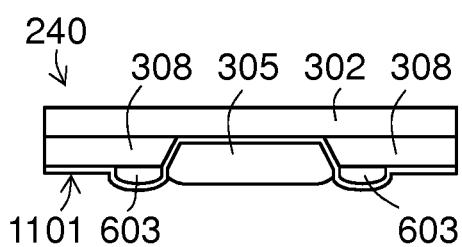
Figure 24D:
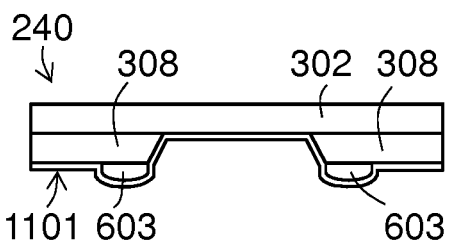

FIG. 24A shows an unfinished panel 240 prior to formation of any local seal. Starter substrate 608 and lower structure 302 have been assembled. FIG. 24B shows an annular dam 603 formed around a target area for a window. FIG. 24C shows a cutout having been etched in the target area for seal formation. Due to etching of one or more cutouts, starter substrate 608 has become matrix 308. FIG. 24D shows thin film encapsulation structure 1101 formed on the lower surface of the unfinished panel 240. FIG. 24E shows deposition of a glass powder paste 602 into the partially filled cutout by a nozzle assembly 601. FIG. 24F shows curing of the glass powder paste by irradiation 606 from a laser beam source 604. At this stage, the glass powder paste 602 has melted, the carrier material of the glass powder paste has volatilized, and the glass powder particles have fused into a liquid mass 607 that is adhered to thin film encapsulation structure 1101 in the cutout region. Finally, FIG. 24G shows the cured local glass seal 305 after it has cooled and hardened. In this embodiment, dam 603 is not removed. The skilled practitioner will understand that the location of each local seal is chosen according to a pattern of electro-optical elements in a finished product formed from unfinished panel 240. In some embodiments, exactly one electro-optical element is formed directly above each local seal 305. In other embodiments, a plurality of electro-optical elements may share a single local seal 305.

It will be recognized that there are pathways for permeation that go through encapsulation structure 1101 but do not pass through any of local seals 305. However, as with other figures, FIG. 11 is not to scale. In particular, the thicknesses of the features shown are greatly magnified in comparison to the transverse extents. Therefore, a pathway through encapsulation structure 1101 that bypasses 305 is very narrow and relatively long. By comparison, in the absence of local seals 305, a pathway directly through encapsulation structure 1101 and into the bottom of electro-optical element 304 would be very wide (essentially the full-width of element of 304) and very short (simply the thickness of encapsulation structure 1101). By blocking a short, wide permeation pathway, the local seals 305 thus greatly improve the encapsulation of panel 1100.

Figure 19:
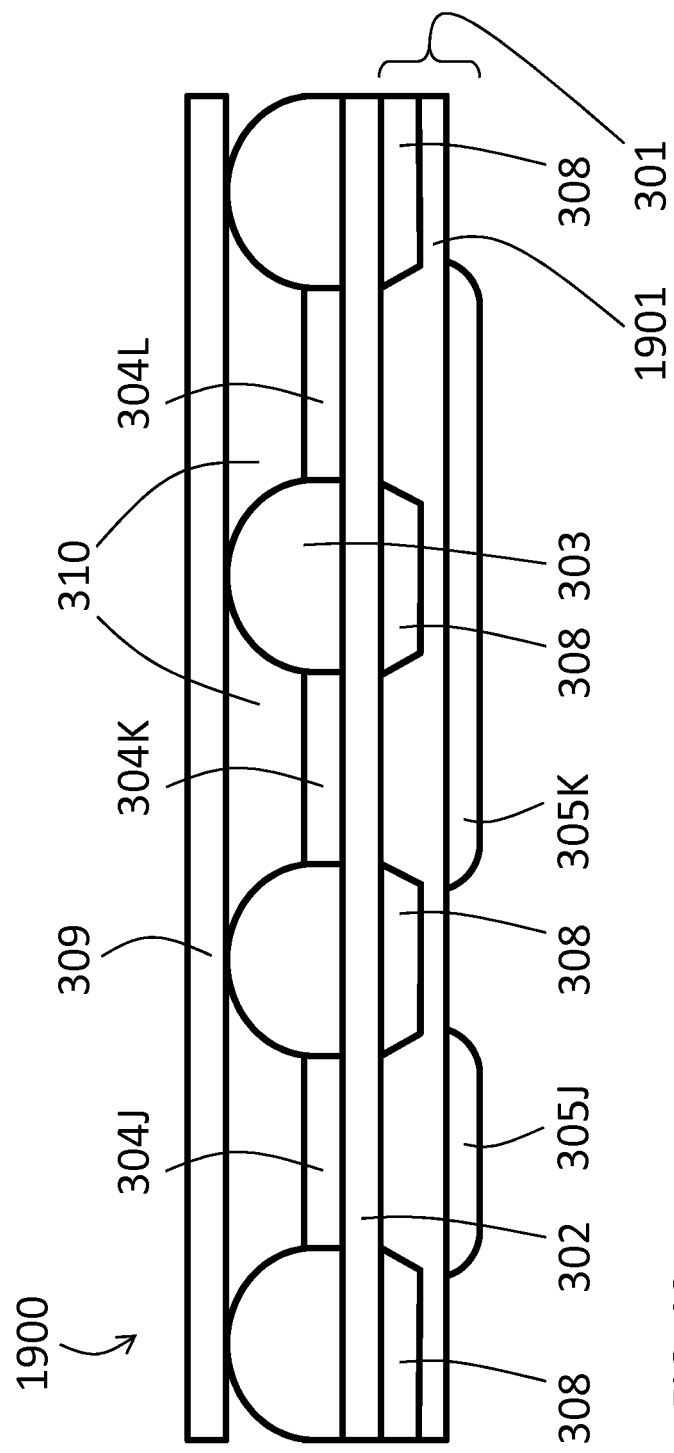
FIG. 19 is a diagram of a sixth embodiment having local glass seals below a thin film encapsulation layer.

It is not necessary for the local seal 305 to lie within a recess below electro-optical element 304. FIG. 19 shows panel 1900, which is a sixth embodiment. As in FIG. 11, thin film encapsulation structure 1901 is formed below elements 304J, 304K, 304L, and lies above local seals 305J, 305K. However, in the sixth embodiment, structure 1901 acts as a planarization layer, and the locals seals 305J, 305K are formed substantially or entirely below structure 1901, as shown. Local seal 305J is shown formed below a single electro-optical element 304J. Alternatively, 305K is shown formed below a group of electro-optical elements 304K, 304L. In other respects, panel 1900 is substantially similar to panel 1100.

FIG. 12 is a flow chart showing some manufacturing steps for a panel according to an embodiment of FIG. 11. At step 1201, a starter substrate is formed. At step 1202, a lower structure is formed over the starter substrate. At step 1203, thin film encapsulation structure 1101 is formed. At step 1204, local seals 305 are formed. Step 1204 may be performed by a variety of methods including but not limited to those described in context of FIGS. 6-7 above.

As discussed above for FIG. 10, the steps of forming electro-optical elements 304, an upper structure, and providing top encapsulation with upper substrate 309 are also not shown in FIG. 12. Further, it will be readily understood that each step shown in FIGS. 10 and 12 may in practice involve a plurality of smaller steps.

Figure 13B:
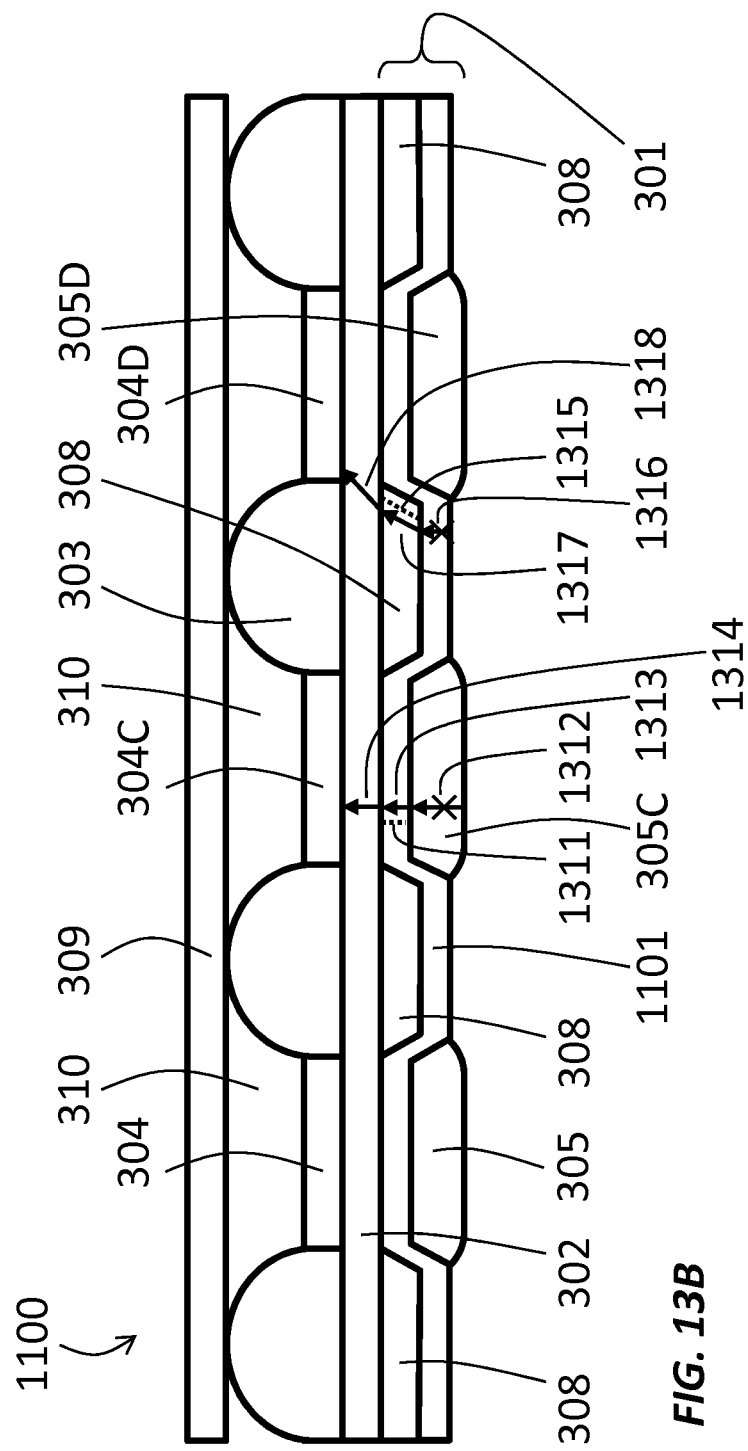

FIG. 13B shows how the combination of a local seal 305 with a thin film encapsulation structure 1101 provides advantages. Panel 1100 has structure substantially similar to that shown in FIG. 11. In this figure, dotted line 1311 denotes a pinhole defect in the thin film encapsulation structure 1101. Were it not for the local seal 305C, oxygen, moisture, and/or other detrimental materials could penetrate through pinhole defect 1311, as shown by arrow 1313, and damage the electro-optical element 304B above. However, in the present embodiment, seal 305B prevents access to the pinhole defect, as shown by the X on arrow 1312. Arrow 1314 represents permeation through lower structure 302. In flexible panels, lower structure 302 may comprise a flexible material, such as a polymer, that by itself provides inadequate resistance to penetration of oxygen, moisture, and/or other detrimental materials. Consequently there is no X on arrow 1314.

Turning now to electro-optical element 304D, dotted line 1315 represents a pinhole path for migration of moisture, oxygen, and/or other detrimental materials through matrix 308. Were it not for thin film encapsulation structure 1101, moisture, oxygen, and/or other detrimental materials could penetrate through the pinhole path 1315 and lower structure 302, as shown by arrows 1317 and 1318 respectively, to contaminate the sensitive electro-optical element 304D. In the present embodiment, however, the thin film encapsulation structure 1101 blocks this path, as shown by the X over arrow 1316, and degradation of electro-optical element 304D is prevented.

Optical Functions of Local Seals

In preferred embodiments, light emerges from electro-optical elements through the corresponding local seals. As such, optical properties of the local seals can affect the emitted light. Therefore it may be advantageous to customize optical properties of the local seals to achieve desired properties of emitted light. Optical functions that can be designed into a local seal include but are not limited to a lens function, a filter function, and a scattering function.

Figure 14A:
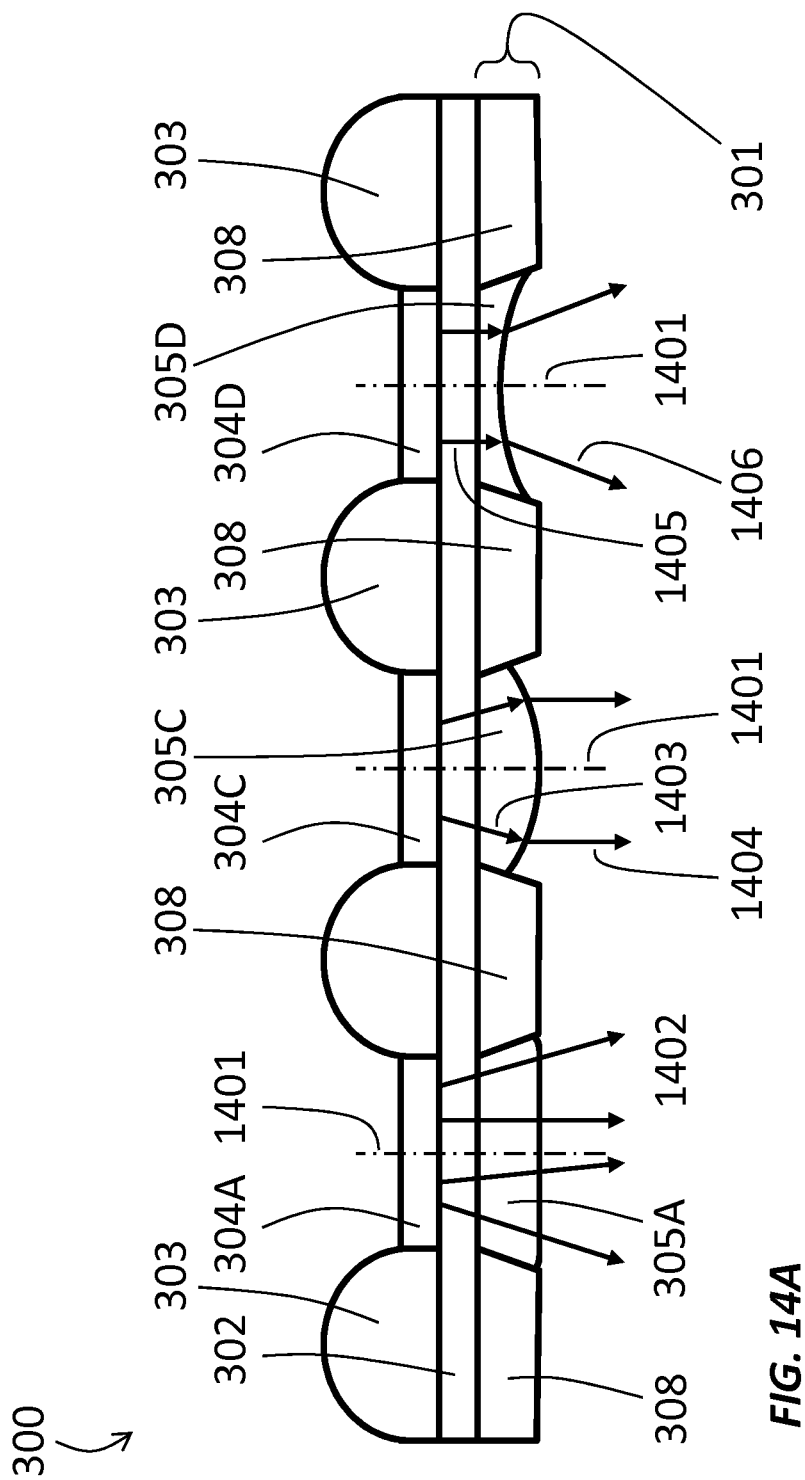
FIGS. 14A-14B are diagrams of lens functions that may be performed by a local glass seal.

FIG. 14A shows a panel 300, which in most respects is unchanged from the panel previously described in context of FIG. 3. For the sake of clarity, some elements such as encapsulating upper substrate are not shown. In this figure, local seals 305A, 305C, 305D lie beneath electro-optical elements 304A, 304C, 304D respectively. Local seals 305A, 305C, 305D are shown with different exemplary shapes, whereby different lens functions can be achieved. Local seal 305A has top and bottom surfaces that are substantially plane and parallel, ray 1402 exits the bottom surface of local seal 305A at the same angle that it would have in the absence of local seal 305A. Thus, no lens function is obtained, which may be desirable for some products. Note that there may be a small lateral shift of ray 1402 with respect to its direction of propagation, this is not consequential to the lens function and is not shown for ray 1402.

Turning now to local seal 305C, it can be seen to have a plano-convex shape, and an optical axis 1401. In the usual case where the medium (such as glass) inside local seal 305C has a higher refractive index than the medium (such as air) below the convex lower surface of the local seal 305C, the plano-convex local seal 305C acts as a converging lens. In comparison to ray 1403 incident at the top surface of local seal 305C, the emergent ray 1404 is bent away from the normal to the surface, which produces the converging effect shown. The converging effect may be beneficial in display embodiments with regard to privacy. It will be recognized that such a lens function is not limited to display embodiments. Particularly, the converging effect may be beneficial in lighting embodiments where spotlight illumination is desired.

Local seal 305D is seen to have a plano-concave shape. In the usual case where the medium (such as glass) inside local seal 305D has a higher refractive index than the medium (such as air) below the convex upper surface of the local seal 305D, the plano-concave local seal 305D acts as a diverging lens. In comparison to ray 1405 incident at the top surface of local seal 305D, the emergent ray 1406 is bent away from the normal to the surface, which for the concave surface produces the diverging effect shown. The diverging effect may be beneficial in display embodiments where wide viewing angle is desired. The diverging effect may be beneficial in lighting embodiments where omni-directional illumination is sought.

Figure 14B:
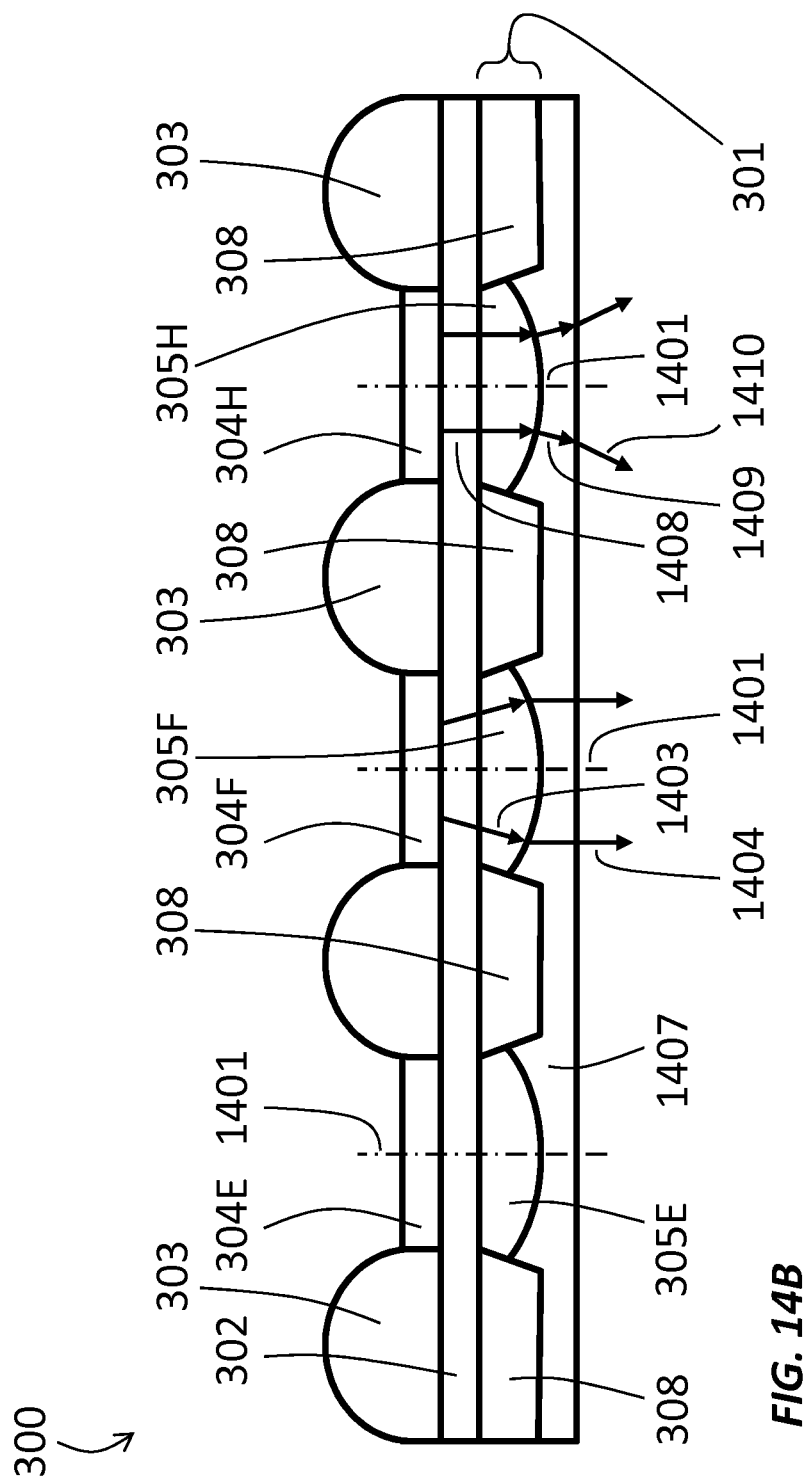

FIG. 14B shows an alternate construction for lensed embodiments, in which plano-convex local seals 305 are covered with a planarization layer 1407. In this figure, local seals 305E, 305F, 305H lie beneath electro-optical elements 304E, 304F, 304H respectively. The diagram for local seal 305F shows a case where the refractive index of the local seal 305F is greater than the refractive index of the planarization layer 1407. In this situation, local seal 305F provides a converging effect substantially similar to the converging effect seen for local seal 305B in FIG. 14A. In contrast, the diagram for local seal 305H shows a case where the refractive index of the planarization layer is greater than the refractive index of the local seal 305H. In this case, the diverging effect of a plano-concave lens defined by the top and bottom surfaces of the planarization layer is stronger than the converging effect of the plano-convex lens defined by the top and bottom surfaces of the local seal 305H. In terms of rays, ray 1408 is incident on the curved lower surface of local seal 305H, and intermediate ray 1409 is bent closer to the normal to this curved surface compared to ray 1408. Ray 1409 is subsequently incident on the plane lower surface of planarization layer 1407, and emergent ray 1410 is bent away from the normal to this plane surface, compared to ray 1409. The net effect for this configuration is a diverging effect as shown.

Figure 15:
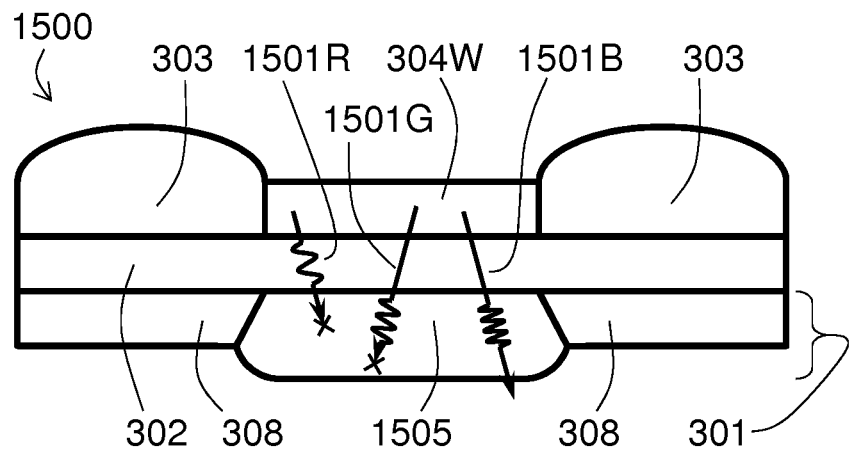
FIG. 15 is a diagram of a local glass seal acting as an optical filter.

FIG. 15 shows an embodiment of the present invention in which local seal 1505 is impregnated with pigment particles to achieve an optical filter function. Panel 1500 may be part of any of a variety of product types among those described above, and in particular may be part of a flat panel display in some preferred embodiments and an illumination source in other preferred embodiments. As shown in FIG. 15, 304W is a white light emitting element, which may be fabricated as a tandem OLED structure. Other elements 301-303 and 308 shown in FIG. 15 are substantially similar to those described above in context of FIG. 3. Red light ray 1501R and green light ray 1501G are absorbed by pigment particles, as indicated by the respective X marks on which 1501R and 1501G terminate, while blue light ray 1501B emerges without absorption. Thus, a blue filter function is achieved, which may be desirable to obtain a blue pixel in a flat panel display built using a uniform white electroluminescent structure. Of course, red and green pixels may similarly be obtained by impregnating the local seal 1505 with suitable pigments or mixtures of pigments.

The filtering function may also be desirable in lighting products. As an example, a uniform white electroluminescent structure may be built using blue and yellow-orange emissive layers. Filtering of the electroluminescent light can be used to adjust the color temperature, or to otherwise tune the emergent emission spectrum for more pleasant appearance. In particular, the same electroluminescent formulation can be used to produce lighting panels of different color temperature, by varying the filtering properties of local seals 1505.

Figure 16:
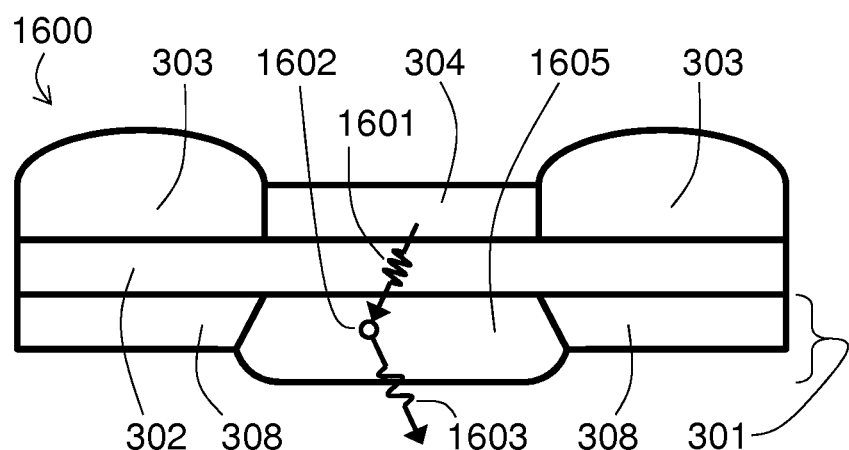
FIG. 16 is a diagram of a local glass seal performing a color shift function.

Closely related to filtering is the optical color shift function. FIG. 16 shows an embodiment of the present invention in which local seal 1605 is impregnated with particles of a fluorescent or other color shifting material, to achieve an optical color shift function. Panel 1600 may be part of any of a variety of product types among those described above, and in particular may be an illumination source in preferred embodiments. As shown in FIG. 16, 304 is a light-emitting element. The other elements 301-303 and 308 shown in FIG. 16 are substantially similar to those described above in context of FIG. 3. Light ray 1601 excites a fluorescent material particle 1602. The re-radiated ray 1603 emerges at a longer wavelength. Thus, a color shift function is achieved, which may be desirable to convert blue light to warmer red, orange, or yellow light, decreasing the color temperature of a lighting panel 1600 to produce a more pleasant hue.

Figure 17:
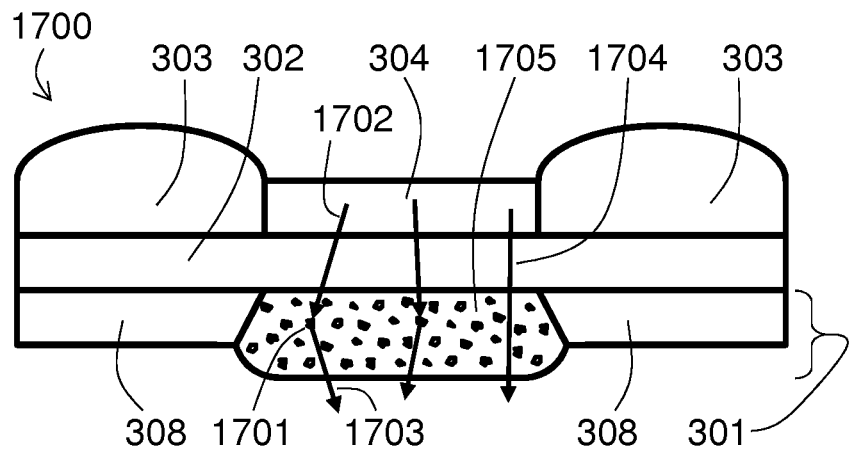
FIG. 17 is a diagram of a local glass seal performing a scattering function.

Finally, FIG. 17 shows an embodiment in which local seal 1705 incorporates scattering particles 1701 and performs a scattering function. Scattering is recognized as important for increasing light extraction efficiency for display and lighting products alike. Panel 1700 may be part of any of a variety of product types among those described above, and in particular may be a display panel in some preferred embodiments and a lighting panel in other preferred embodiments. As shown in FIG. 17, 304 is a light-emitting element, which may be fabricated as an OLED. The other elements 301-303 and 308 shown in FIG. 17 are substantially similar to those described above in context of FIG. 3. Scattering particles 1701 which may be provided in the form of a powder of a refractory material mixed with a glass powder paste or suspension during deposition of local seal material, as shown for example in FIG. 6B. A wide variety of inorganic and metal materials are available and suitable for use as a refractory scattering material, in combination with a low melting temperature glass. Some well-known materials are aluminum oxide, zinc oxide, and silicon. During fusing of the glass material, as shown for example in FIG. 6C or FIG. 7A-7C, the refractory material powder particles remain in situ, and can act as scattering particles 1701 in the finished panel 1700. Light ray 1702 is scattered by a scattering particle 1701 and emerges at a different angle as shown by ray 1703. Other light rays, such as 1704, may emerge without interacting with any scattering particles.

Pre-Formed Encapsulation Substrate

Figure 25:
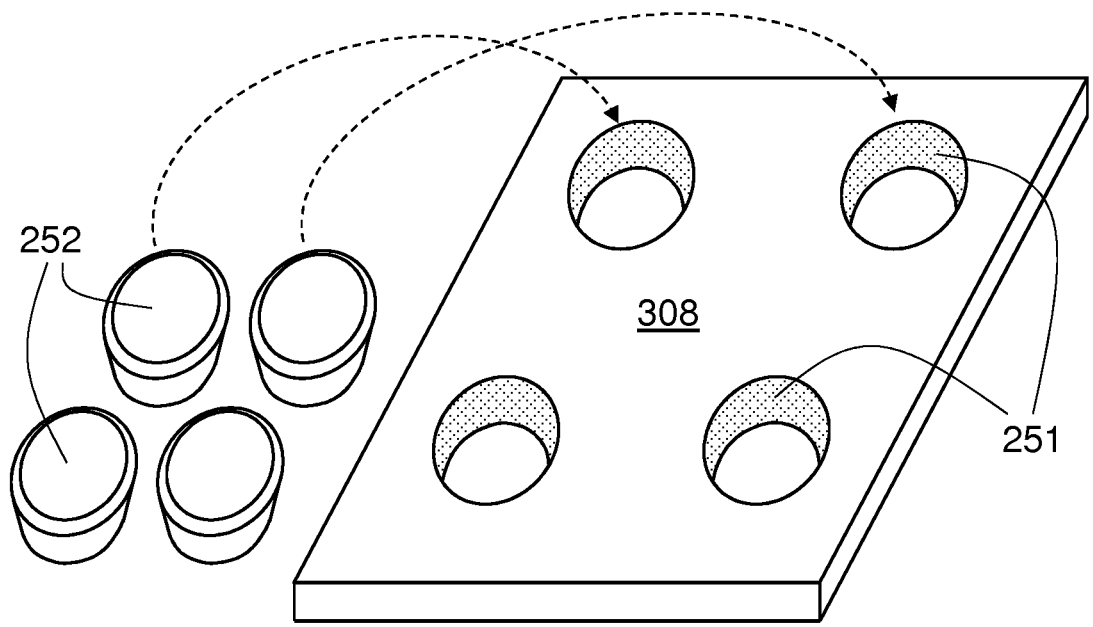
FIG. 25 is a diagram showing components of an embodiment of a pre-formed encapsulation substrate, at an intermediate stage of manufacture.
Figure 26:
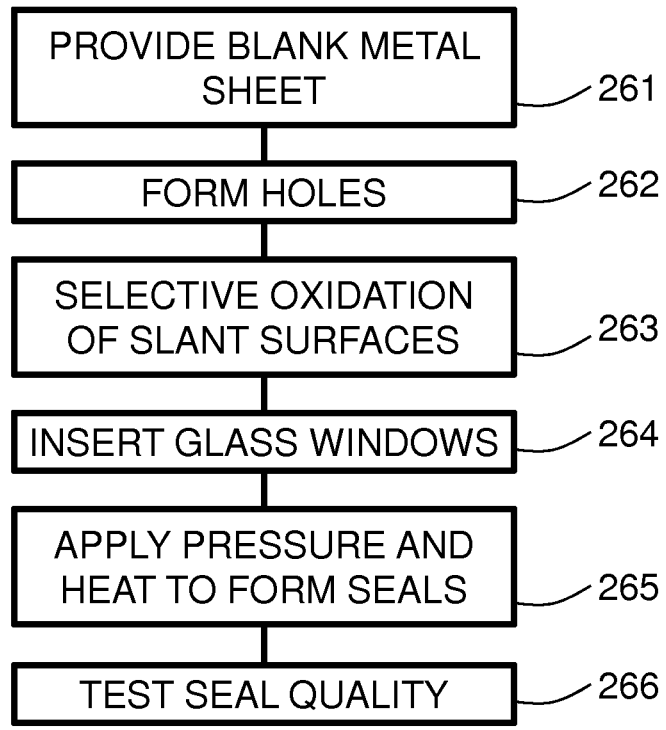
FIG. 26 is a flow chart showing process steps for manufacture of a pre-formed encapsulation substrate.

FIGS. 25-28 illustrate other approaches to forming lower encapsulation substrate 301. In FIG. 25, matrix 308 is prepared with metal oxide coating 251 on slant surfaces of each opening. Pre-formed glass windows 252 are placed in respective openings, as indicated by dashed arrows. Pressure and heat may then be applied to form hermetic glass-to-metal local seals in each opening. The corresponding steps are illustrated in FIG. 26. At step 261, a blank metal sheet is provided. At step 262, a plurality of holes is formed. At step 263, the slant surfaces of the holes are selectively oxidized. At step 264, glass windows are inserted into respective holes. At step 265, pressure and heat are applied to fuse the windows to the metal matrix. At step 266, the encapsulation substrate is attached to a leak testing apparatus and the quality of seals is checked.

Figure 27A:
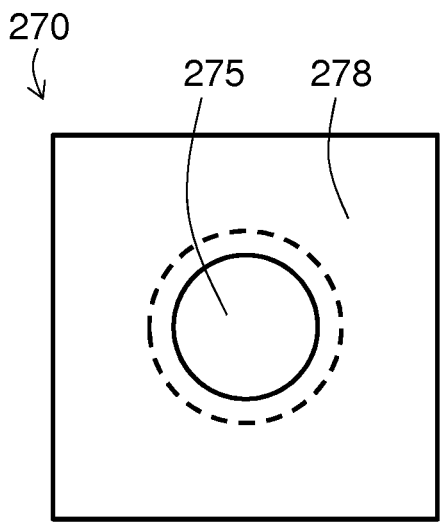
FIGS. 27A-27C are diagrams showing views of a single window element, and an embodiment of a pre-formed encapsulation substrate formed therefrom.
Figure 27B:
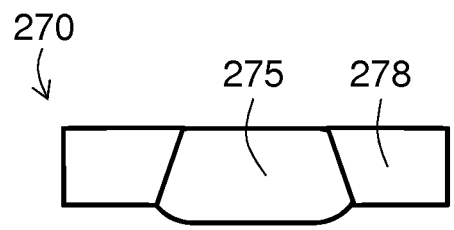
Figure 27C:
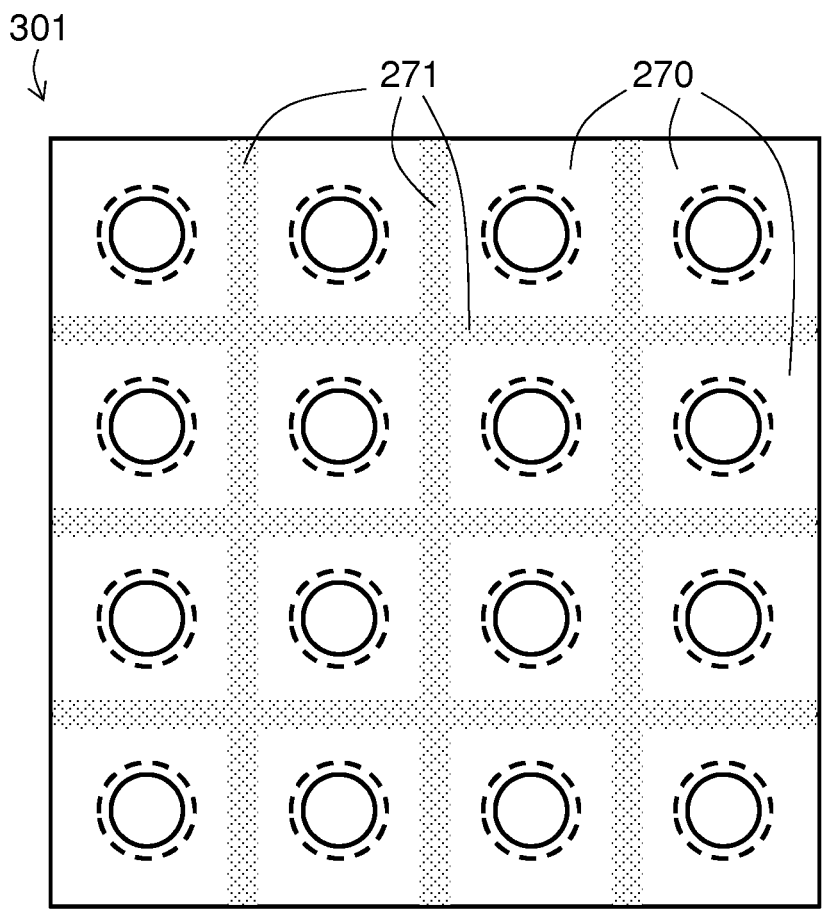

FIG. 27A-27B show top and sectional views, respectively, of a pre-formed single glass-in-metal window element 270. The element 270 comprises a glass window 275 sealed in a metal plate 278. FIG. 27C shows a plurality of window elements 270 assembled together with joints 271 to form lower encapsulation substrate 301. Joints may be, for example, weld or solder joints. In FIG. 28A, the preformed elements 280 are strips having multiple glass windows in a metal matrix 288. A plurality of strips may be joined, by weld or solder joints 281, to form a complete encapsulation substrate 301, as shown in FIG. 28B.

Figure 29A:
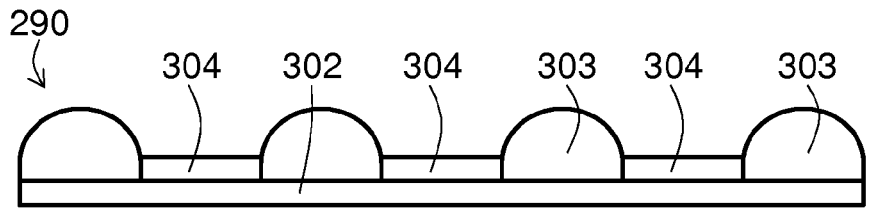
FIGS. 29A-29C are diagrams showing views of an electro-optical array assembly, a separate lower encapsulation substrate, and a panel assembled therefrom.
Figure 29B:
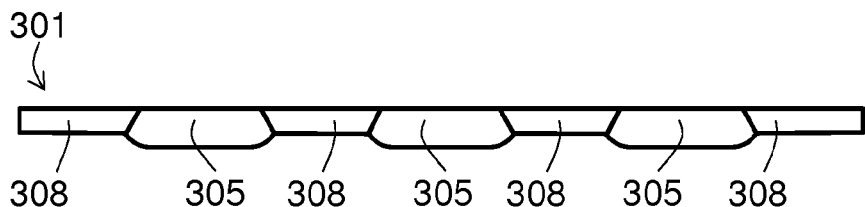
Figure 29C:
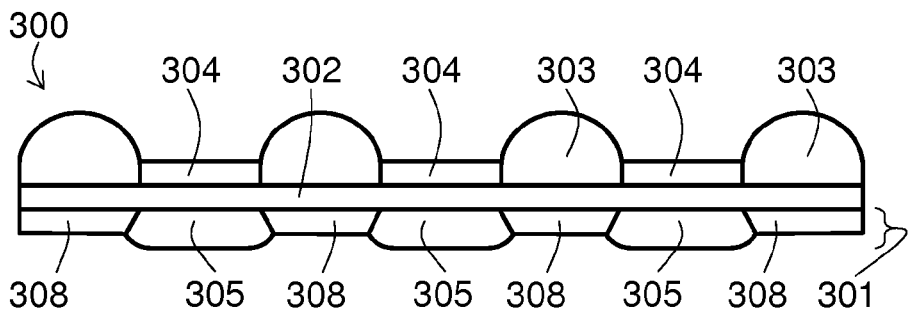
Figure 30:
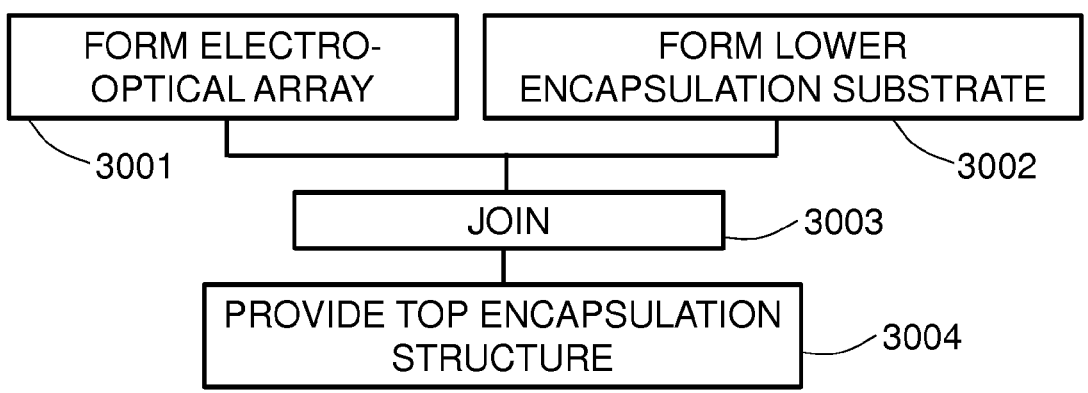
FIG. 30 is a flow chart showing process steps for manufacture of a panel from a pre-formed encapsulation substrate.

FIG. 29A shows an assembly 290 comprising an array of active electro-optical elements 304 formed on flexible lower structure 302, acting as a substrate. FIG. 29B shows lower encapsulation substrate 301, formed separately. FIG. 29C shows assembly 290 joined with lower encapsulation substrate 301 to form panel 300. The corresponding steps are shown in FIG. 30. At step 3001, electro-optical array 290 is formed on lower structure 302. At step 3002, lower encapsulation substrate is formed. In some embodiments, step 3002 is performed according to the steps of FIG. 26. At step 3003, assembly 290 is joined to the lower encapsulation substrate 301. At step 3004, a top encapsulation structure is assembled onto panel 300. In some embodiments, the top encapsulation structure may be formed as an integral unit and attached with, for example, a perimeter seal. In other embodiments, the top encapsulation structure may be formed in situ above the electro-optical array 290.

Top and Bottom Local Seals

Figure 31:
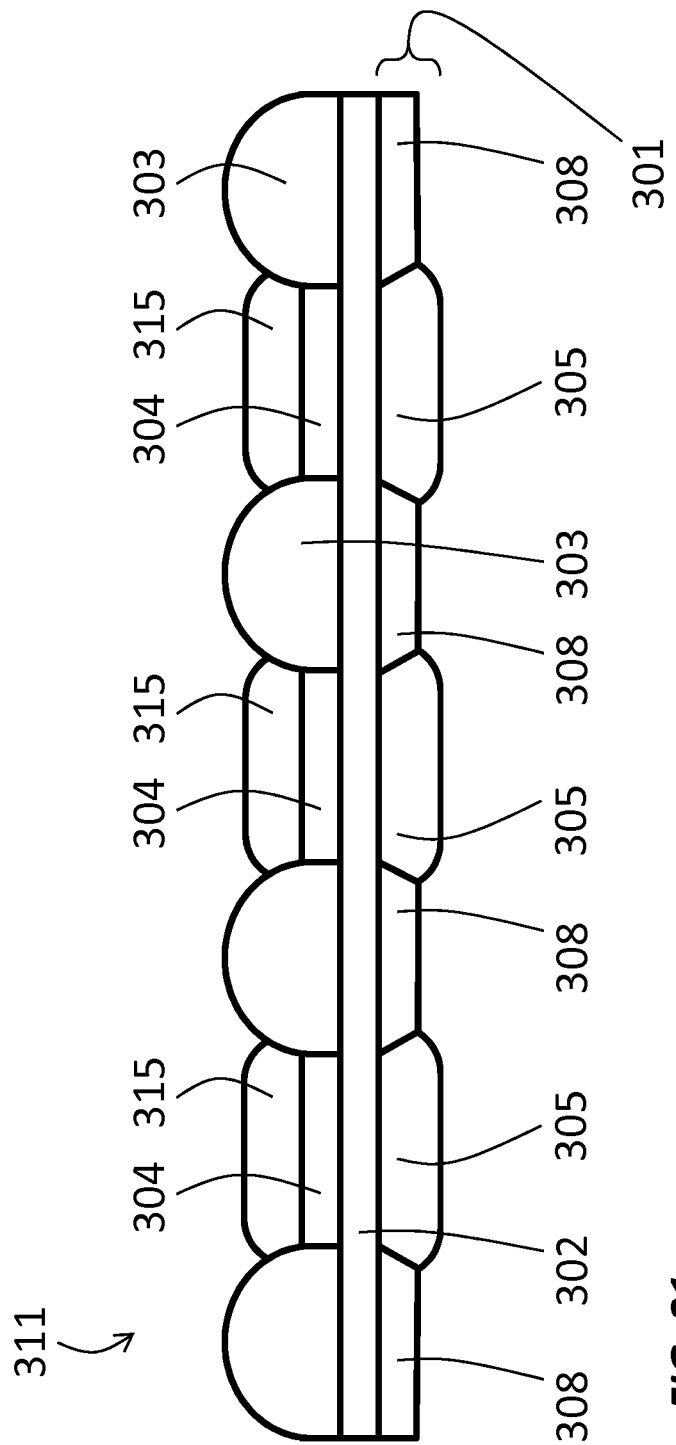
FIG. 31 is a diagram showing an embodiment of the invention having transparent local seals both above and below an array of electro-optical elements.

FIG. 31 shows an embodiment of the invention having a lower encapsulation substrate 301 with local encapsulation seals 305 as described above in context of FIG. 3. Additionally, each electro-optical element 304 also has a local seal 315 above it, as described in parent publication U.S. 2015/0034934 A1. The skilled practitioner will recognize that various combinations of local seals described in this disclosure and the parent publication may also be used.

In some embodiments, each electro-optical element 304 is an emissive element, and panel 311 may be a display product or a lighting product. Such embodiments advantageously provide display and/or illumination from both sides of panel 311. In some embodiments, having clear local seals 315, 305 on both sides of electro-optical elements 304 allows panel 311 to be at least partially transparent when the electro-optical elements 304 are off. Accordingly, panel 311 may be a transparent display, a backlit display, a transparent lighting panel, or a window having display, lighting, and/or signage functions in various embodiments.

In other embodiments, electro-optical elements 304 perform light control functions, so that light incident on panel 311 from the top side, is controlled by elements 304 and conditioned light is emergent from the bottom side of panel 311. Of course, similar operation is possible with light incident on the bottom surface of panel 311 and conditioned light emergent from the top surface. In some embodiments, elements 304 may incorporate a controllable mirror function, so that conditioned light emerges from the same surface at which incident light entered panel 311. According to the specific mirror properties of elements 304, light that is not reflected back through the incident surface may propagate through elements 304 and emerge from the opposite surface. Other light-control properties for elements 304 may include (a) transitions from specular to diffuse reflection, (b) transitions between two or more of: reflective, transparent, translucent, and absorptive states (c) color transitions, (d) polarization transition.

Electro-optical elements may additionally or alternatively incorporate light sensing functions. For example, a smart window may be controlled so that elements that are in direct sunlight are rendered partially or wholly light-blocking and act as window shades. Elements that are in shadow, such as from neighboring trees or buildings, may be kept at a higher degree of light transmission, including up to substantially 100% transmission, either translucent or transparent.

Such embodiments enable a wide range of applications, including smart windows for buildings and vehicles, signage, and heads-up displays.

While specific embodiments have been described in detail in the foregoing detailed description and illustrated in the accompanying drawings, it will be appreciated by those skilled in the art that various modifications and alternatives to those details could be developed in light of the overall teachings of the disclosure and the broad inventive concepts thereof. It is understood, therefore, that the scope of the present invention is not limited to the particular examples and implementations disclosed herein, but is intended to cover modifications within the spirit and scope thereof as defined by the appended claims and any and all equivalents thereof.

All U. S. patents and patent application publications referenced above are hereby incorporated by reference as if set forth in full.

I claim:

1. A method of manufacturing local encapsulation seals in a substrate, the method comprising:
   a) providing a plurality of openings in a starter substrate;
   b) depositing a first drop of a glass powder suspension in a first opening using an inkjet dispenser;
   c) depositing a second drop of the same glass powder suspension in a second opening;
      wherein the first and second openings are neighbors, and the first and second drops are not in contact with each other; and d) fusing the first and second drops of glass powder, thereby to form respective first and second local encapsulation seals of fused glass, using at least one laser beam;

wherein the temperature of the glass powder in the first drop is maintained at a temperature less than or equal to 300° C. during the fusing step, and an area between the first and second local encapsulation seals remains uncovered by fused glass.

2. A method of manufacturing an electro-optical panel product, comprising:

i) manufacturing a first substrate including a plurality of local encapsulation seals by the method of claim 1;

ii) thereafter, assembling a two-dimensional array of electro-optical elements over the first substrate; and iii) forming an encapsulation structure over the two-dimensional array.

3. The method of claim 2, wherein each electro-optical element is an OLED light-emitting element.

4. A method of manufacturing an electro-optical panel product, comprising:

i) assembling a two-dimensional array of electro-optical elements over a starter substrate;

ii) thereafter, applying the method of claim 1 to the starter substrate to form a plurality of local encapsulation seals below the array of electro-optical elements; and iii) forming an encapsulation structure over the array of electro-optical elements.

5. The method of claim 4, wherein each electro-optical element is an OLED light-emitting element.

6. The method of claim 1, wherein each opening in the starter substrate is lined with a thin-film encapsulation layer between steps (a) and (b).

7. The method of claim 6, wherein the thin-film encapsulation layer is continuous across all openings in the starter substrate.

8. The method of claim 7, wherein the thin-film encapsulation layer is a planarization layer.

9. The method of claim 1, followed by a step:

e) forming a thin-film encapsulation layer covering from below the first local encapsulation seal, the second local encapsulation seal, and the area between the first and second local encapsulation seals.

10. The method of claim 9, wherein the thin-film encapsulation layer is a planarization layer.

11. The method of claim 1, wherein the starter substrate is a flexible metal foil.

* * * * *